United States Patent
Nag et al.

(10) Patent No.: US 10,600,865 B2
(45) Date of Patent: Mar. 24, 2020

(54) MATERIALS AND METHODS FOR THE PREPARATION OF NANOCOMPOSITES

(71) Applicant: THE UNIVERSITY OF CHICAGO, Chicago, IL (US)

(72) Inventors: Angshuman Nag, Chicago, IL (US); Dmitri V. Talapin, Riverside, IL (US)

(73) Assignee: THE UNIVERSITY OF CHICAGO, Chicago, IL (US)

( * ) Notice: Subject to any disclaimer, the term of this patent is extended or adjusted under 35 U.S.C. 154(b) by 0 days.

(21) Appl. No.: 15/882,823

(22) Filed: Jan. 29, 2018

(65) Prior Publication Data

US 2018/0301530 A1    Oct. 18, 2018

Related U.S. Application Data

(63) Continuation of application No. 14/117,070, filed as application No. PCT/US2012/038218 on May 16, 2012, now Pat. No. 9,882,001.

(Continued)

(51) Int. Cl.
*H01L 29/06* (2006.01)
*B82Y 10/00* (2011.01)
(Continued)

(52) U.S. Cl.
CPC ...... *H01L 29/0669* (2013.01); *B01J 13/0034* (2013.01); *B82Y 10/00* (2013.01);
(Continued)

(58) Field of Classification Search
CPC .................. H01L 29/0669; B82Y 10/0034
See application file for complete search history.

(56) References Cited

U.S. PATENT DOCUMENTS

| 6,126,740 A | 10/2000 | Schulz et al. |
| 6,797,412 B1 | 9/2004 | Jain et al. |

(Continued)

FOREIGN PATENT DOCUMENTS

| WO | WO-2006/135662 A2 | 12/2006 |
| WO | WO-2008/027190 A2 | 3/2008 |

(Continued)

OTHER PUBLICATIONS

Graham et al., The classic Wells-Dawson polyoxometalate, K6[alpha-P2W18O62].14H2O. Answering an 88 year-old question: what is its preferred, optimum synthesis, Inorg. CHem., 47(9):3679-86 (2008).

(Continued)

*Primary Examiner* — Matthew L Reames
(74) *Attorney, Agent, or Firm* — Marshall, Gerstein & Borun LLP

(57) ABSTRACT

Disclosed herein is an isolable colloidal particle comprising a nanoparticle and an inorganic capping agent bound to the surface of the nanoparticle, a method for making the same in a biphasic solvent mixture, and the formation of structures and solids from the isolable colloidal particle. The process can yield photovoltaic cells, piezoelectric crystals, thermoelectric layers, optoelectronic layers, light emitting diodes, ferroelectric layers, thin film transistors, floating gate memory devices, phase change layers, and sensor devices.

14 Claims, 50 Drawing Sheets

Related U.S. Application Data

(60) Provisional application No. 61/486,595, filed on May 16, 2011.

(51) Int. Cl.

| | | |
|---|---|---|
| *H01L 29/12* | (2006.01) | |
| *B01J 13/00* | (2006.01) | |
| H01L 29/786 | (2006.01) | |
| B82Y 30/00 | (2011.01) | |
| B82Y 40/00 | (2011.01) | |

(52) U.S. Cl.
CPC .......... *H01L 29/0665* (2013.01); *H01L 29/12* (2013.01); *B82Y 30/00* (2013.01); *B82Y 40/00* (2013.01); *H01L 29/7869* (2013.01); *H01L 29/78681* (2013.01); *Y10S 977/774* (2013.01); *Y10S 977/892* (2013.01); *Y10S 977/938* (2013.01)

(56) References Cited

U.S. PATENT DOCUMENTS

| | | |
|---|---|---|
| 7,200,318 B2 | 4/2007 | Banin et al. |
| 7,348,224 B2 | 3/2008 | Yudasaka et al. |
| 7,457,508 B2 | 11/2008 | Chen et al. |
| 7,485,526 B2 | 2/2009 | Mouli et al. |
| 7,517,702 B2 | 4/2009 | Halilov et al. |
| 7,517,718 B2 | 4/2009 | Mitzi et al. |
| 7,572,973 B2 | 8/2009 | Weaver, Jr. et al. |
| 7,602,105 B2 | 10/2009 | Auciello |
| 7,615,400 B2 | 11/2009 | Goto et al. |
| 7,670,907 B2 | 3/2010 | Korber |
| 7,681,290 B2 | 3/2010 | Clingman et al. |
| 7,710,001 B2 | 5/2010 | Morris et al. |
| 7,758,979 B2 | 7/2010 | Akiyama et al. |
| 7,807,520 B2 | 10/2010 | Kimura |
| 7,834,483 B2 | 11/2010 | Kearney-Fischer et al. |
| 7,932,101 B2 | 4/2011 | Lung |
| 7,968,861 B2 | 6/2011 | Burr et al. |
| 7,999,176 B2 | 8/2011 | Flood |
| 8,114,679 B2 | 2/2012 | Steeves et al. |
| 8,252,697 B2 | 8/2012 | Ahn et al. |
| 9,882,001 B2 | 1/2018 | Nag et al. |
| 2007/0190670 A1 | 8/2007 | Forest |
| 2008/0121903 A1 | 5/2008 | Hiramatsu et al. |
| 2008/0121955 A1 | 5/2008 | Shieh et al. |
| 2009/0009057 A1 | 1/2009 | Lee et al. |
| 2009/0064476 A1 | 3/2009 | Cross et al. |
| 2009/0072292 A1 | 3/2009 | Shum et al. |
| 2009/0084421 A1 | 4/2009 | Olsen et al. |
| 2009/0217973 A1 | 9/2009 | Alivisatos et al. |
| 2010/0135854 A1 | 6/2010 | Yang et al. |
| 2010/0240770 A1 | 9/2010 | Qi et al. |
| 2010/0314589 A1* | 12/2010 | Armand ............ C01B 25/45 252/519.12 |
| 2012/0104325 A1 | 5/2012 | Talapin et al. |

FOREIGN PATENT DOCUMENTS

| | | |
|---|---|---|
| WO | WO-2008/082047 A1 | 7/2008 |
| WO | WO-2008/085974 A2 | 7/2008 |
| WO | WO-2008/106040 A2 | 9/2008 |
| WO | WO-2009/017525 A2 | 2/2009 |
| WO | WO-2010/124212 A2 | 10/2010 |

OTHER PUBLICATIONS

International Preliminary Report on Patentability, International Application No. PCT/US12/38218, dated Nov. 19, 2013.

International Search Report and Written Opinion, International application No. PCT/US2012/038218, dated Jan. 24, 2013.

Lee et al., Full Color Emission from II-VI Semiconductor Quantum Dot-Polymer Composites, Adv. Mater., 12(15):1102-5 (2000).

Rosen et al., Exceptionally mild reactive stripping of native ligands from nanocrystal surfaces by using Meerwein's salt, Angew. Chem. Int. Ed. Engl., 51(3):684-9 (2012).

Sootsman et al., Large enhancements in the thermoelectric power factor of bulk PbTe at high temperature by synergistic nanostructuring, Angew. Chem. Int. Ed. Engl., 47(45):8618-22 (2008).

Talapin et al., Dipole-dipole interactions in nanoparticle superlattices, Nano Lett., 7(5):1213-9 (2007).

* cited by examiner

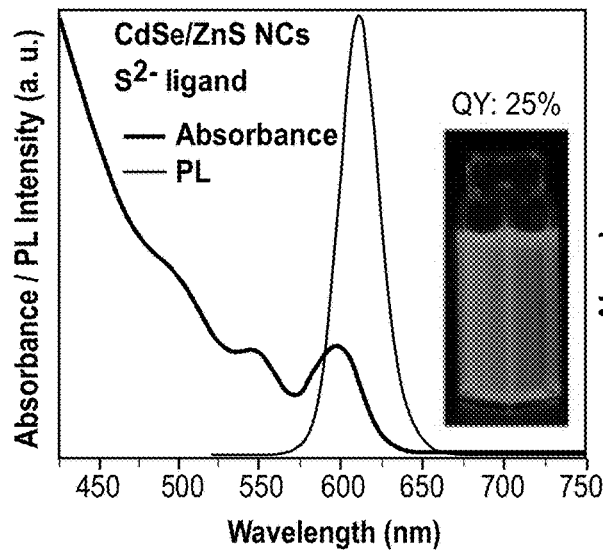
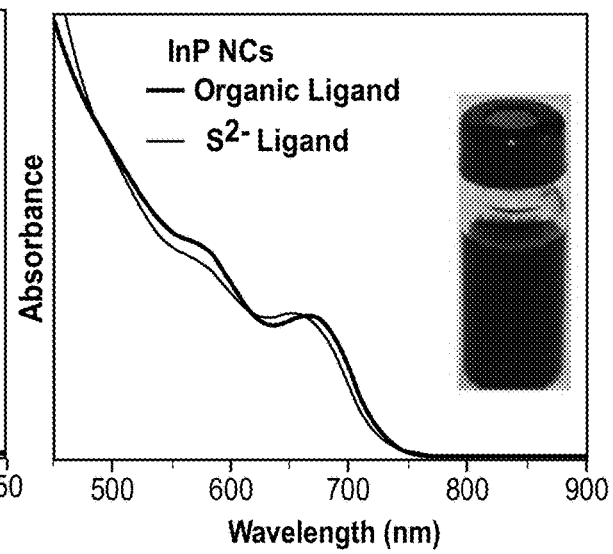
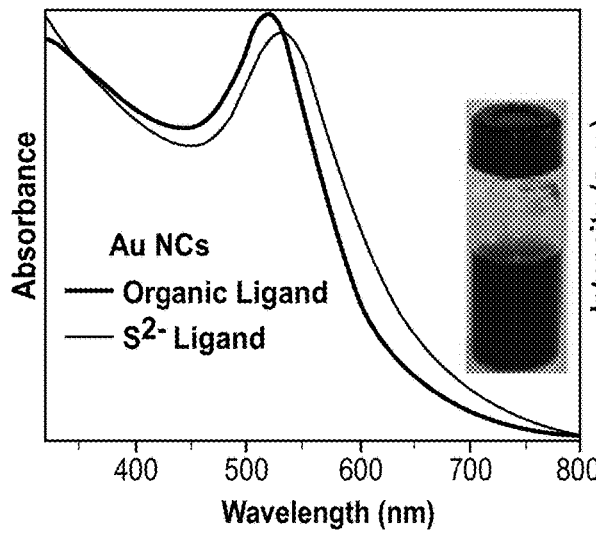
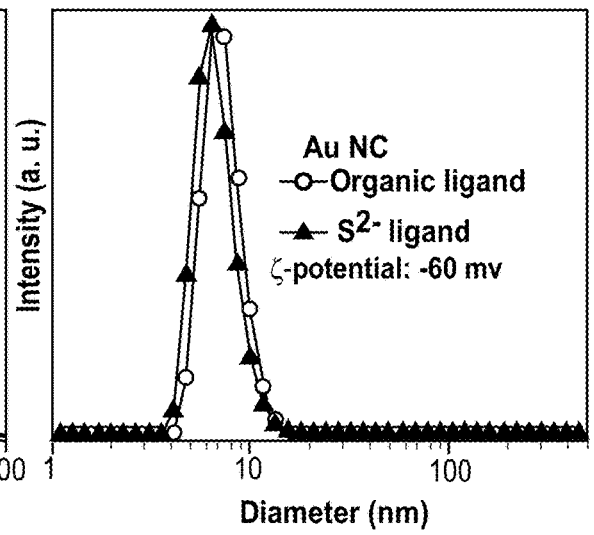
FIG. 2A
FIG. 2B
FIG. 2C
FIG. 2D

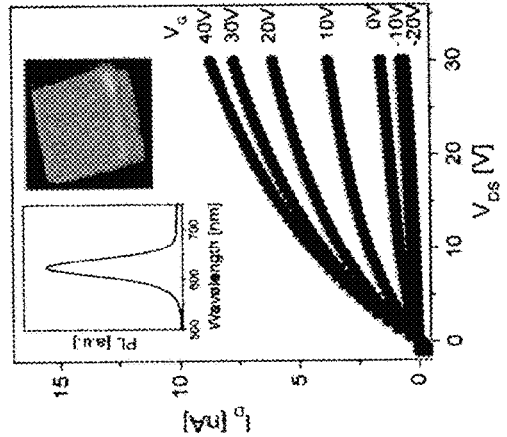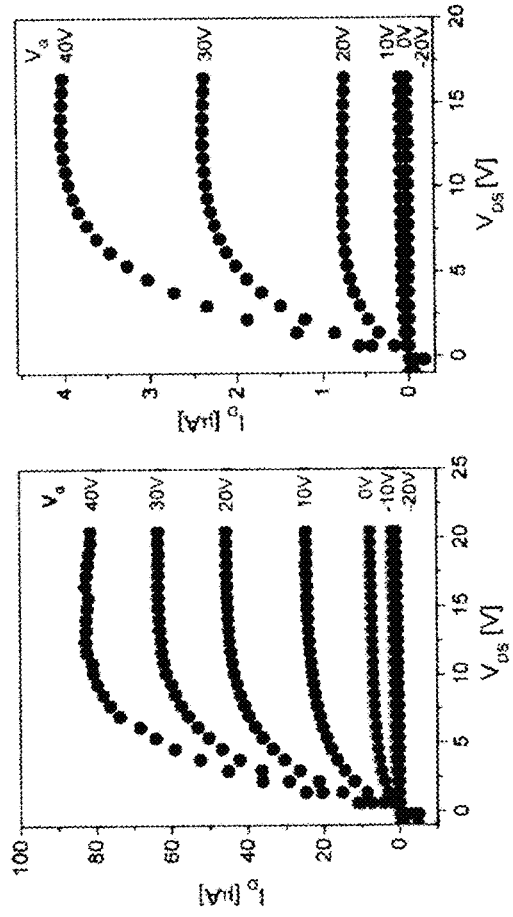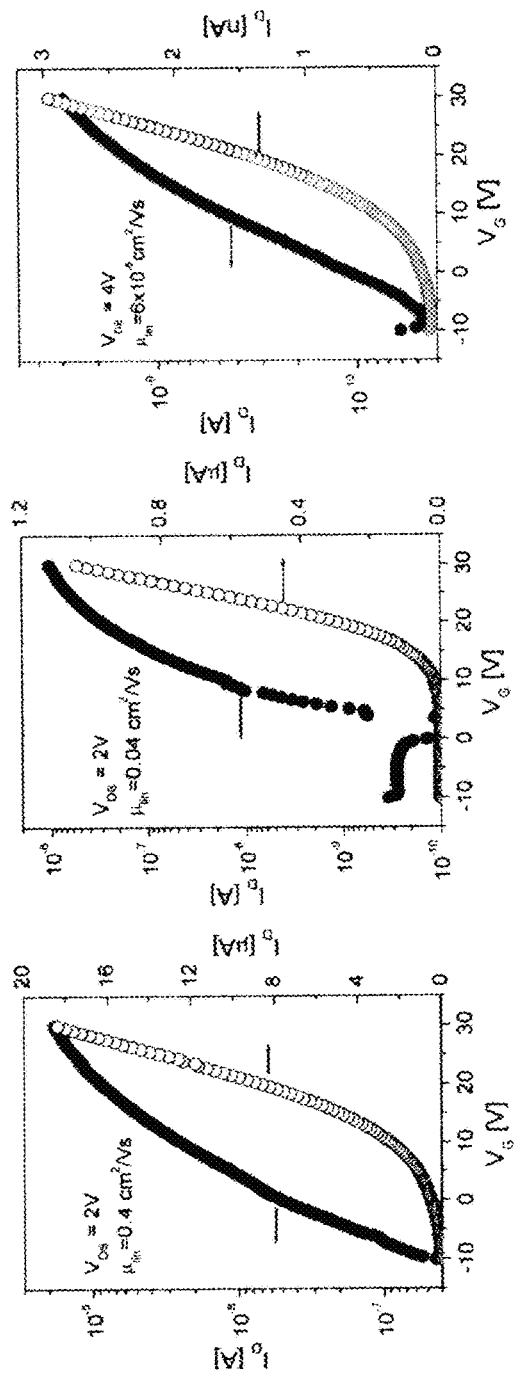

| NCs | Surface ligands (ζ-potential) | Do not provide colloidal stabilization |
|---|---|---|
| CdSe | S²⁻ (-40 mV), SH⁻ (-42 mV), OH⁻ (-20 mV). | |
| ZnSe | OH⁻ (-26 mV) | S²⁻, SH⁻ |
| Au | S²⁻ (-60 mV), SH⁻ (-56 mV) | OH⁻ |
| InP | S²⁻ (-60 mV) | OH⁻ |
| InAs | S²⁻ (-39mV), SH⁻ (-43mV) | OH⁻ |
| In₂O₃ | S²⁻ (-45mV), SH⁻ (-40 mV), OH⁻ (-44mV) | |

FIG. 24A 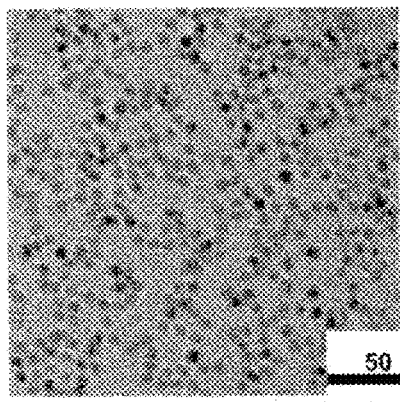 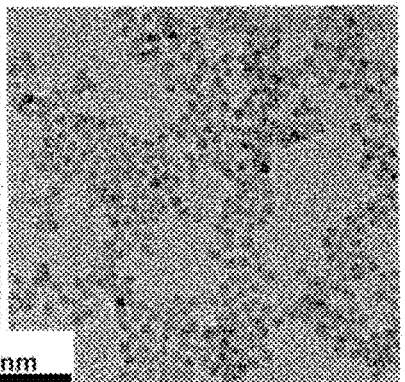 FIG. 24B
FIG. 24C 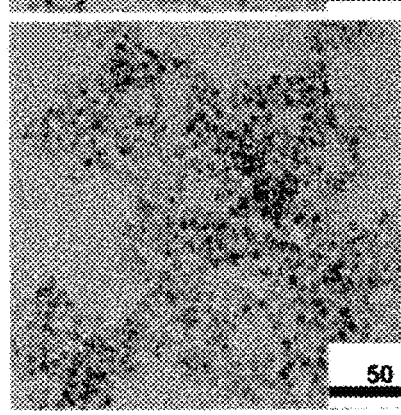 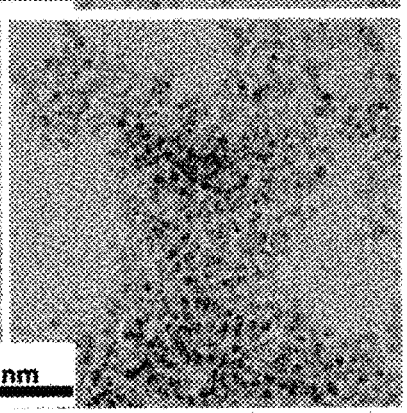 FIG. 24D
FIG. 24E 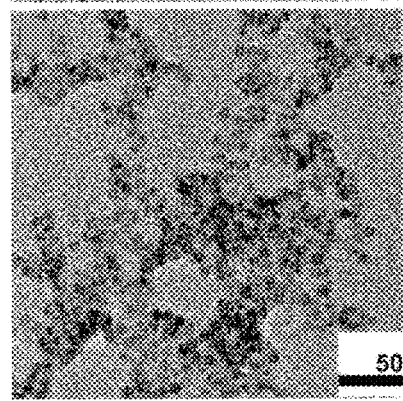 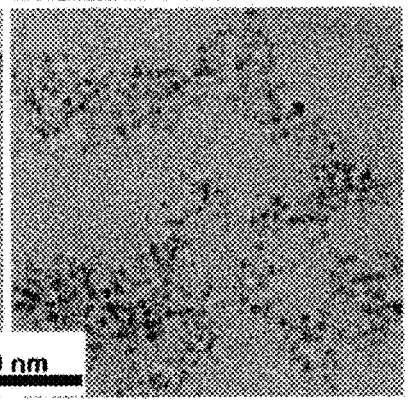 FIG. 24F
FIG. 24G 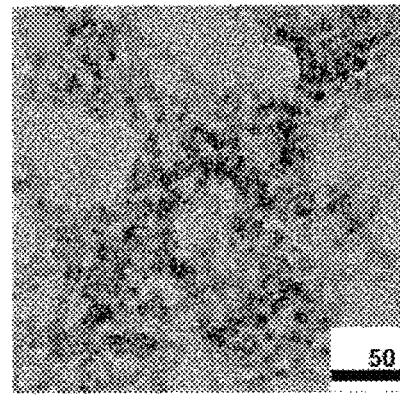 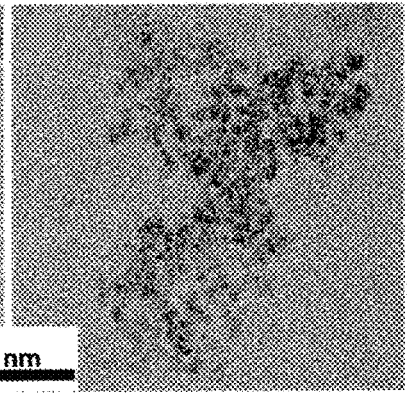 FIG. 24H

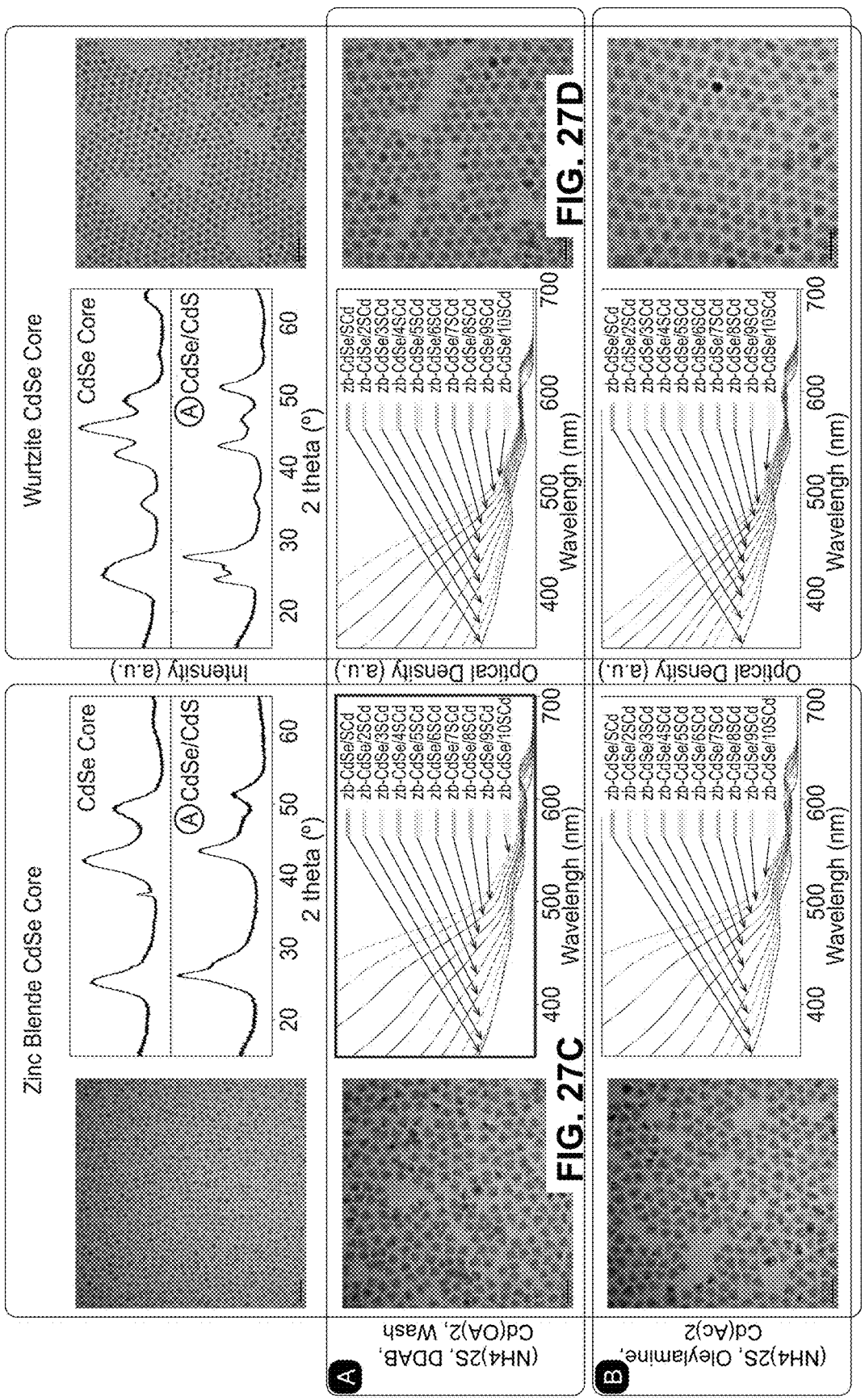

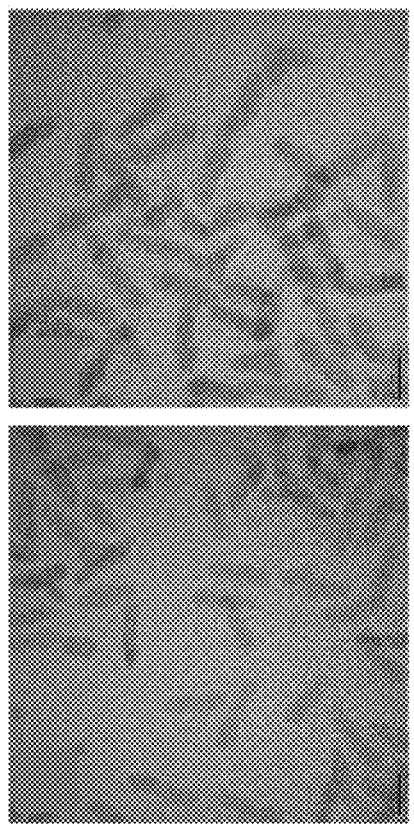
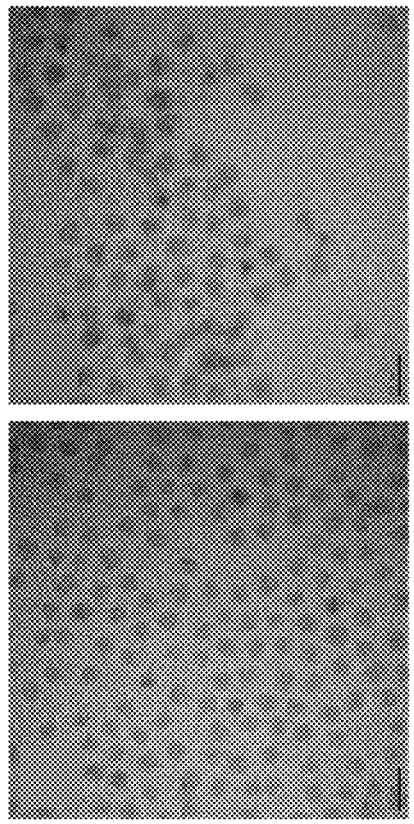
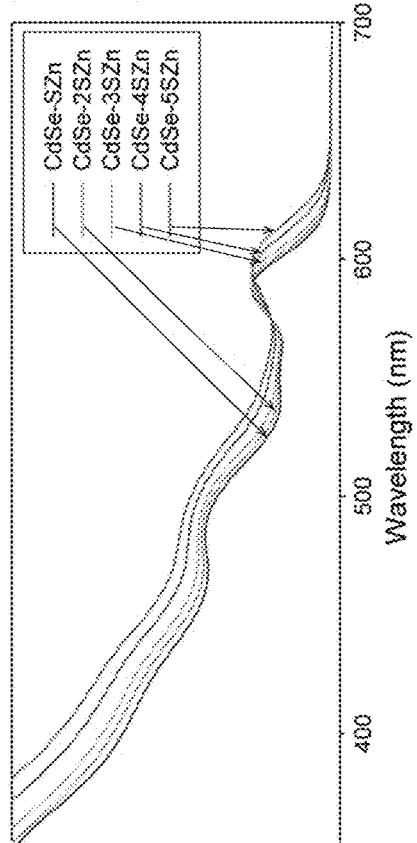
FIG. 28A  FIG. 28B  FIG. 28D  FIG. 28E
CdSe(zb)-5SZn  CdSe(NRs)-5SCd
FIG. 28C  FIG. 28F

FIG. 29A
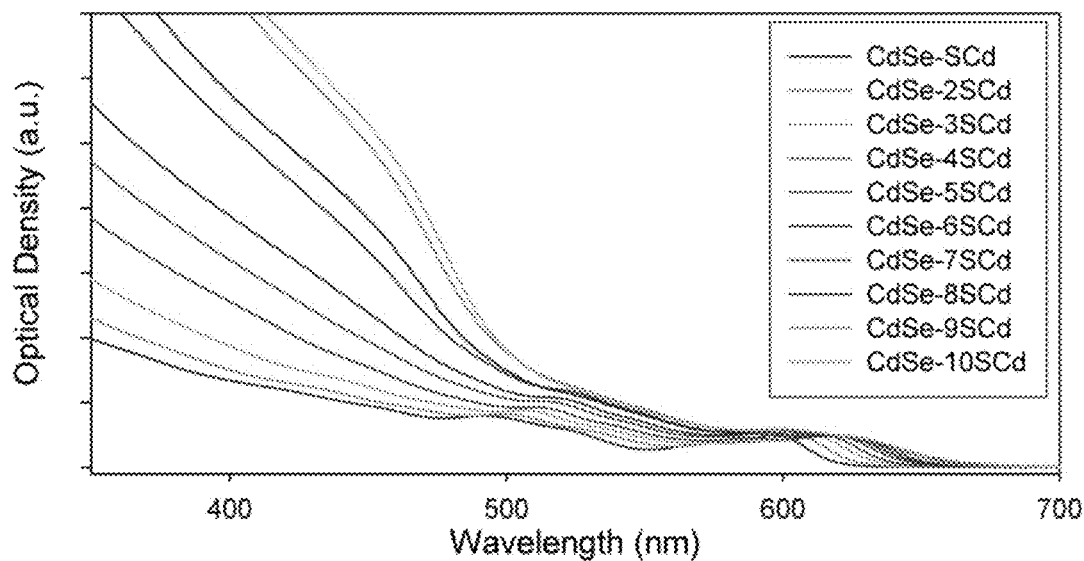
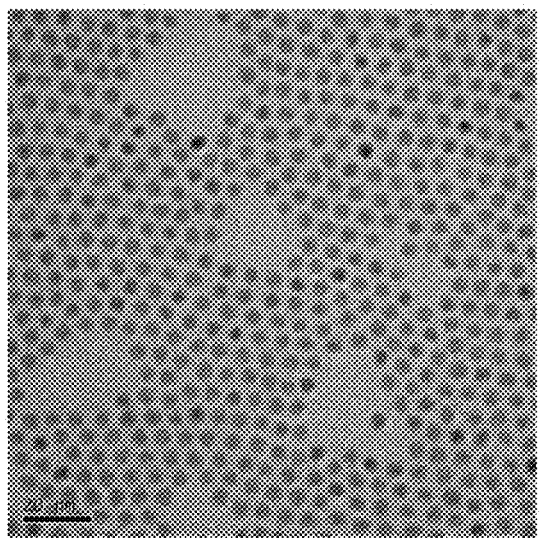
FIG. 29B
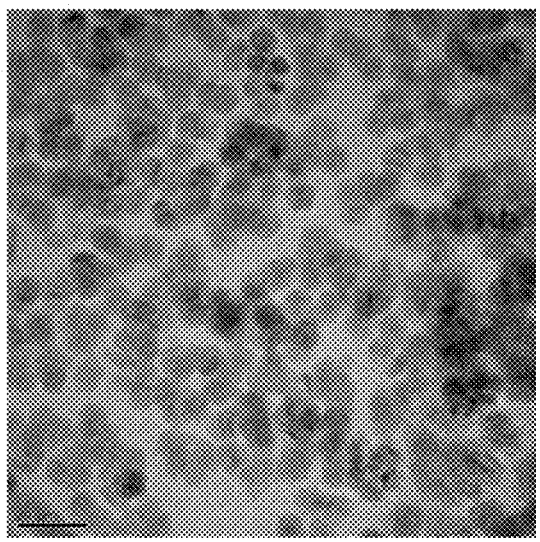
FIG. 29C

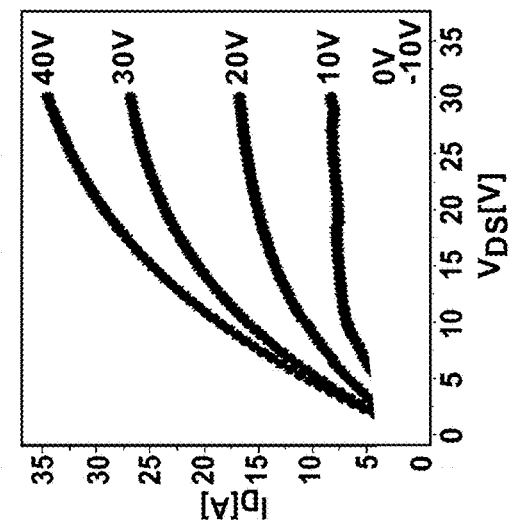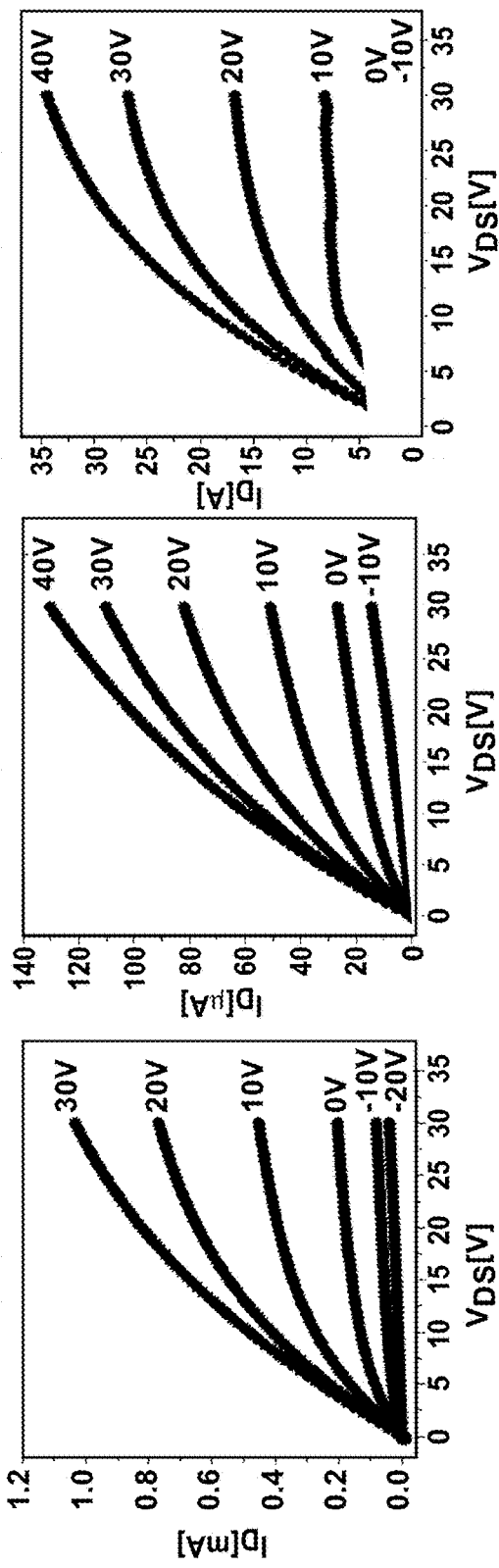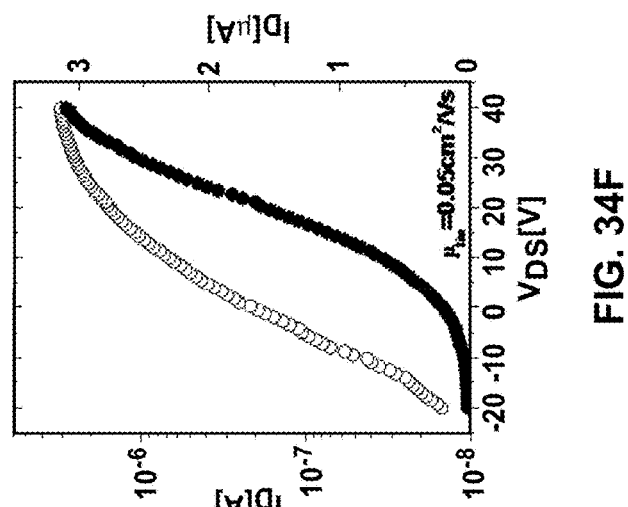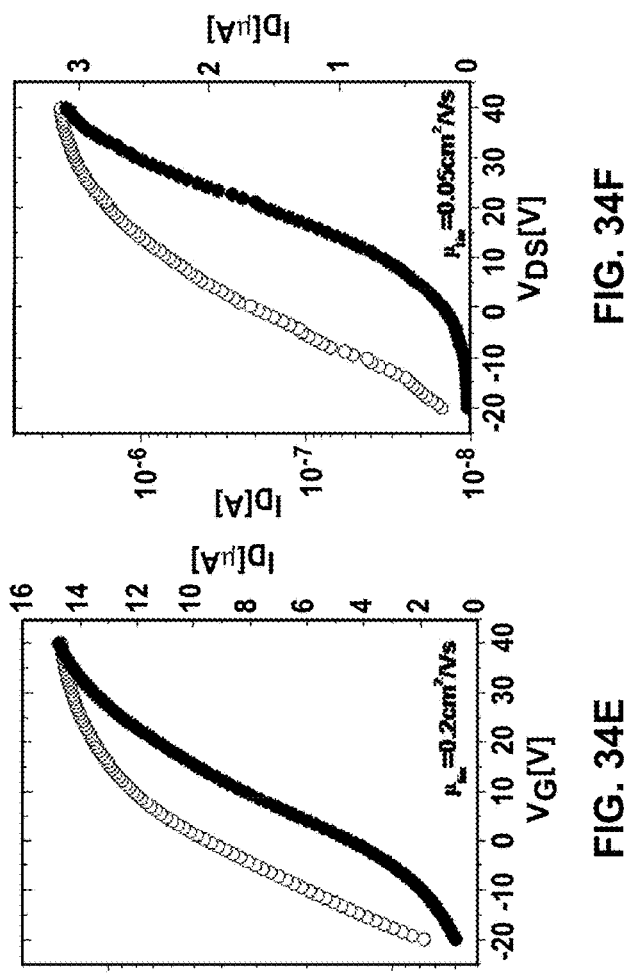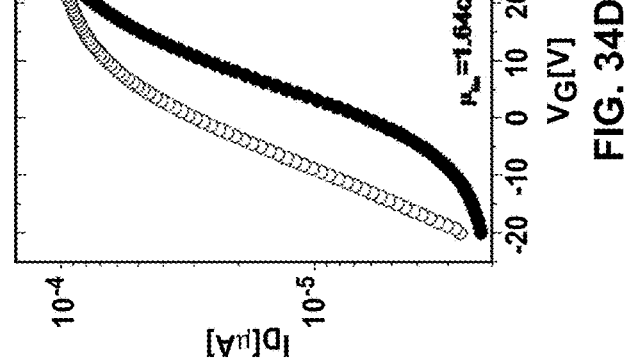
FIG. 34A FIG. 34B FIG. 34C FIG. 34D FIG. 34E FIG. 34F

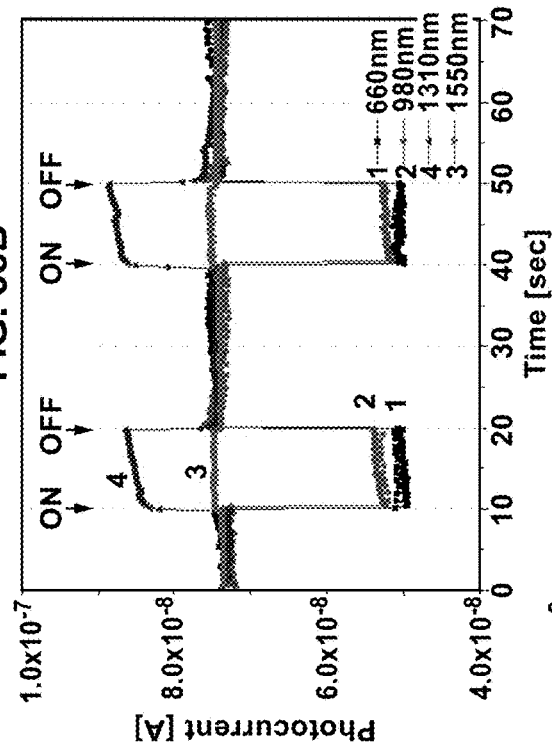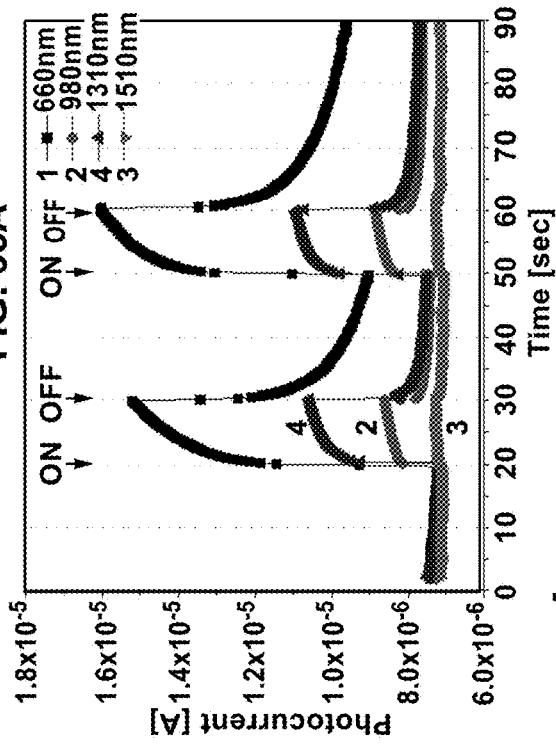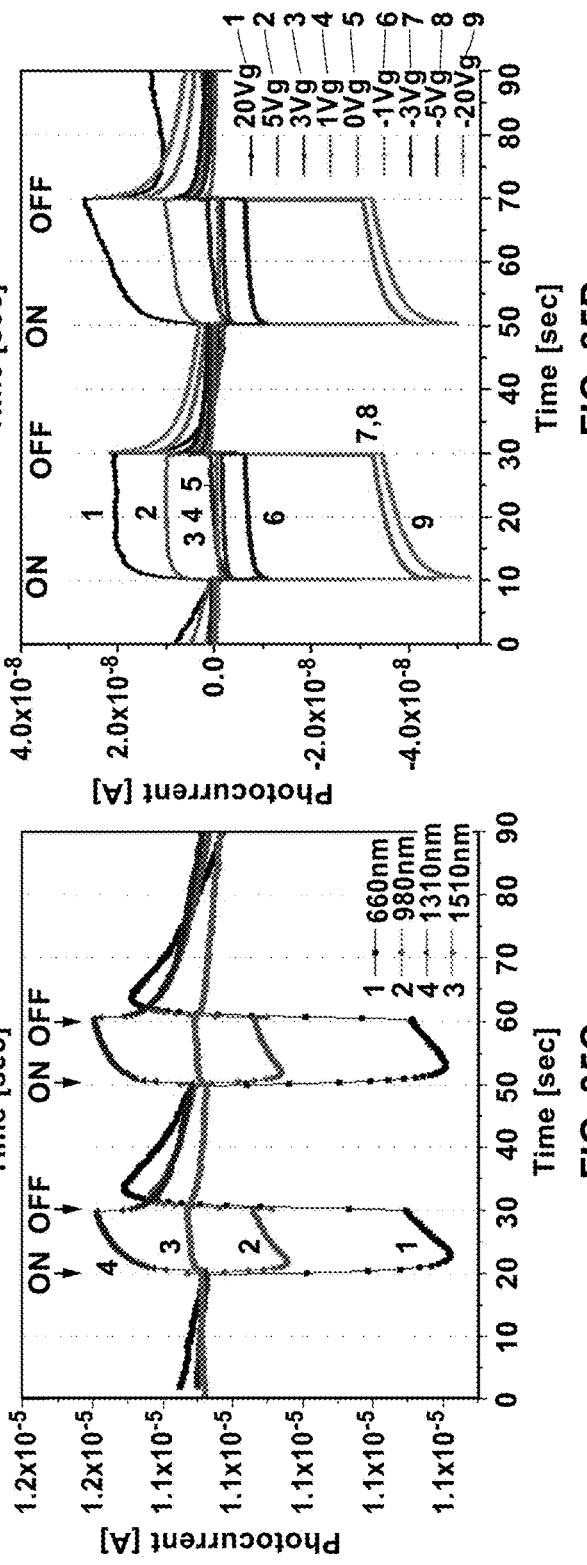

FIG. 39A
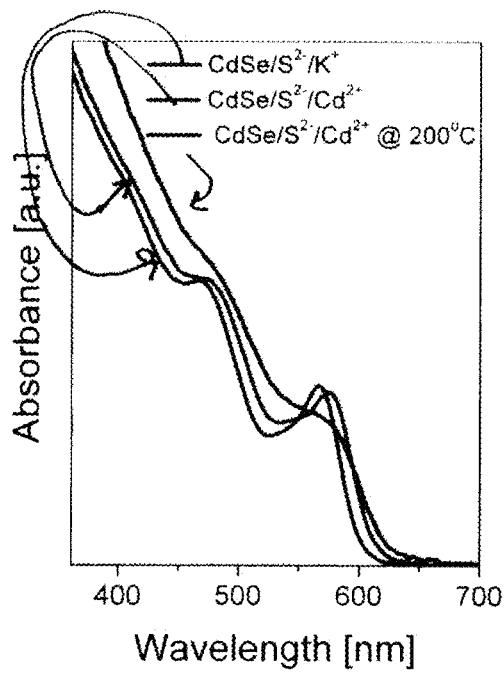
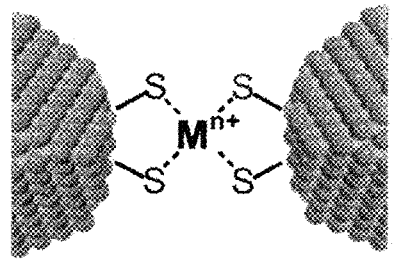
FIG. 39B
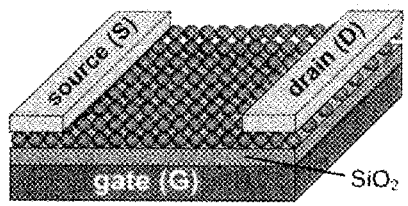
FIG. 39C

FIG. 40A
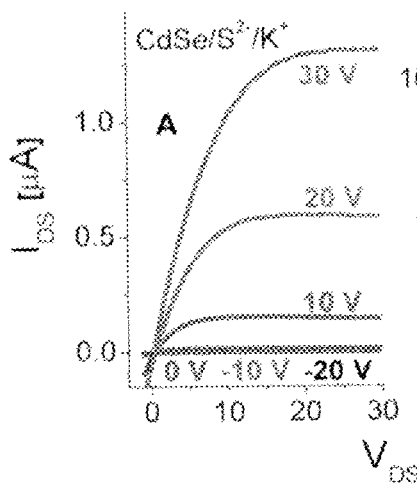
FIG. 40B
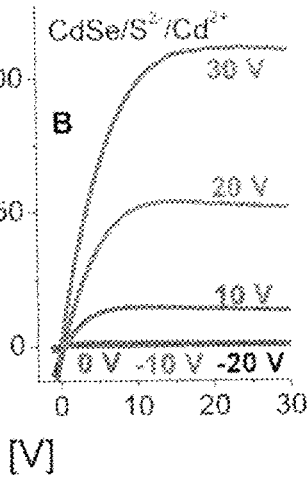
FIG. 40C
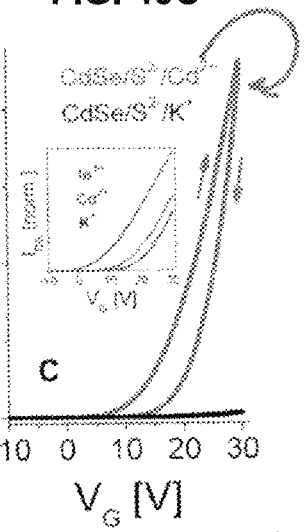
FIG. 40D
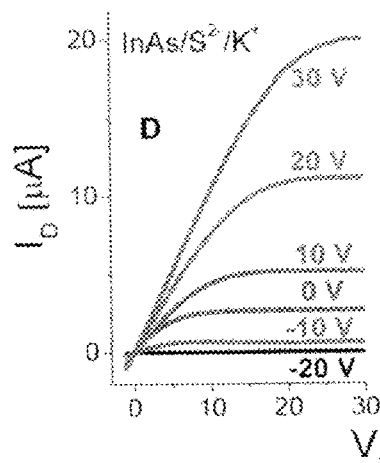
FIG. 40E
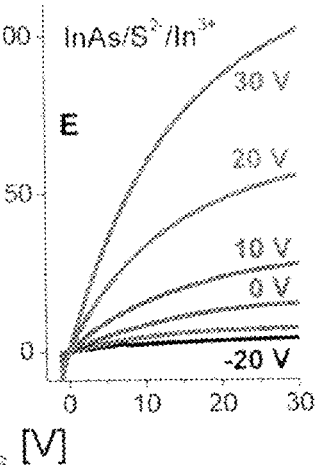
FIG. 40F
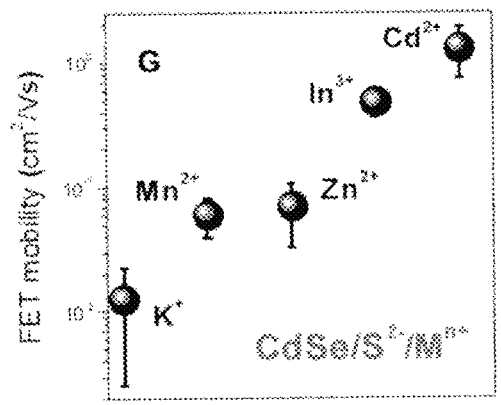
FIG. 40G
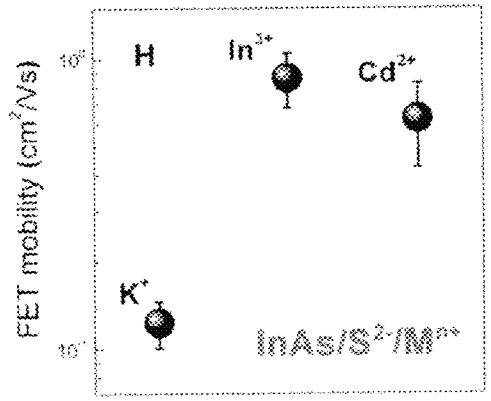
FIG. 40H

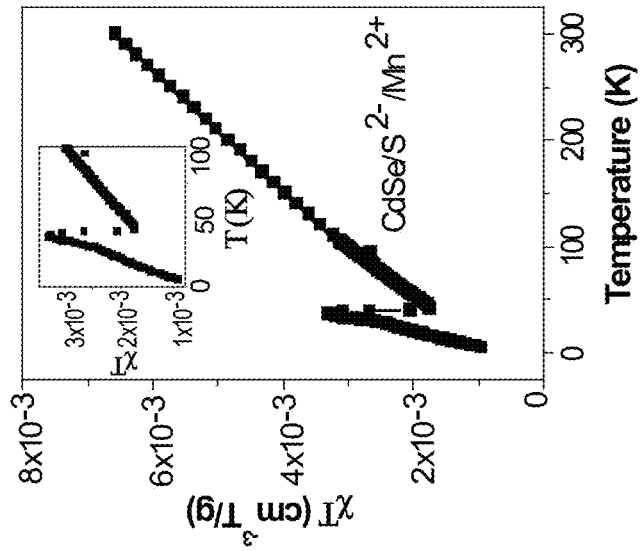
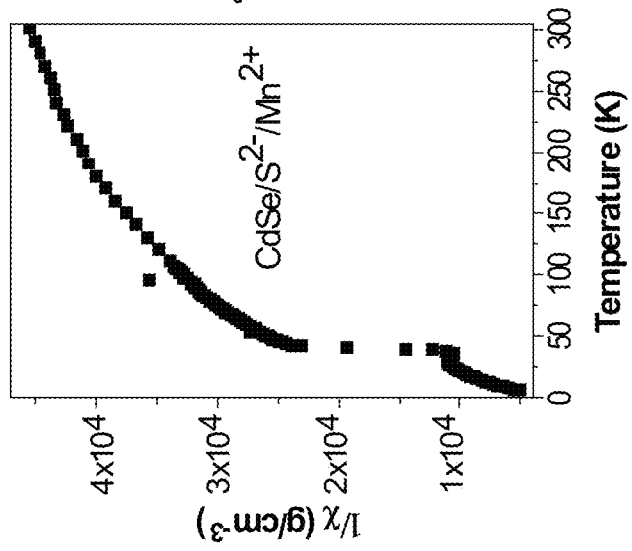
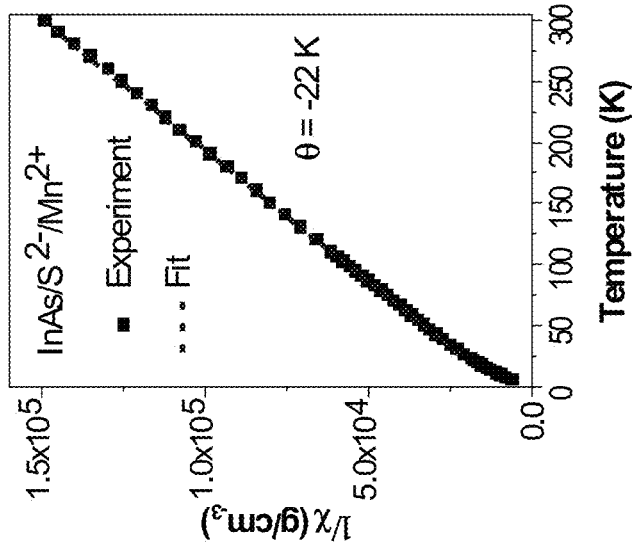
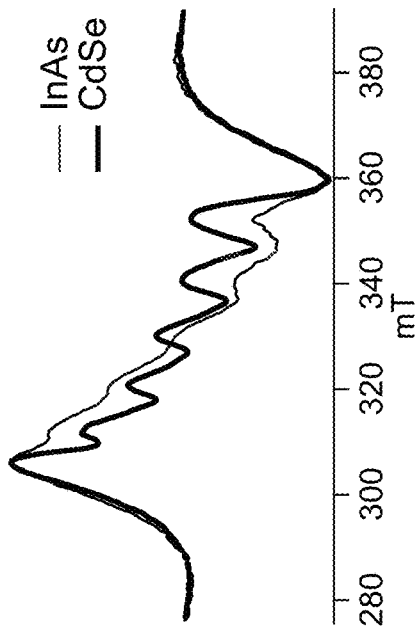
FIG. 62A
FIG. 62B
FIG. 62C
FIG. 63

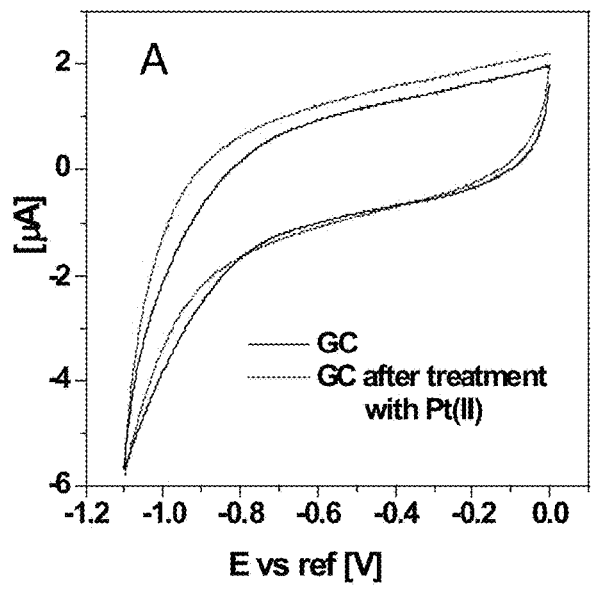
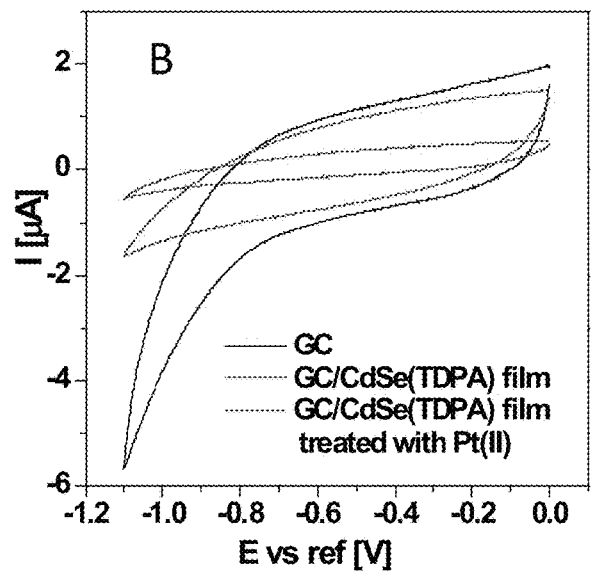
FIG. 71A  FIG. 71B

MATERIALS AND METHODS FOR THE PREPARATION OF NANOCOMPOSITES

CROSS-REFERENCE TO RELATED APPLICATION

This is a continuation of U.S. patent application Ser. No. 14/117,070, filed Jul. 25, 2014, which is the U.S. national phase of International Application No. PCT/US12/38218 filed May 6, 2012, which claims the priority benefit under 35 U.S.C. § 119(e) of U.S. Provisional Application No. 61/486,595, filed May 16, 2011, the entire disclosures of which are incorporated herein by reference.

STATEMENT OF GOVERNMENT INTEREST

The invention was made with governmental support under grants from the U.S. National Science Foundation (DMR-0847535; IIP-10471801) and U.S. Department of Energy (DE-AC02-06CH11357). The U.S. government has certain rights in the invention.

FIELD OF DISCLOSURE

The disclosure generally relates to materials and methods for the preparation of nanocomposites. More specifically, the disclosure relates to inorganic capped colloidal materials and the methods of depositing these inorganic capped colloidal materials on a substrate to form nanocomposites. Still more specifically, the disclosure relates to the selective deposition and formation of nanocomposites on a substrate.

All-inorganic colloidal nanocrystals (NC) were synthesized by replacing organic capping ligands on chemically synthesized nanocrystals with metal-free inorganic ions such as $S^{2-}$, $HS^-$, $Se^{2-}$, $HSe^-$, $HSe^-$, $Te^{2-}$, $HTe^-$, $TeS_3^{2-}$, $OH^-$ and $NH_2^-$. These simple ligands adhered to the NC surface and provided colloidal stability in polar solvents. The use of small inorganic ligands instead of traditional ligands with long hydrocarbon tails facilitated the charge transport between individual nanocrystals and opened up interesting opportunities for device integration of colloidal nanostructures.

BRIEF DESCRIPTION OF RELATED TECHNOLOGY

Nanoscale materials, materials with at least one dimension between about 1 and 1000 nm, have increasingly garnered attention due to their potential electronic, photophysical, chemical, and medicinal effects. The large-scale industrial application of nanoscale materials has generally focused on the formation of nanometer thick films and/or nanometer wide wires. Many of these industrially-applied nanoscale materials display extraordinary electronic and photophysical properties, but more often the materials lack the features that originally drew scientific interest toward nanocrystals, nanorods, and nanowires.

Attempts to incorporate the physical properties of nanocrystals, nanorods, and nanowires into films or bulk solids have led to the self-assembly of ordered nanoarrays. See Shevchenko et al, "Structural diversity in binary nanoparticle superlattices" in *Nature*, 439, 55-59 (2006). These self-assembled ordered nanoarrays have been produced from stable colloidal solutions of nanomaterials. For example, close-packed nanocrystal films have been made by spin-coating or drop casting of colloidal solutions. Often these films show short range ordering, but forces such as entropy, electrostatics, and van der Waals interactions can cause these materials to self-assemble into superlattices. These techniques have afforded binary superlattices with tunable electronic structures based on the colloidal materials employed in the synthesis.

Though some single-component and binary superlattices exhibit desirable physical and electronic properties, these materials are not robust enough for large scale advanced material applications and their synthesis is not general enough to provide easy production of idealized materials.

A larger-scale approach to the synthesis of solid state materials encompassing nanocrystals is the impregnation and forced crystallization of nanocrystals from melts of inorganic materials. See Sootsman et. al, "Large Enhancements in the Thermoelectric Power Factor of Bulk PbTe at High Temperature by Synergistic Nanostructuring" in *Angew. Chem. Int. Ed.* 47, 8618-22 (2008). This rapid quenching approach can provide nanocrystalline material in bulk inorganic phases but lacks any methodology for the formation of ordered nanoarrays in the bulk material.

While the synthesis of solid state materials with ordered arrays of nanoscale materials has progressed to the point where nanocrystals can be deposited in ordered arrays on a surface, the use of these ordered arrays are hampered by the insulating ligands generally used in the manufacture of the nanocrystal. The practical use of these nanocrystals has been discovered through the blending of these organic soluble nanocrystals with polymers. See for example U.S. Pat. No. 7,457,508. For example, nanocomposites of nanocrystals and conjugated polymers can yield tunable semiconducting photonic structures, and with unique optical, electrical, magnetic, electrochromic, and chemical properties. See for example U.S. Pat. No. 7,200,318.

The majority of applications wherein these advanced materials will be applicable employ inorganic solids as the functional material. One example of an applicable inorganic solid that incorporates nanoscale materials is the fabrication of inorganic nanocomposites described in U.S. patent application Ser. No. 11/330,291. This methodology involves the codeposition of a nanocrystalline material with an inorganic matrix precursor from a homogeneous hydrazine solution, a technique similar to the deposition of nanocrystalline materials in polymers as described in J. W. Lee et al., *Advanced Materials* 2000, 12, 1102. This methodology fails to provide the selectivity of structure for the synthesis of tunable semiconducting materials, does not prevent the carbon contamination of the synthesized inorganic nanocomposite, and requires a highly toxic, hypergolic solvent. Hence, the industrial applicability of the methodology is limited by material requirements, and the overwhelming health and safety concerns.

Generally, the prior art does not sufficiently teach or suggest the isolation of colloidal particles useful for the easy and safe deposition of a pure colloidal material. Moreover, the prior art does not teach or suggest a methodology based on isolable colloidal nanomaterials for the production of superlattices, inorganic matrices, hetero-alloys, alloys, and the like.

SUMMARY OF INVENTION

Disclosed herein is a composition and a method for making that composition having a nanoparticle capped with an inorganic capping agent. The method generally includes at least two immiscible solvents and the exchange of an organic capping agent on a nanoparticle with the herein described inorganic capping agent.

Another aspect of the disclosure is a composition made of the nanoparticle and the inorganic capping agent. The composition is isolable, can be purified, and importantly may display approximately the same opto-electronic characteristics as the nanoparticle with an organic capping agent.

Yet another aspect of the disclosure is the deposition of the composition on a substrate. Herein, the composition can be deposited as thin or bulk films by a variety of techniques with short or long range ordering of the nanoparticles. The deposited composition, importantly, displays approximately the same opto-electronic characteristics as the composition in solution.

Still another aspect of the disclosure is the thermal decomposition of the deposited composition to form inorganic matrices with imbedded nanoparticles. The annealed composition has an inorganic matrix that corresponds to the thermal decomposition product of the inorganic capping agent. Additionally, as the annealed composition can be produced from the deposited composition with ordered nanoparticles (arrays), the annealed composition can have ordered arrays of nanoparticles in a solid state matrix. The annealed composition can also, importantly, display approximately the same optical characteristics as the deposited composition.

Additionally, the deposited composition can be thermally treated such that the composition partially or wholly anneals. The formed alloy can have discrete regions with elemental compositions that approximate the nanoparticle and the solid state matrix as made through the above referenced thermal decomposition or the alloy can be annealed to a single phase.

The herein disclosed materials and methods provide a route to new and useful solid state materials that can exhibit for example thermoelectric, piezoelectric, ferroelectric, phase change and electroluminescent characteristics. These solid state materials can be used in devices like photovoltaic cells, piezoelectric crystals, thermoelectric layers, optoelectronic layers, light emitting diodes, ferroelectric layers, thin film transistors, floating gate memory devices, phase change layers, and sensor devices. Uses of and methods of assembling such devices are generally described in U.S. Ser. No. 12/142,454, U.S. Pat. No. 7,348,224, U.S. Ser. No. 12/328, 788, U.S. Ser. No. 11/865,325, U.S. Ser. No. 11/864,877, PCT/US2007/018015, U.S. Ser. No. 12/285,158, U.S. Ser. No. 12/108,500, U.S. Ser. No. 11/942,441, PCT/US2008/002246, U.S. Ser. No. 11/584,304, U.S. Ser. No. 12/241,333, U.S. Ser. No. 12/179,807, U.S. Ser. No. 12/155,015, PCT/US2006/022250, U.S. Pat. No. 7,517,702, U.S. Ser. No. 12/050,676, U.S. Ser. No. 12/130,075, U.S. Ser. No. 11/789, 344, PCT/KR2007/002885, U.S. Ser. No. 11/704,623, U.S. Ser. No. 11/856,086, U.S. Ser. No. 11/604,746, PCT/US2008/000271, U.S. Pat. No. 7,485,526, U.S. Ser. No. 12/079,088, U.S. Ser. No. 12/032,252, PCT/US2008/005430, U.S. Ser. No. 12/050,284, and U.S. Ser. No. 11/803, 261 all of which are incorporated herein by reference. Solid state materials in accordance with the descriptions herein may be used in assembling any of these and similar devices.

Additional features of the invention may become apparent to those skilled in the art from a review of the following detailed description, taken in conjunction with the drawings, the examples, and the appended claims.

BRIEF DESCRIPTION OF THE DRAWING FIGURES

For a more complete understanding of the disclosure, reference should be made to the following detailed description and accompanying drawings wherein:

FIG. 2A illustrates Absorption and PL spectra of CdSe/ZnS core/shell NCs capped with $S^{2-}$ ligands dispersed in FA; inset shows the luminescence of NC dispersion upon illumination with 365 nm UV light;

FIG. 2B illustrates Absorption spectra of InP NCs capped with organic ligands and $S^{2-}$ ligands dispersed in toluene and FA respectively. Inset shows the optical photograph of colloidal dispersion of InP NCs in FA;

FIG. 2C illustrates Absorption spectra of Au NCs capped with dodecanethiol and $S^{2-}$ ligands dispersed in toluene and FA, respectively. Inset shows the optical photograph of a colloidal dispersion of Au NCs in FA;

FIG. 2D illustrates DLS size-distribution plots for Au NCs capped with the organic and $S^{2-}$ ligands;

FIG. 6A is a plot of drain current $I_D$ vs. drain-source voltage $V_{DS}$, measured as different gate voltages $V_G$ for the field-effect transistors (FETs) assembled from colloidal NCs capped with $(NH_4)_2S$ for CdSe;

FIG. 6B is a plot of drain current $I_D$ vs. drain-source voltage $V_{DS}$, measured as different gate voltages $V_G$ for the field-effect transistors (FETs) assembled from colloidal NCs capped with $(NH_4)_2S$ for CdSe/CdS core-shells;

Figure 7:
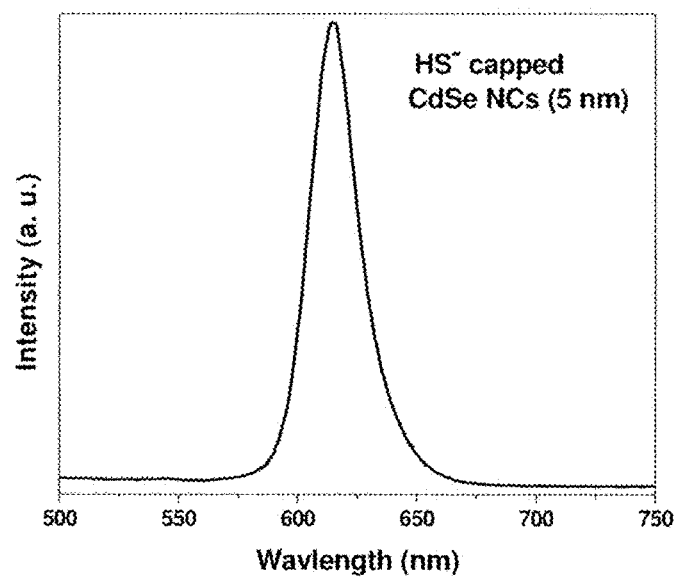
Figure 8:
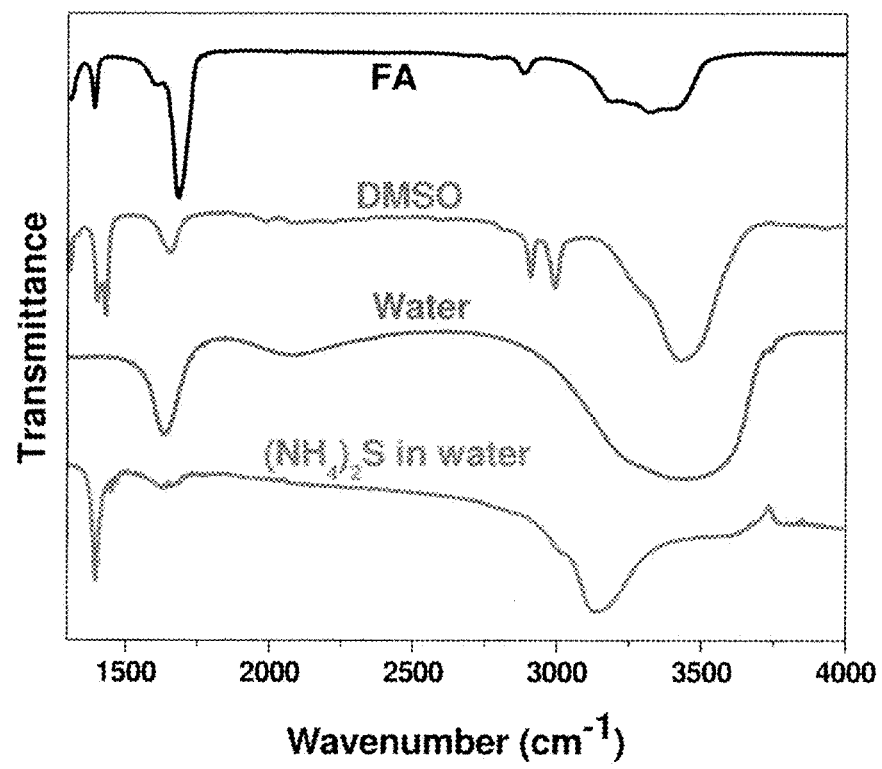
Figure 9:
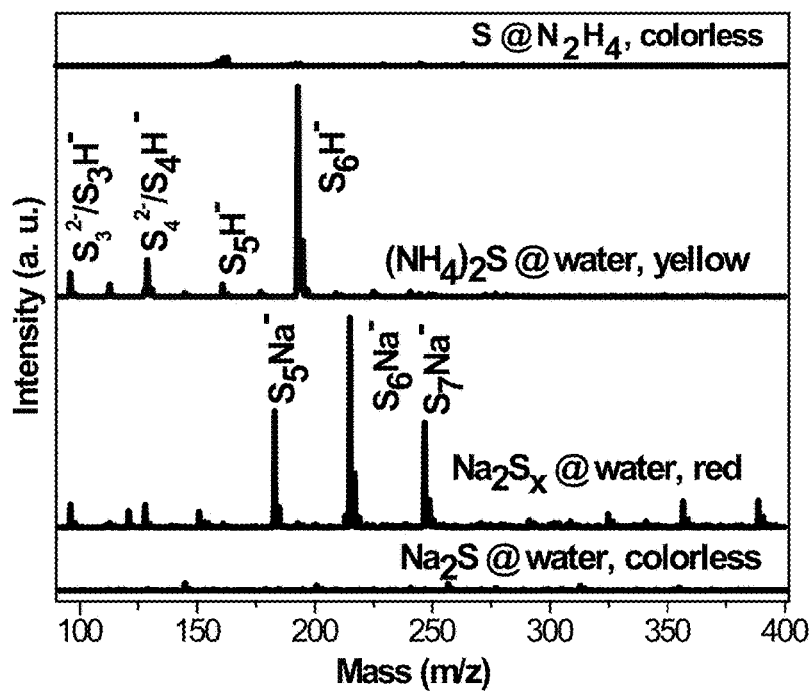
Figure 10A:
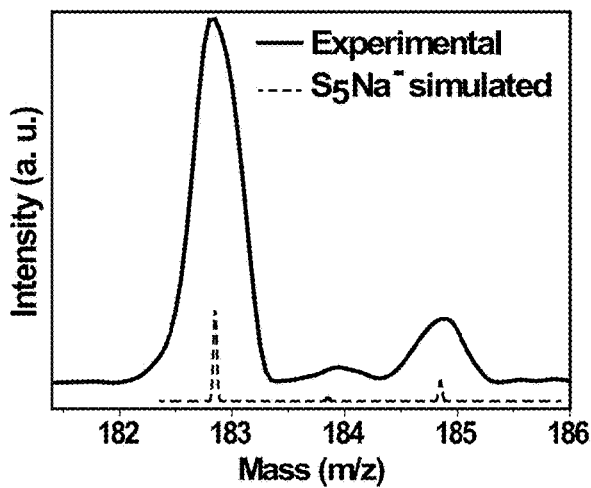
Figure 10B:
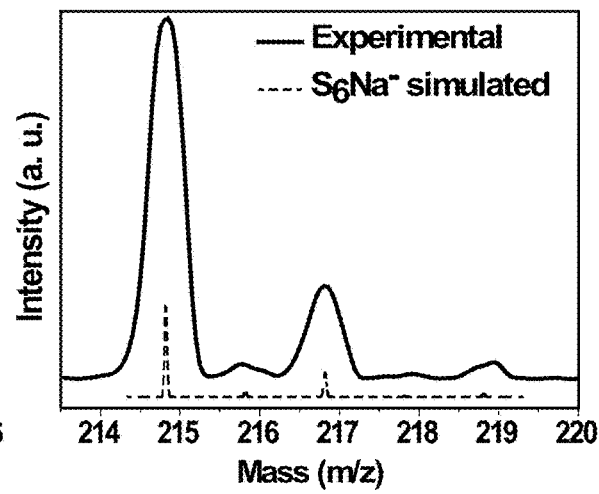
Figure 11A:
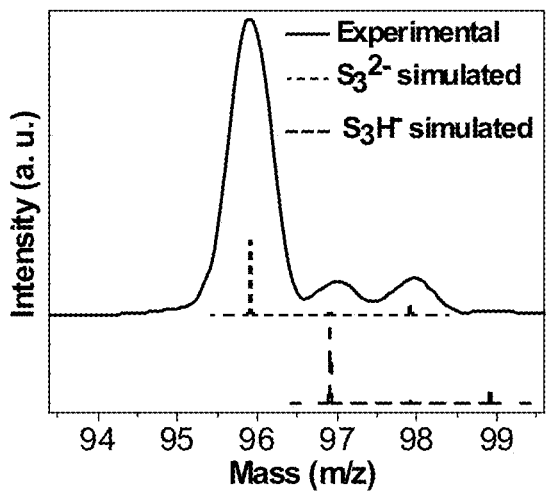
Figure 11B:
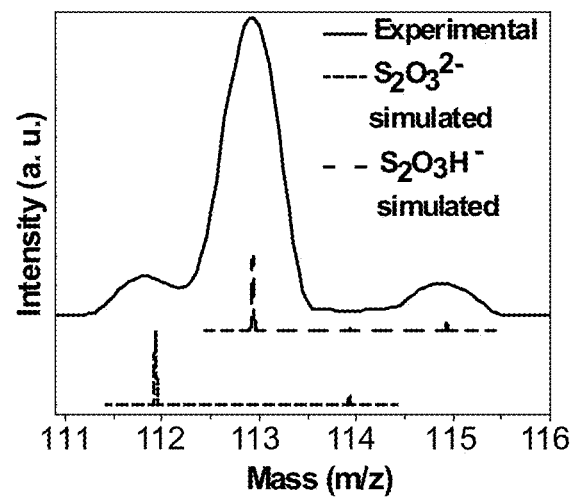
Figure 11C:
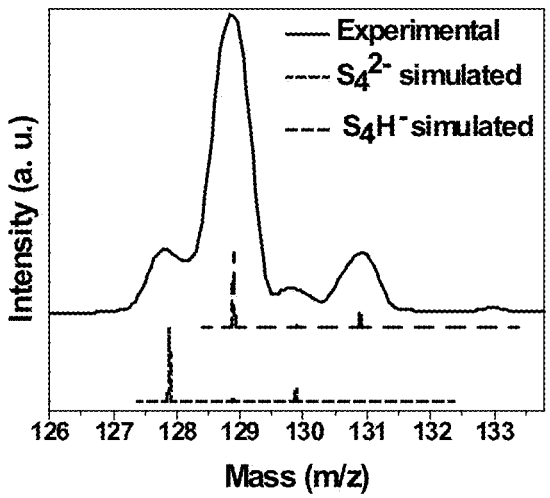
Figure 11D:
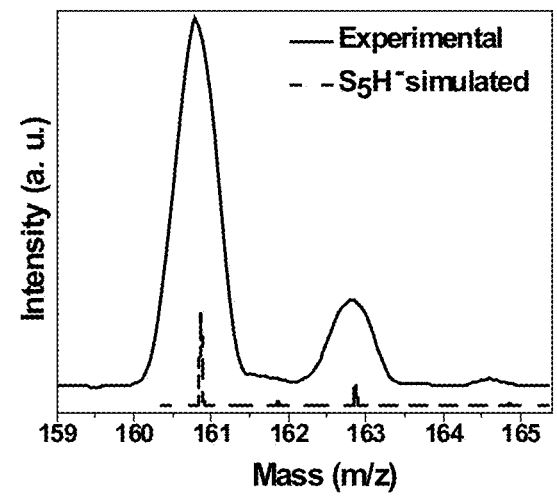
Figure 11E:
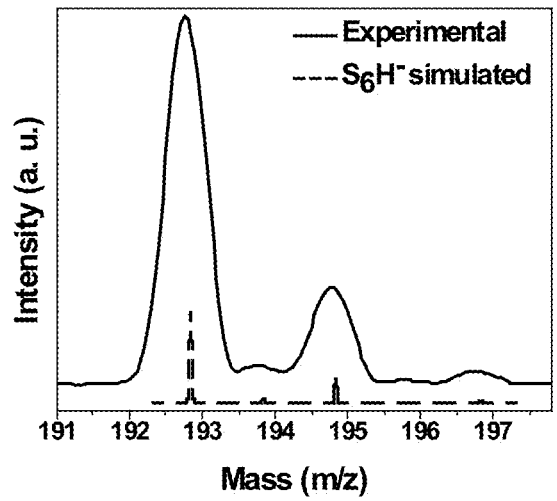
Figure 12:
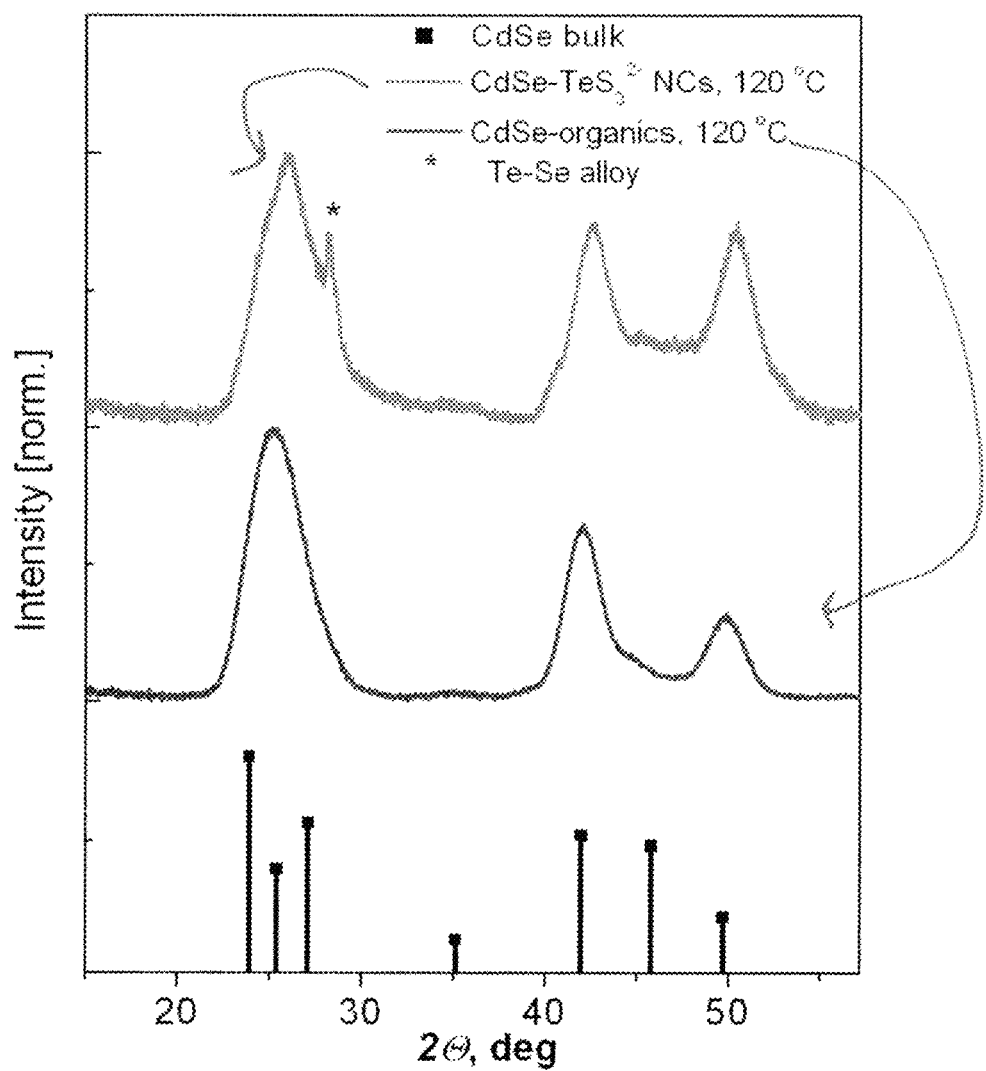
Figure 13:
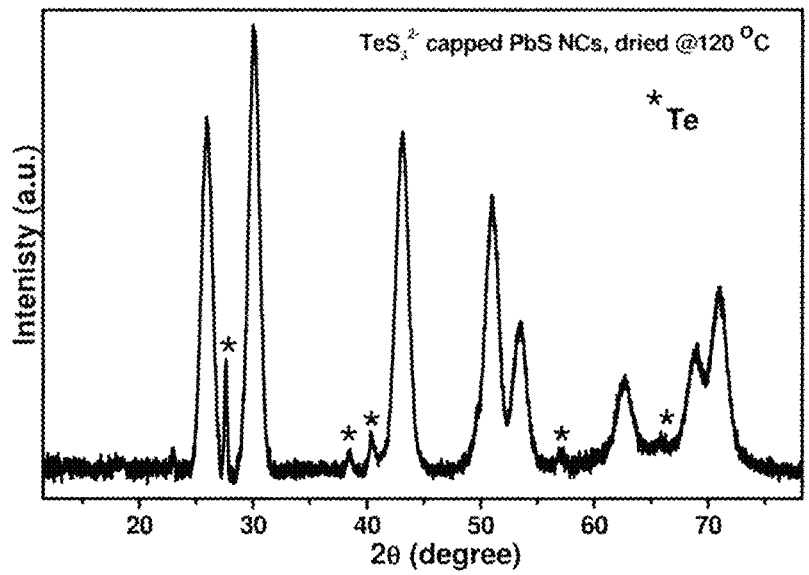
Figure 14:
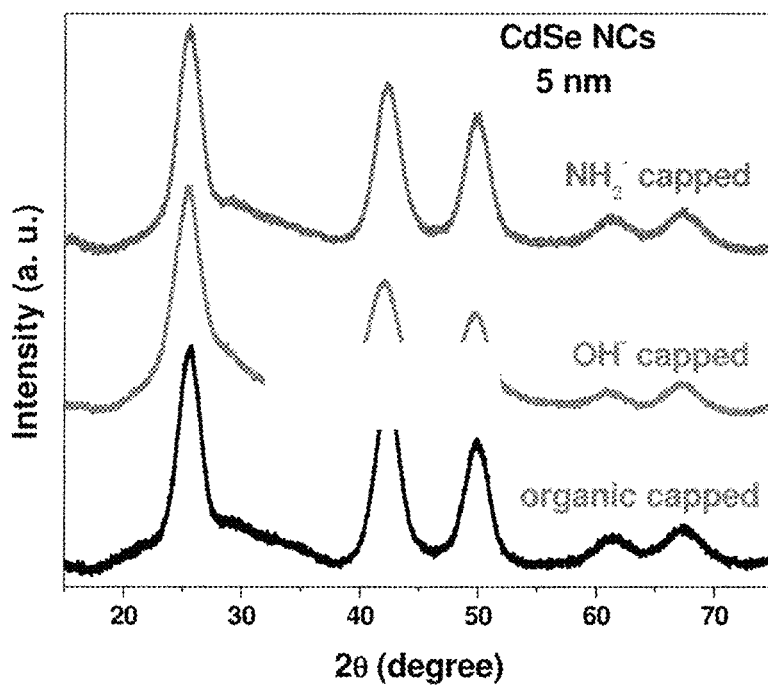
Figures 15, 16:
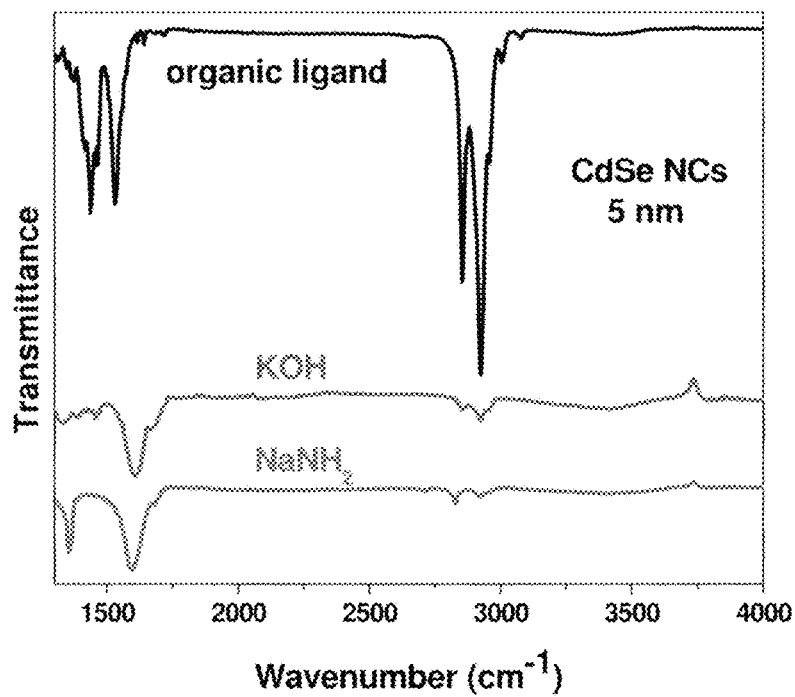
Figure 18A:
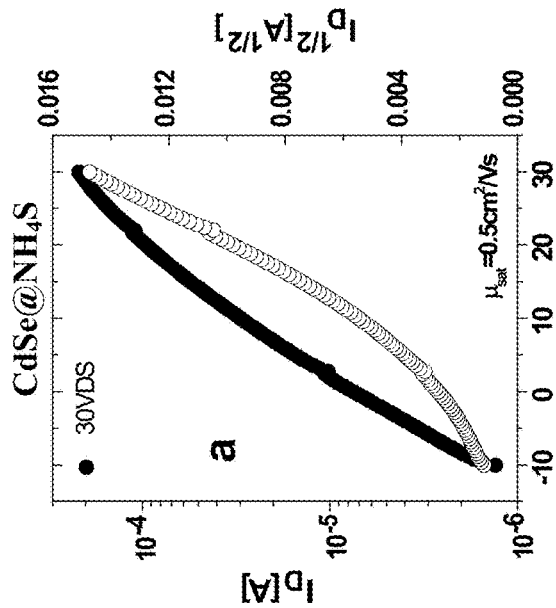
Figure 18C:
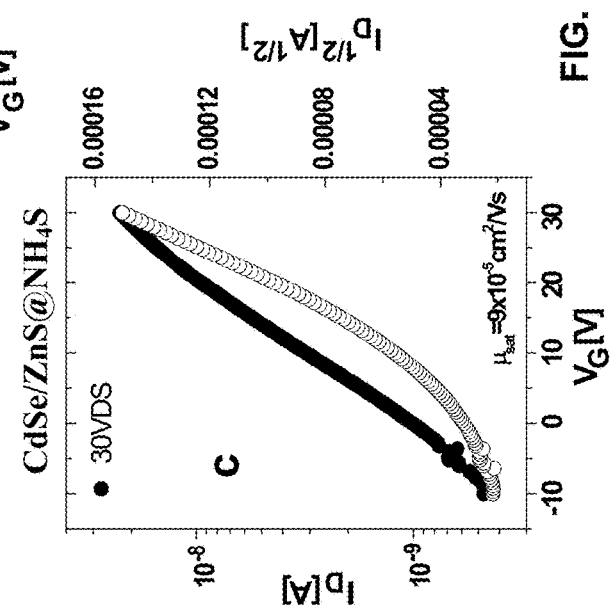
Figure 17:
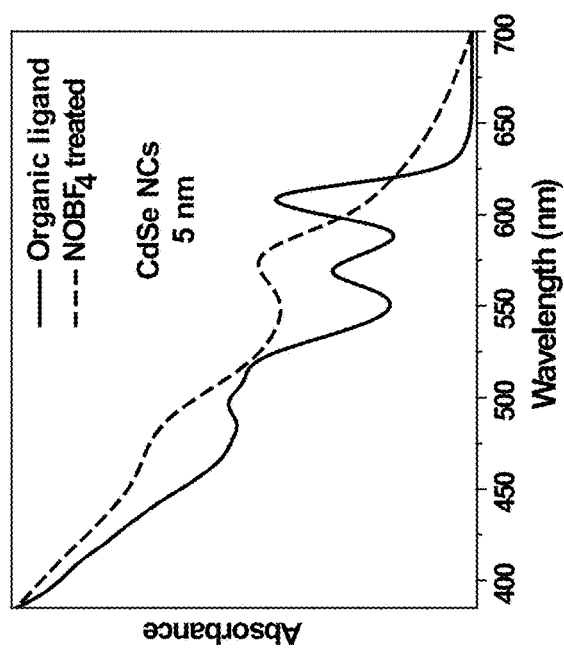
Figure 18B:
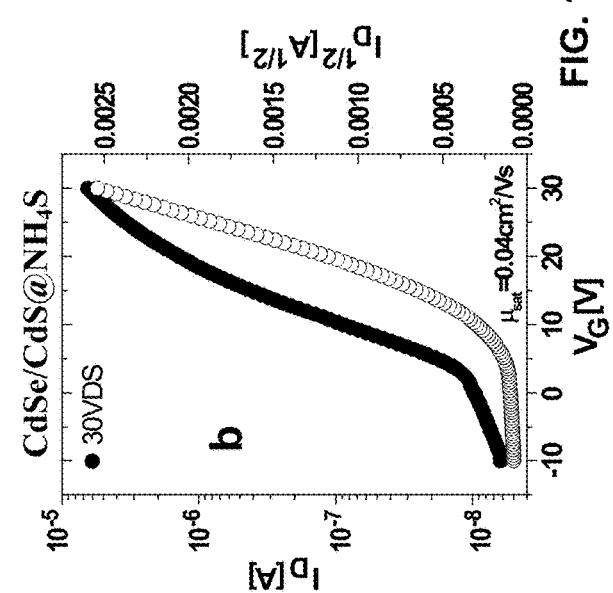
Figure 19A:
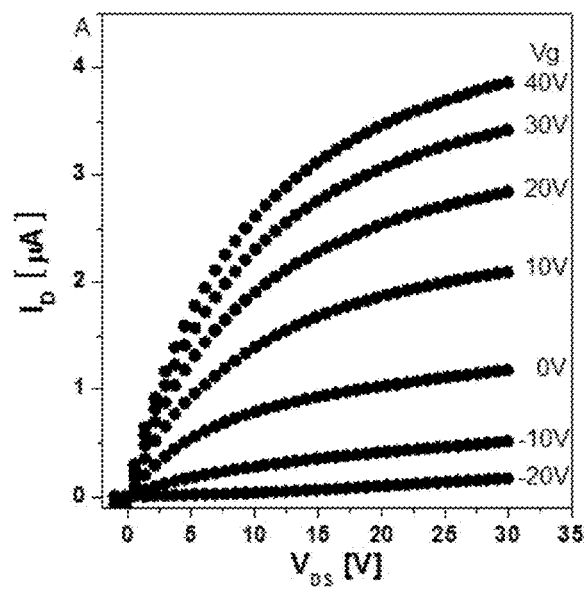
Figure 19B:
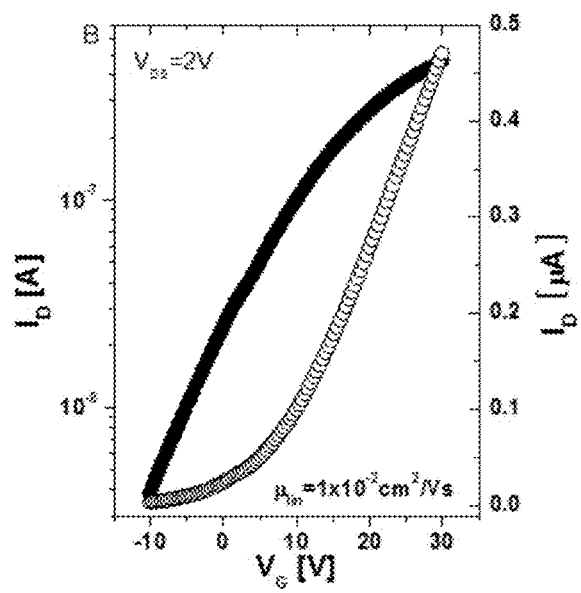
Figure 20:
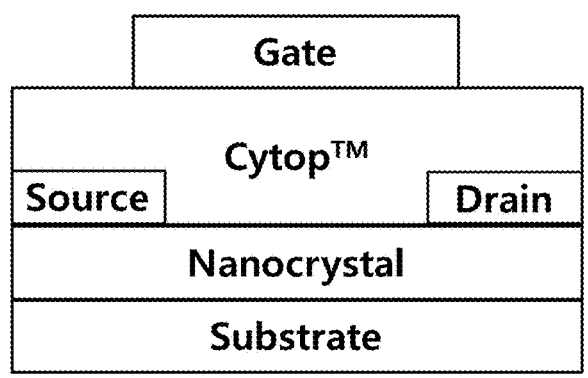

FIG. 6C is a plot of drain current $I_D$ vs. drain-source voltage $V_{DS}$, measured as different gate voltages $V_G$ for the field-effect transistors (FETs) assembled from colloidal NCs capped with $(NH_4)_2S$ for CdSe/ZnS core-shells, showing insets of the photoluminescence spectrum (left) and a photograph (right) for CdSe/ZnS NC film capped with $(NH_4)_2S$ ligands annealed at 250° C. for 30 min;

FIG. 6D is a plot of $I_D$ vs. $V_G$ at constant $V_{DS}=2V$ used to calculate current modulation and linear regime field-effect mobility for FETs using CdSe;

FIG. 6E is a plot of $I_D$ vs. $V_G$ at constant $V_{DS}=2V$ used to calculate current modulation and linear regime field-effect mobility for CdSe/CdS NCs;

FIG. 6F is a plot of $I_D$ vs. $V_G$ measured at constant $V_{DS}=4V$ in a FET assembled from CdSe/ZnS NCs, where L=80 μm, W=1500 μm, 100 nm $SiO_2$ gate oxide;

FIG. 7 is the photoluminecent spectrum of $SH^-$ capped CdSe NCs dispersed in formamide;

FIG. 8 is the FTIR spectra of FA, DMSO, $H_2O$ and an aqueous solution of $(NH_4)_2S$;

FIG. 9 is the ESI Mass spectra of different sulfide and polysulfide ions used as ligands for colloidal nanocrystals;

FIG. 10A is the Experimental and simulated mass-spectra showing the regions of $S_5Na^-$, where experimental spectra were obtained from red colored $Na_2S_x$ aqueous solution and different spectral regions were collected from the corresponding ESI-MS spectrum in FIG. 9;

FIG. 10B is the Experimental and simulated mass-spectra showing the regions of $S_6Na^-$, where experimental spectra were obtained from red colored $Na_2S_x$ aqueous solution and different spectral regions were collected from the corresponding ESI-MS spectrum in FIG. 9;

10C is the Experimental and simulated mass-spectra showing the regions of $S_7Na^-$, where experimental spectra were obtained from red colored $Na_2S_x$ aqueous solution and different spectral regions were collected from the corresponding ESI-MS spectrum in FIG. 9;

FIG. 11A is the Experimental and simulated mass spectra showing the regions of $S_3^{2-}/S_3H^-$, where experimental spectra were obtained from the yellow colored aqueous solution $(NH_4)_2S$ and different spectral regions were collected from the corresponding spectrum in FIG. 9;

FIG. 11B is the Experimental and simulated mass spectra showing the regions of $S_2O_3^{2-}/S_2O_3H^-$, where experimental spectra were obtained from the yellow colored aqueous solution $(NH_4)_2S$ and different spectral regions were collected from the corresponding spectrum in FIG. 9;

FIG. 11C is the Experimental and simulated mass spectra showing the regions of $S_4^{2-}/S_4H^-$, where experimental spectra were obtained from the yellow colored aqueous solution $(NH_4)_2S$ and different spectral regions were collected from the corresponding spectrum in FIG. 9;

FIG. 11D is the Experimental and simulated mass spectra showing the regions of $S_5H^-$, where experimental spectra were obtained from the yellow colored aqueous solution $(NH_4)_2S$ and different spectral regions were collected from the corresponding spectrum in FIG. 9;

FIG. 11E is the Experimental and simulated mass spectra showing the regions of $S_6H^-$, where experimental spectra were obtained from the yellow colored aqueous solution $(NH_4)_2S$ and different spectral regions were collected from the corresponding spectrum in FIG. 9;

FIG. 12 illustrates powder X-ray diffraction patterns of CdSe NCs capped with the organic ligands and same NCs capped with $TeS_3^{2-}$ ligands after annealing at 120° C.;

FIG. 13 is XRD patterns of $TeS_3^{2-}$ capped PbS NCs;

FIG. 14 is XRD patterns of 5 nm CdSe NCs capped with different ligands;

FIG. 15 is FTIR spectra CdSe NCs capped with organic ligands, KOH and $NaNH_2$;

FIG. 16 is a table comparing the ζ-potential values for NCs capped with soft bases ($S^{2-}$ and $SH^-$) and hard base ($OH^-$), where soft bases exhibit more negative ζ-potential, indicating higher binding affinity, for NCs with softer acidic cites, and in contrast, the hard base shows higher binding affinity for NCs with harder acidic sites;

FIG. 17 is UV-visible absorption spectra of ~5 nm CdSe NCs capped with organic ligands and same NCs after $NOBF_4$ treatment, dispersed in hexane and FA, respectively;

FIG. 18A is a plot of $I_D$ vs. $V_G$ at constant $V_{DS}=30V$ used to calculate the saturation field-effect mobility for FETs using CdSe, where L=80 μm, W=1500 μm, 100 nm $SiO_2$ gate oxide;

FIG. 18B is a plot of of $I_D$ vs. $V_G$ at constant $V_{DS}=30V$ used to calculate the saturation field-effect mobility for FETs using CdSe/CdS core-shell NCs, where L=80 μm, W=1500 μm, 100 nm $SiO_2$ gate oxide;

FIG. 18C is a plot of $I_D$ vs. $V_G$ at constant $V_{DS}=30V$ used to calculate the saturation field-effect mobility for FETs using CdSe/ZnS core-shell NCs, where L=80 μm, W=1500 μm, 100 nm $SiO_2$ gate oxide;

FIG. 19A is a FET assembled from 3.9 nm CdSe NCs capped with $TeS_3^{2-}$ ligands annealed at 250° C. for 30 min, and is a plot of drain current $I_D$ vs. drain-source voltage $V_{DS}$, measured as different gate voltages $V_G$, where L=80 μm, W=1500 μm, 100 nm $SiO_2$ gate oxide;

FIG. 19B is a FET assembled from 3.9 nm CdSe NCs capped with $TeS_3^{2-}$ ligands annealed at 250° C. for 30 min, and is a plot of $I_D$ vs. $V_G$ at constant $V_{DS}=2V$ used to calculate current modulation and linear regime field-effect mobility, where L=80 μm, W=1500 μm, 100 nm $SiO_2$ gate oxide;

FIG. 20 is a schematic of top-gate transistor used here; and

Figures 21A, 21B:
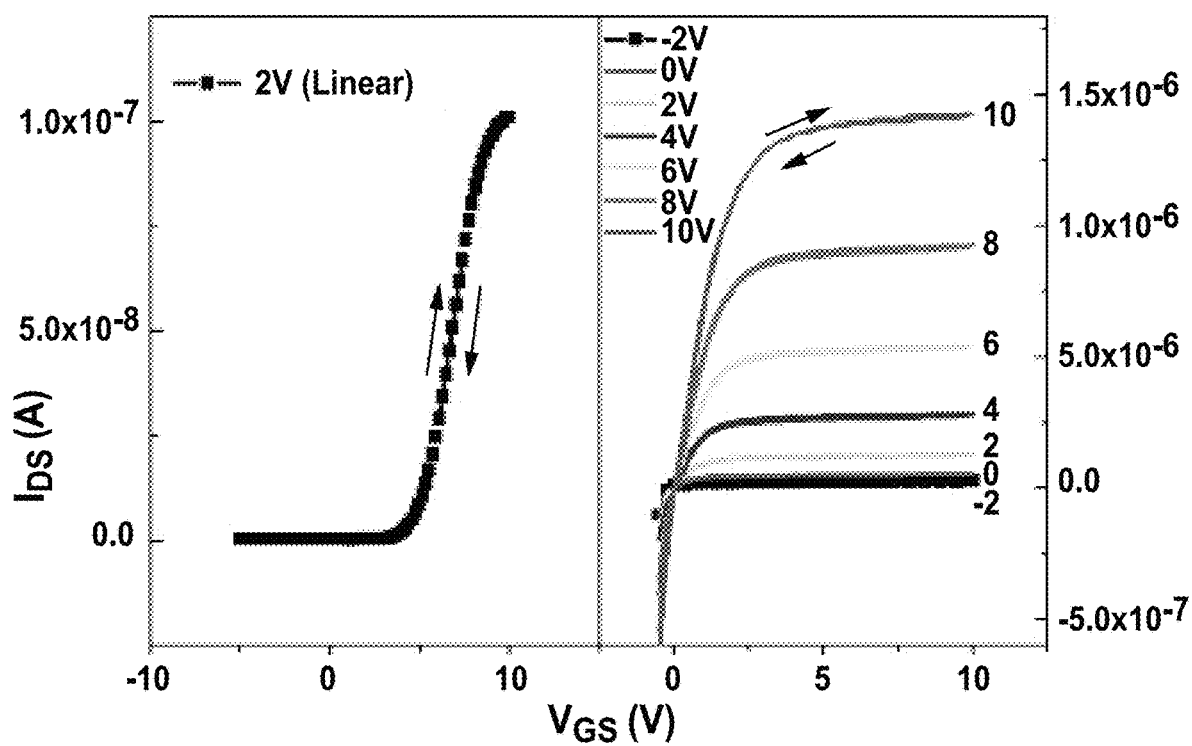
Figure 22A:
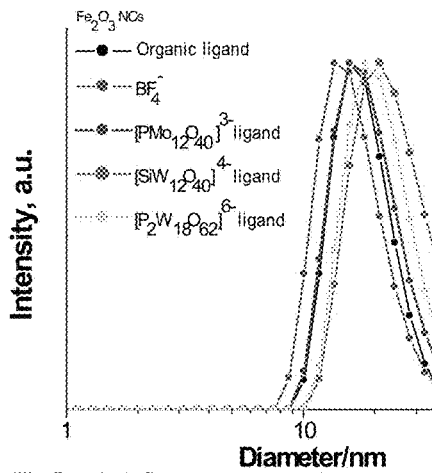
Figure 22B:
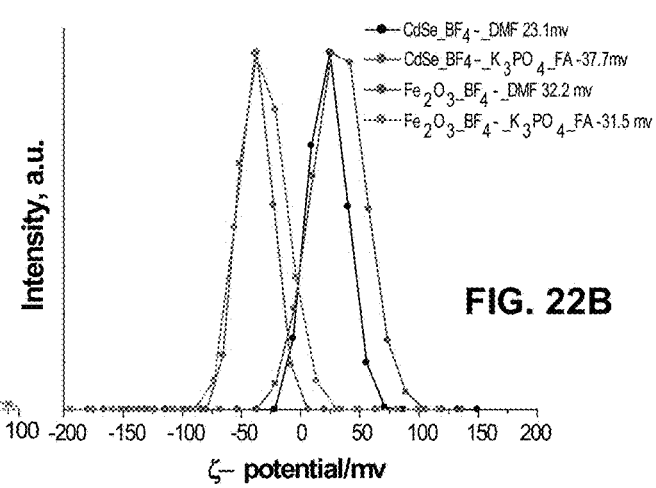
Figure 22C:
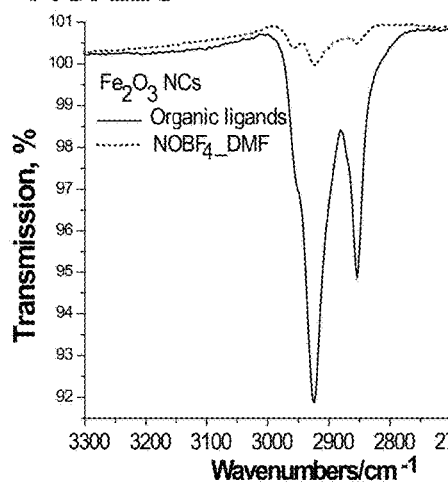
Figure 22D:
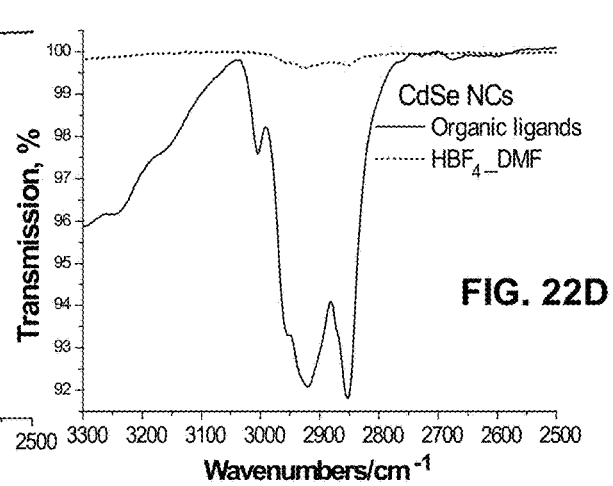
Figure 22E:
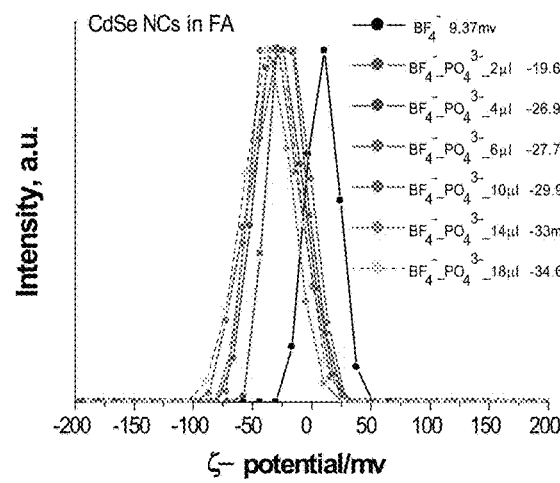
Figure 22F:
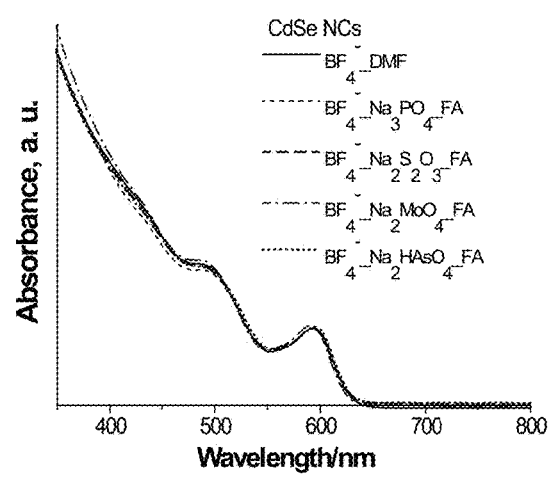
Figures 23A, 23B, 23C, 23D, 23E, 23F, 23G, 23H:
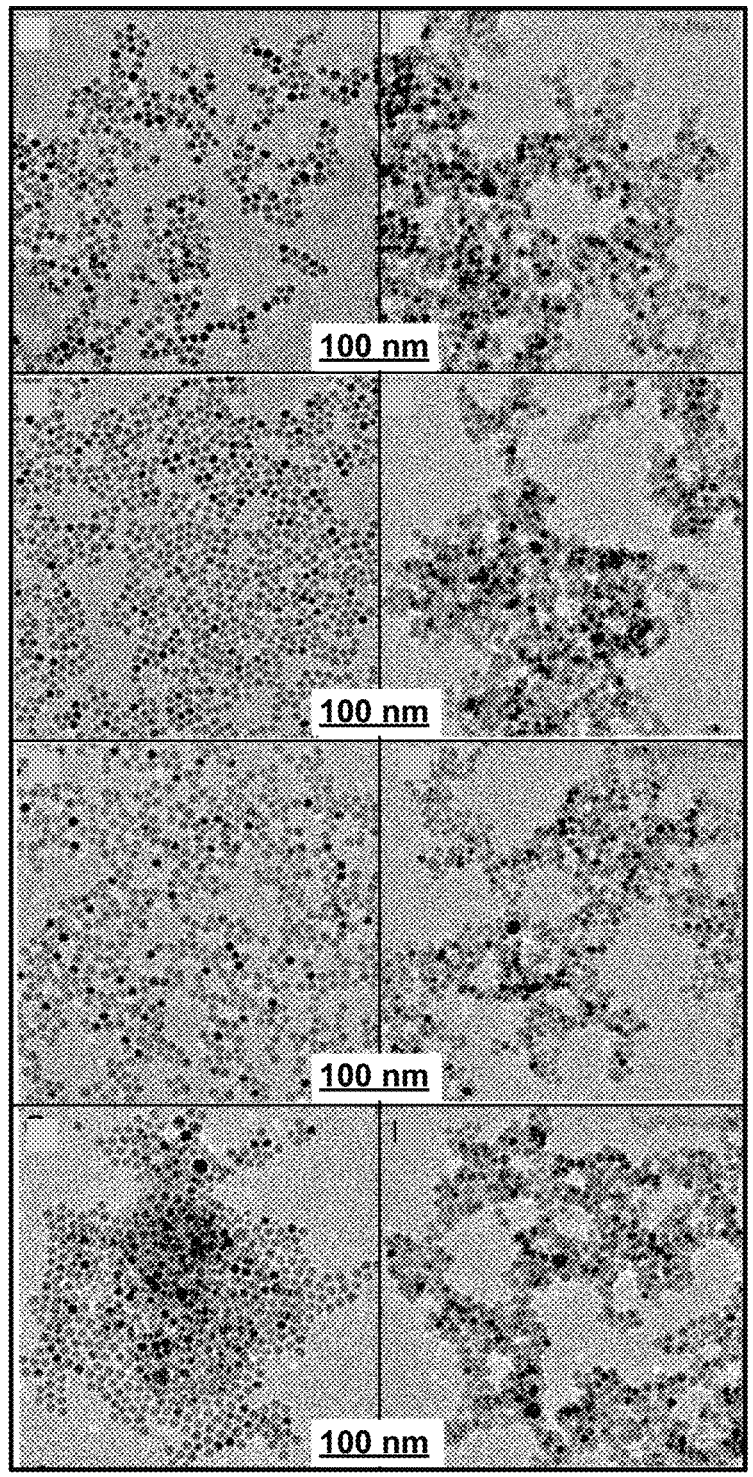
Figure 25A:
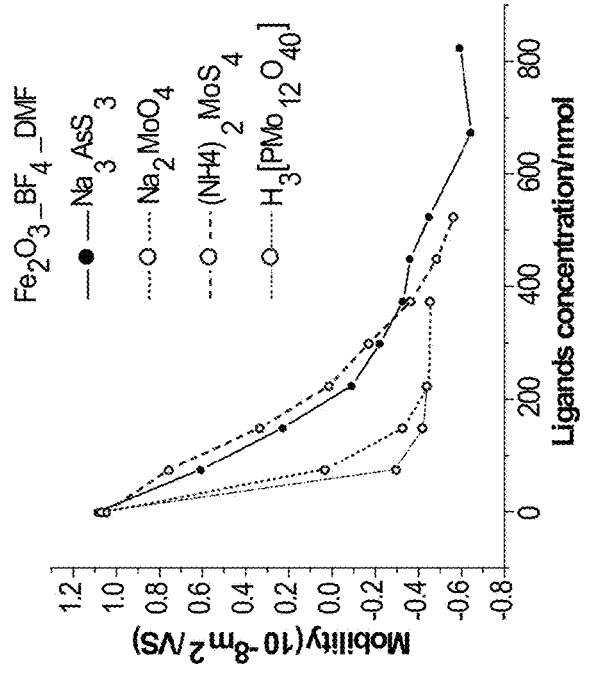
Figure 25B:
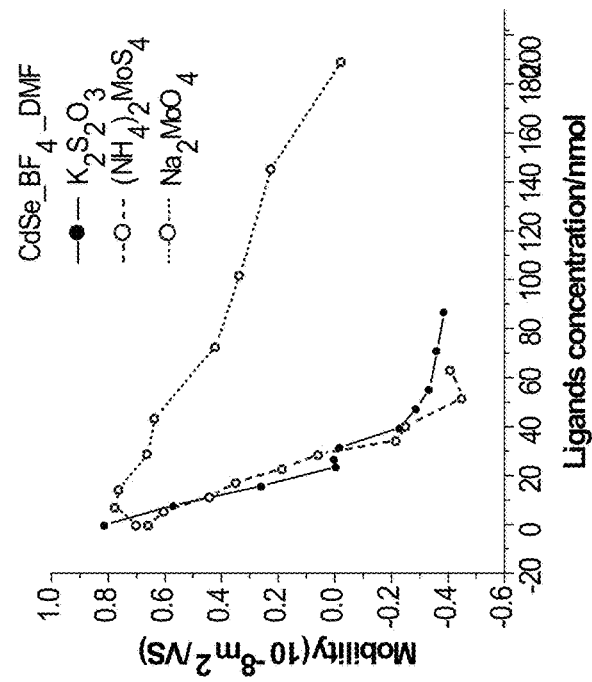
Figure 26:
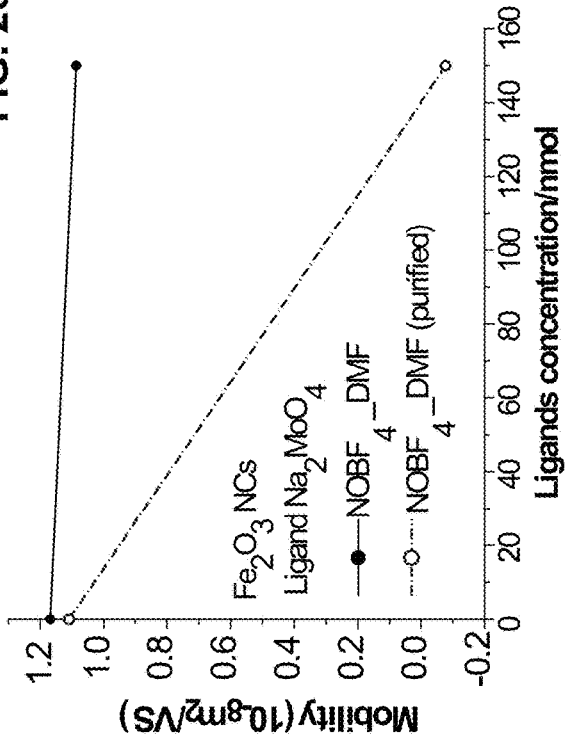

FIG. 21A is a plot of the Transfer characteristics of transistors based on $S^{2-}$ capped CdSe nanocrystals annealed at 200° C.;

FIG. 21B is a plot of the output characteristics of transistors based on $S^{2-}$ capped CdSe nanocrystals annealed at 200° C.;

FIG. 22A shows Dynamic light scattering (DLS) size histogram for $Fe_2O_3$ NCs (15 nm) capped with POMs;

FIG. 22B shows Zeta potential (ζ) measurements for CdSe and $Fe_2O_3$ NCs before and after $PO_4^{3-}$ ligand capping; (C);

FIG. 22C shows FTIR spectra of $Fe_2O_3$ NCs;

FIG. 22D shows CdSe NCs before and after organic ligands removal;

FIG. 22E shows Zeta potential measurements for positively charged CdSe NCs in FA with addition of $PO_4^{3-}$ ligands;

FIG. 22F shows Absorption spectra of CdSe NCs capped with different oxo-ligands;

FIG. 23A shows a TEM image of $Fe_2O_3$ NCs capped with $Na_2MoO_4$ in NFA;

FIG. 23B shows a TEM image of $Fe_2O_3$ NCs capped with $Na_2MoO_4$ in FA;

FIG. 23C shows a TEM image of $Fe_2O_3$ NCs capped with $Na_2HAsO_4$ in NFA;

FIG. 23D shows a TEM image of $Fe_2O_3$ NCs capped with $Na_2HAsO_4$ in FA;

FIG. 23E shows a TEM image of $Fe_2O_3$ NCs capped with $Na_3[PMo_{12}O_{40}]$ in NFA;

FIG. 23F shows a TEM image of $Fe_2O_3$ NCs capped with $Na_3[PMo_{12}O_{40}]$ in FA;

FIG. 23G shows a TEM image of $Fe_2O_3$ NCs capped with $K_6[P_2Mo_{18}O_{62}]$ in NFA;

FIG. 23H shows a TEM image of $Fe_2O_3$ NCs capped with $K_6[P_2MO_{18}O_{62}]$ in FA;

FIG. 24A shows a TEM image of CdSe NCs capped with organic ligands;

FIG. 24B shows a TEM image of CdSe NCs capped with DMF after $HBF_4$ treatment in FA;

FIG. 24C shows a TEM image of CdSe NCs capped with $Na_3VO_4$ in FA;

FIG. 24D shows a TEM image of CdSe NCs capped with $Na_2S_2O_3$ in FA;

FIG. 24E shows a TEM image of CdSe NCs capped with $Na_2MoS_4$ in FA;

FIG. 24F shows a TEM image of CdSe NCs capped with $Na_2MoO_4$ in FA;

FIG. 24G shows a TEM image of CdSe NCs capped with $Na_2HAsO_4$ in FA;

FIG. 24H shows a TEM image of CdSe NCs capped with $Na_3PO_4$ in FA;

FIG. 25A shows Zeta potential titration of CdSe NCs by addition of different amounts of oxo-ligands in DMF;

FIG. 25B shows Zeta potential titration of $Fe_2O_3$ NCs by addition of different amounts of oxo-ligands in DMF;

FIG. 26 shows ζ-potential measurements of $Fe_2O_3$ NCs solutions in DMF with different pHs;

FIG. 27A shows the XRay diffraction pattern of growth on zinc blende CdSe NCs at room temperature;

FIG. 27B shows the XRay diffraction pattern of growth on wurtzite CdSe NCs at room temperature;

FIG. 27C shows the absorption spectra of zinc blende CdSe-xSCd with x=1 ... 10 and TEM images of zinc blende CdSe-10SCd with $(NH_4)_2S$ as a precursor of sulfide and cadmium oleate, $Cd(OA)_2$, as a precursor of cadmium, and the nanocrystals are washed after each monolayer;

FIG. 27D shows the absorption spectra of wurtzite CdSe-xSCd with x=1 ... 10 and TEM images of wurtzite CdSe-10SCd with $(NH_4)_2S$ as a precursor of sulfide and cadmium oleate, $Cd(OA)_2$, as a precursor of cadmium, and the nanocrystals are washed after each monolayer;

FIG. 27E shows the absorption spectra of zinc blende CdSe-xSCd with x=1 ... 10 and TEM images of zinc blende CdSe-10SCd with QDs stabilized by oleylamine either when they are sulfide rich or cadmium rich;

FIG. 27F shows the absorption spectra of wurtzite CdSe-xSCd with x=1 ... 10 and TEM images of wurtzite CdSe-10SCd with QDs stabilized by oleylamine either when they are sulfide rich or cadmium rich;

FIG. 28A-F shows TEM images and absorption spectra of different NCs with different inorganic ligands;

FIG. 29A shows absorption spectra of CdSe-xSCd for x=1 ... 10;

FIG. 29B shows a TEM image of CdSe

Figure 30B:
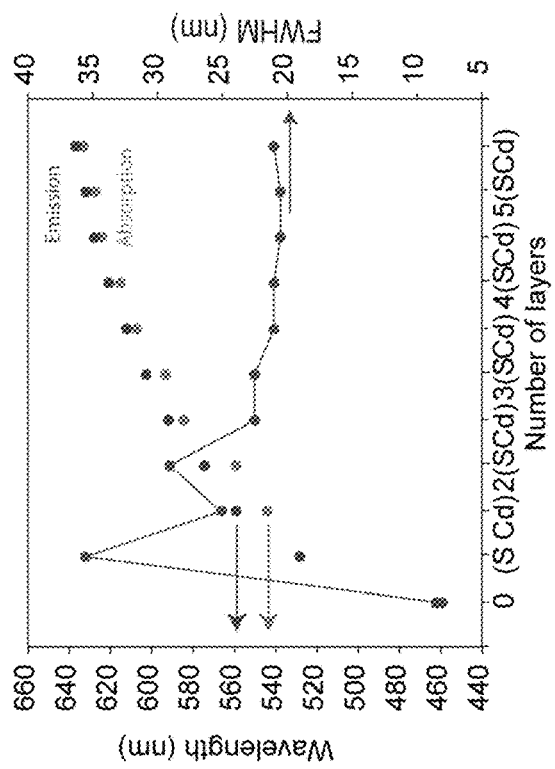
Figure 30C:
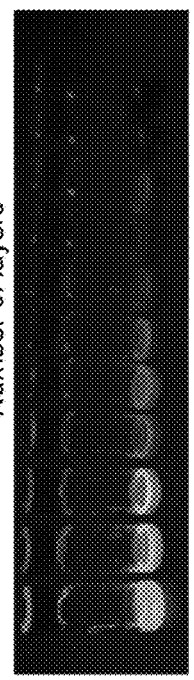
Figure 30A:
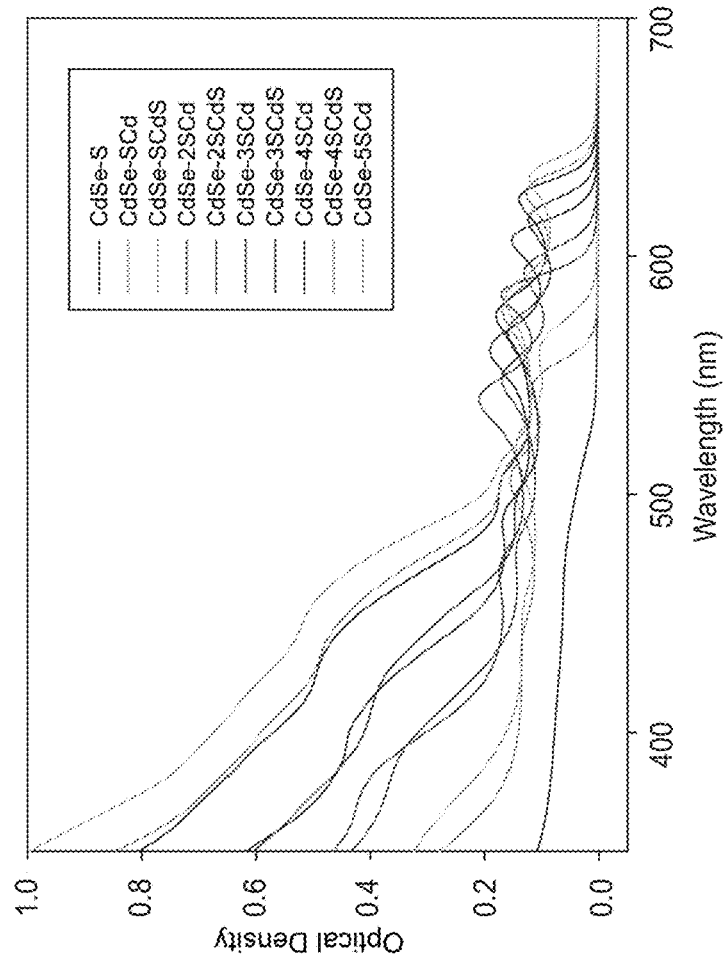
Figure 31:
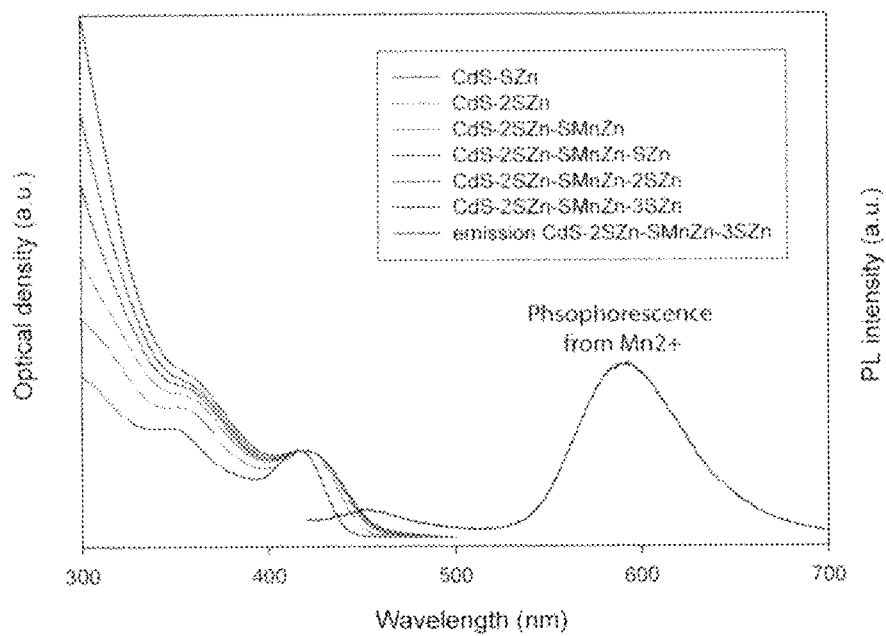
Figure 32A:
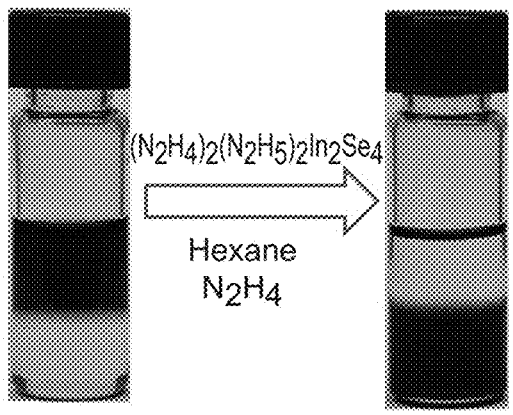
Figure 32B:
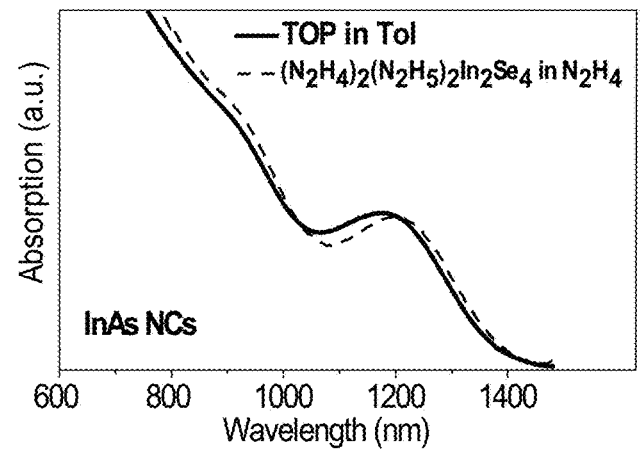
Figure 32C:
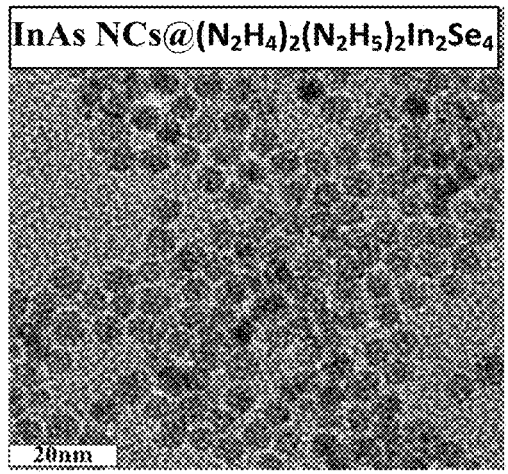
Figure 32D:
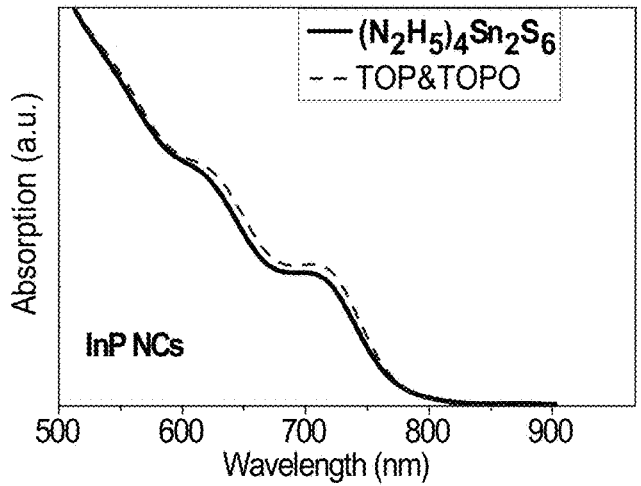
Figure 32E:
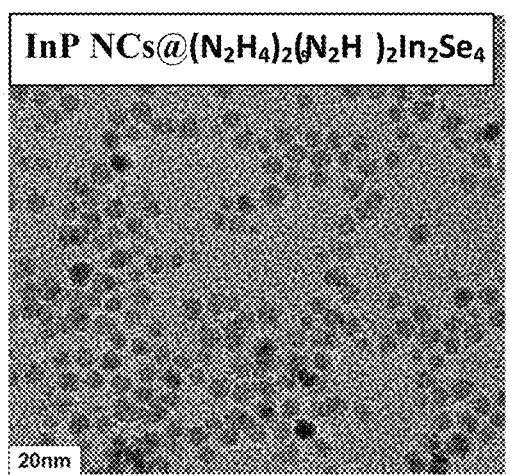
Figure 32F:
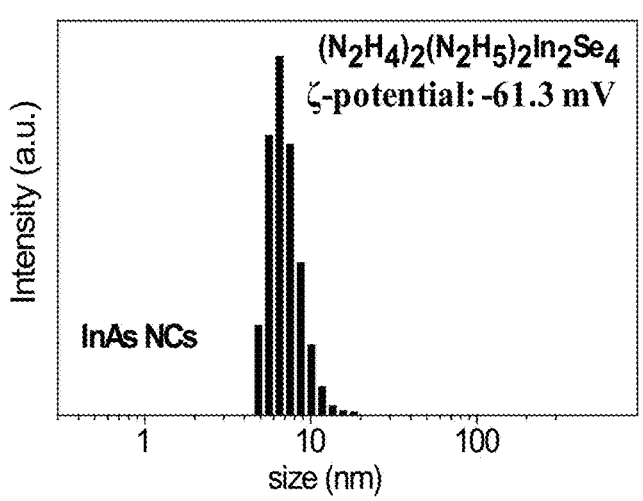
Figure 33A:
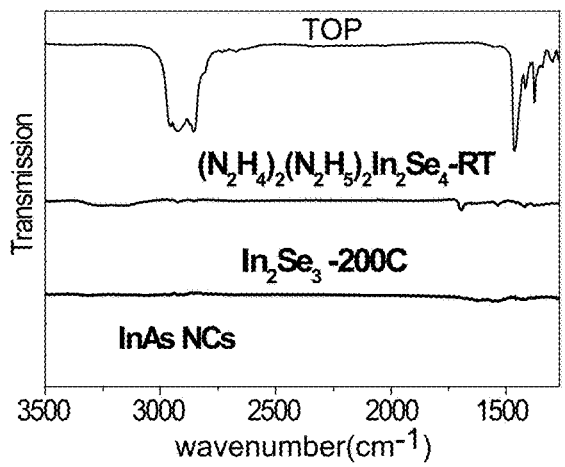
Figure 33B:
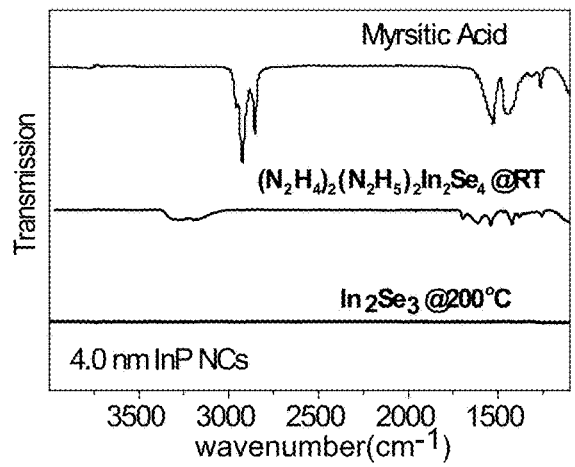
Figure 33C:
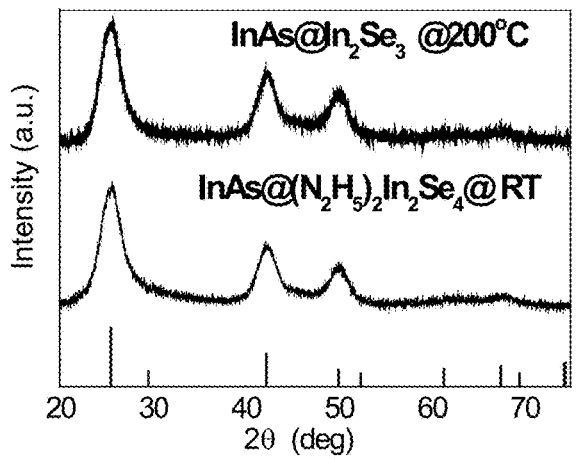
Figure 33D:
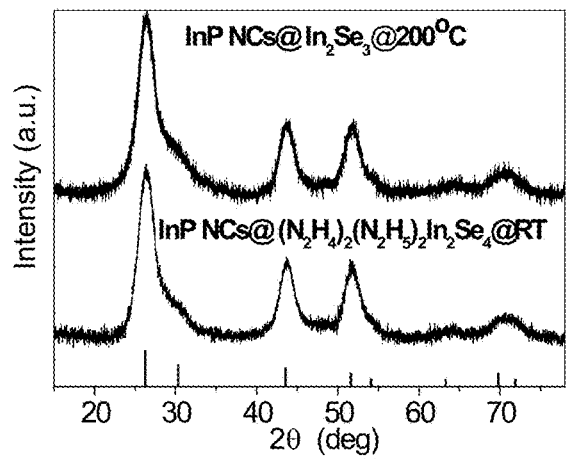
Figure 33E:
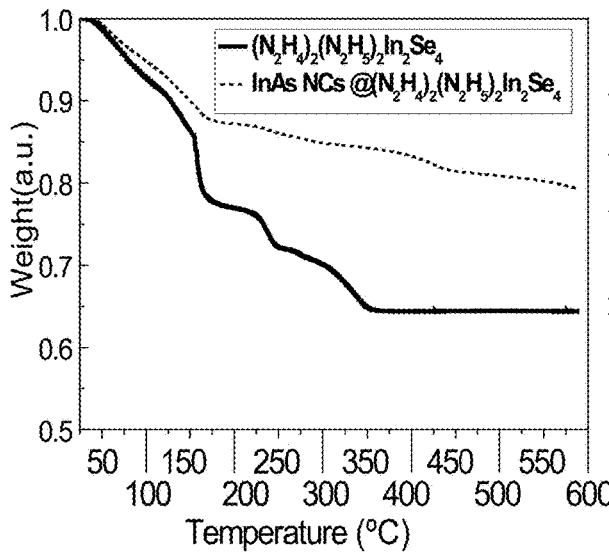
Figure 33F:
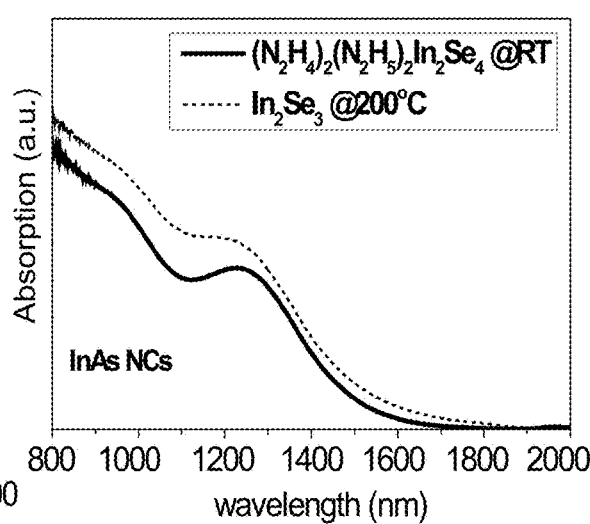
Figure 36A:
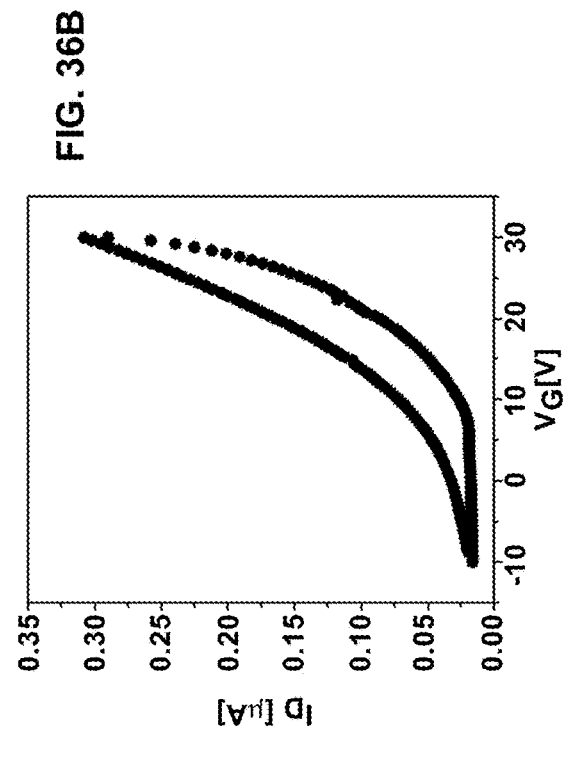
Figure 36B:
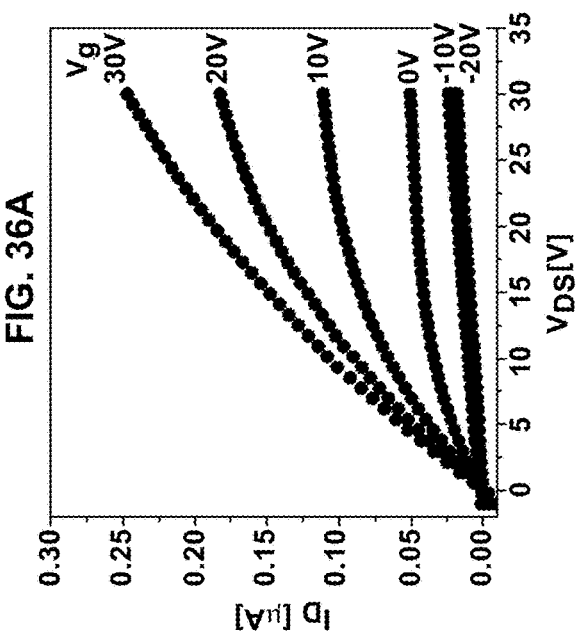
Figure 36C:
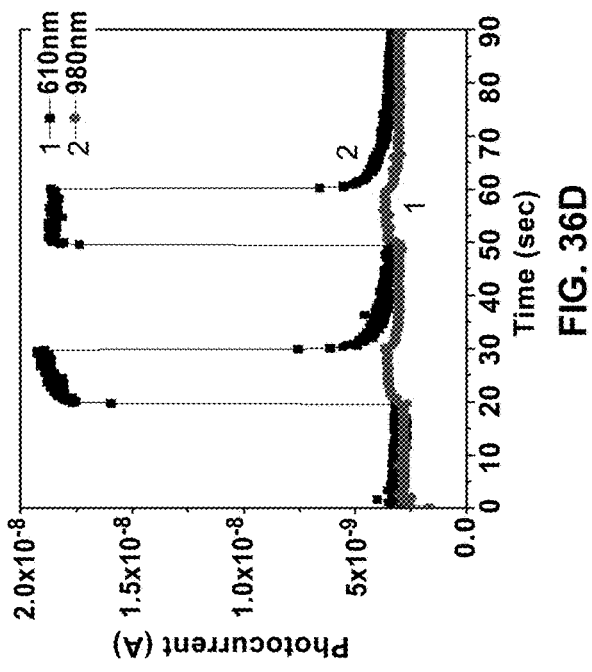
Figure 36D:
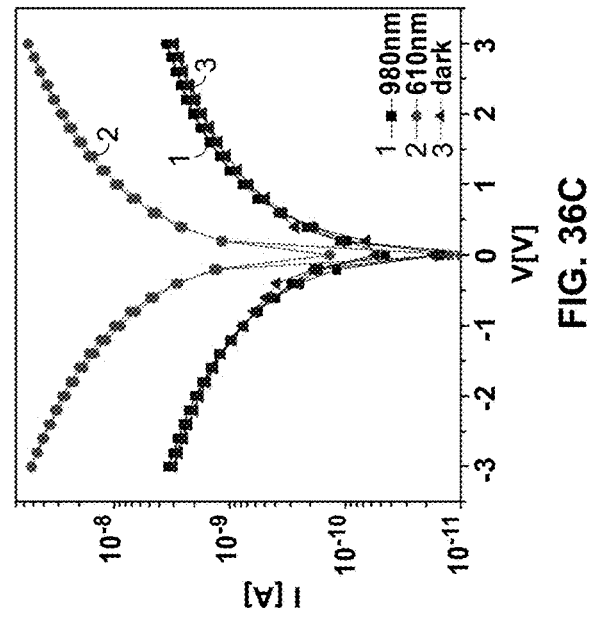
Figure 37A:
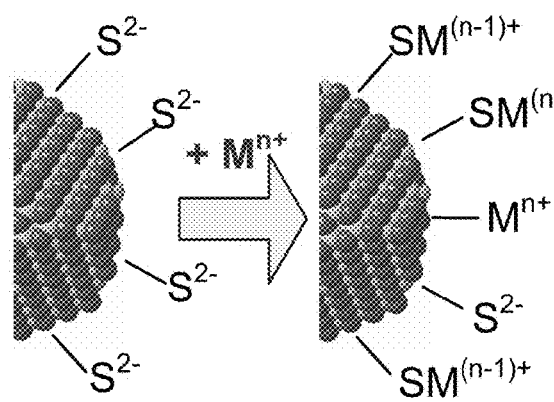
Figure 37B:
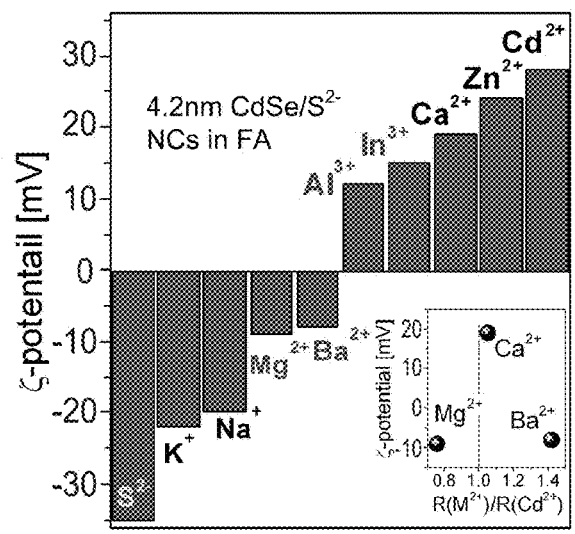
Figure 37C:
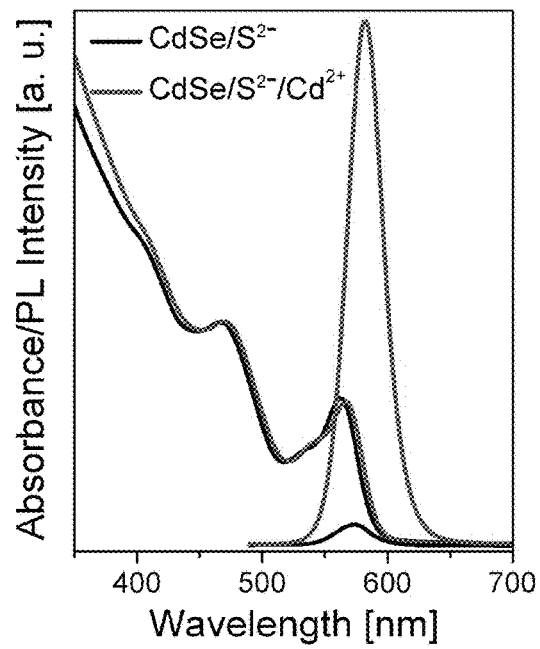
Figure 37D:
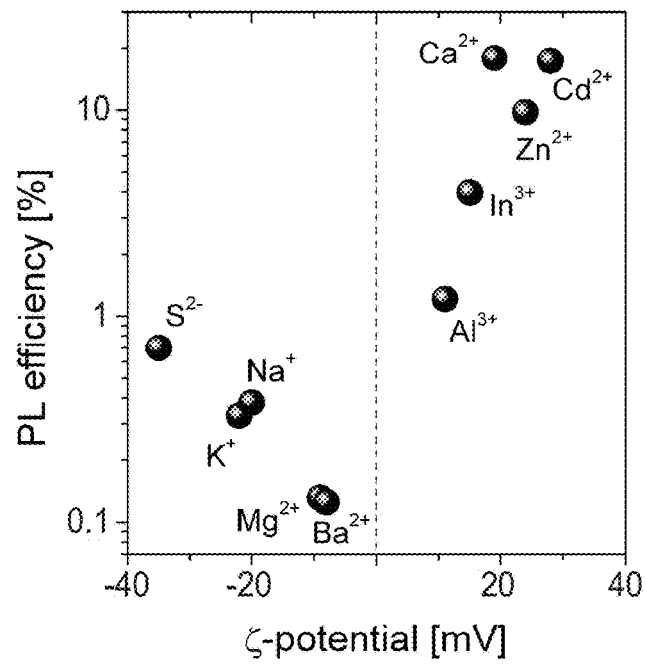
Figure 38A:
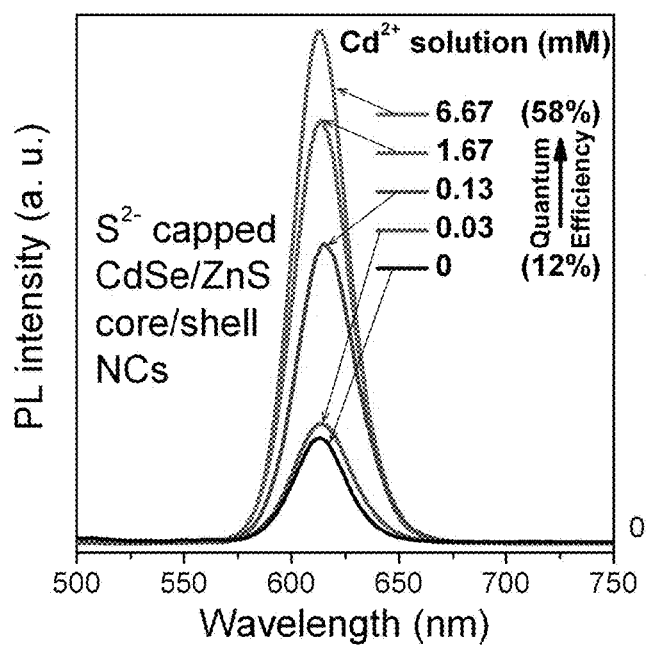
Figure 38B:
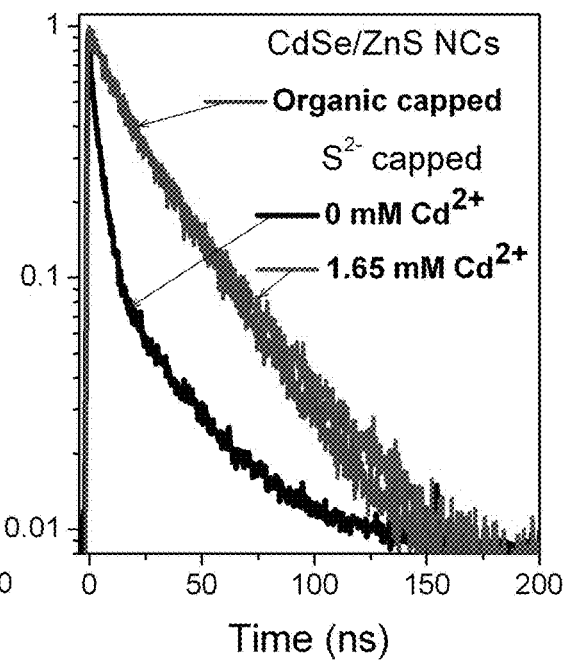
Figures 41A, 41B, 41C, 41D, 41E, 41F, 41G, 41H:
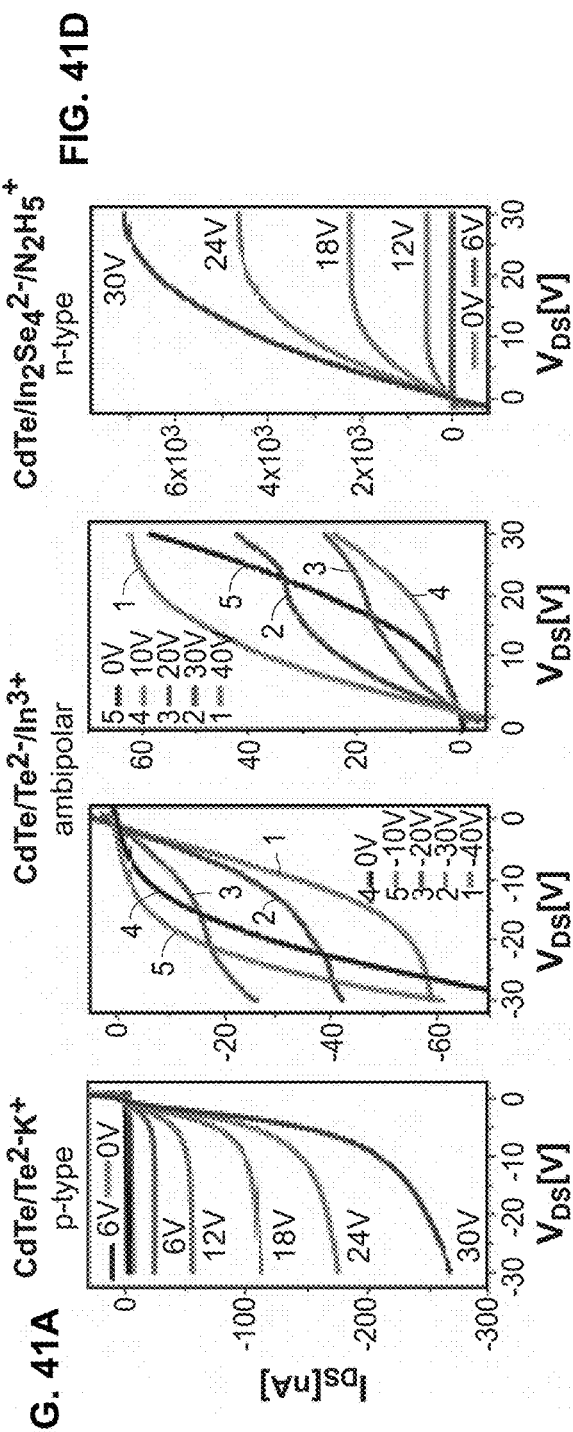
Figure 42:
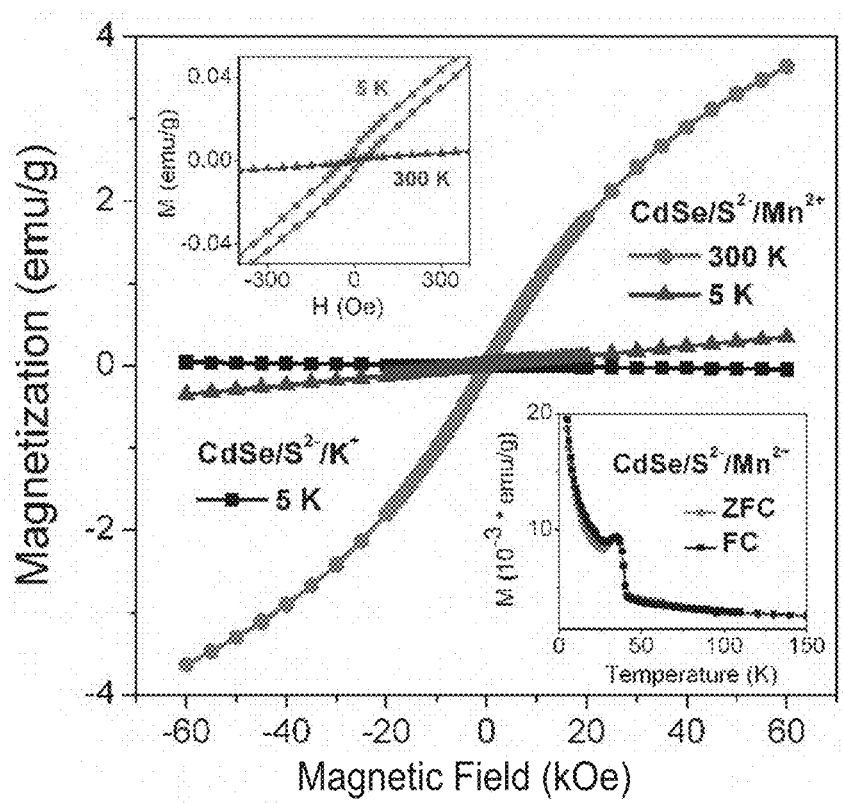
Figure 43:
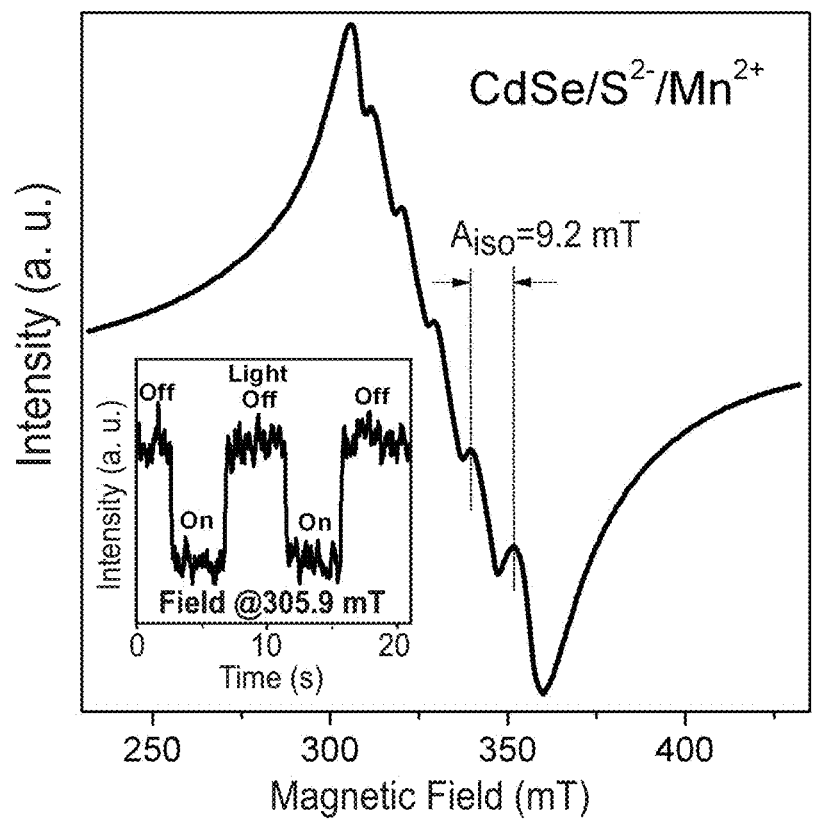
Figures 44A, 44B, 44C:
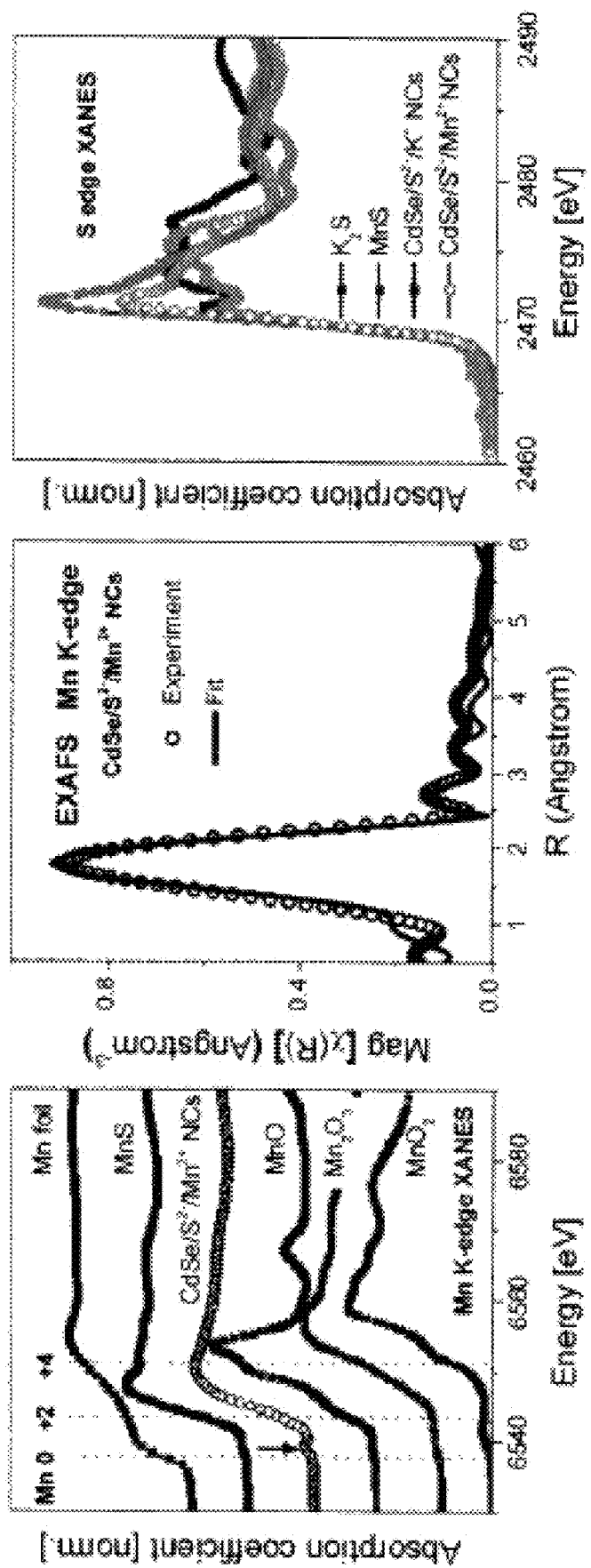
Figure 45A:
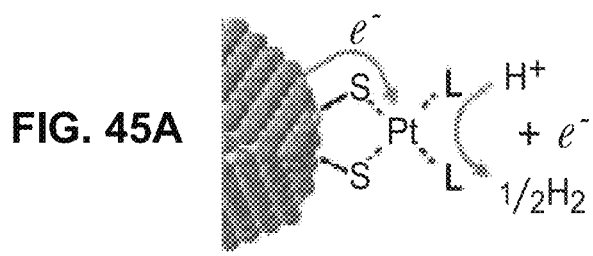
Figure 45B:
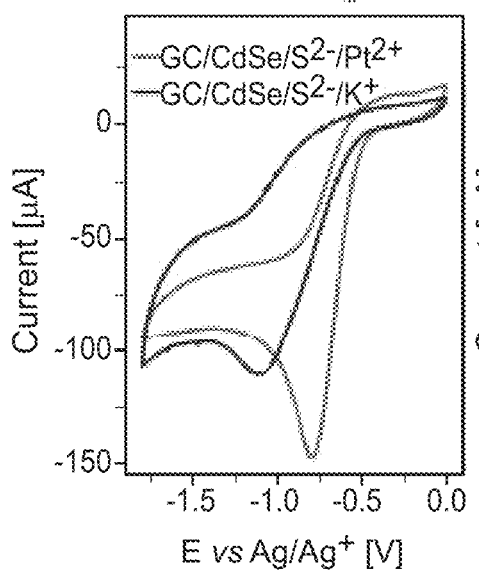
Figure 45C:
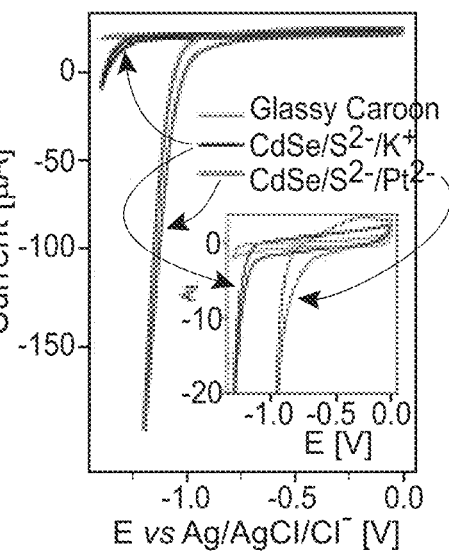
Figure 46:
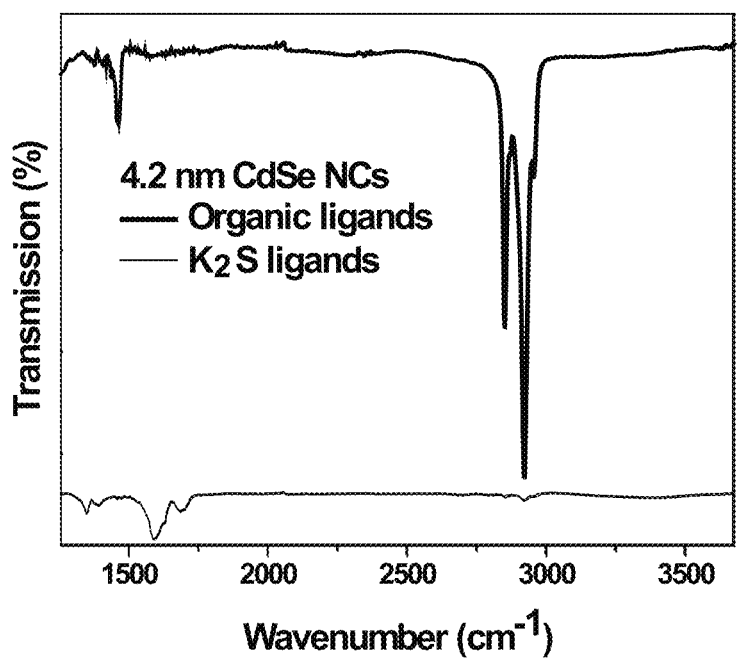
Figure 47:
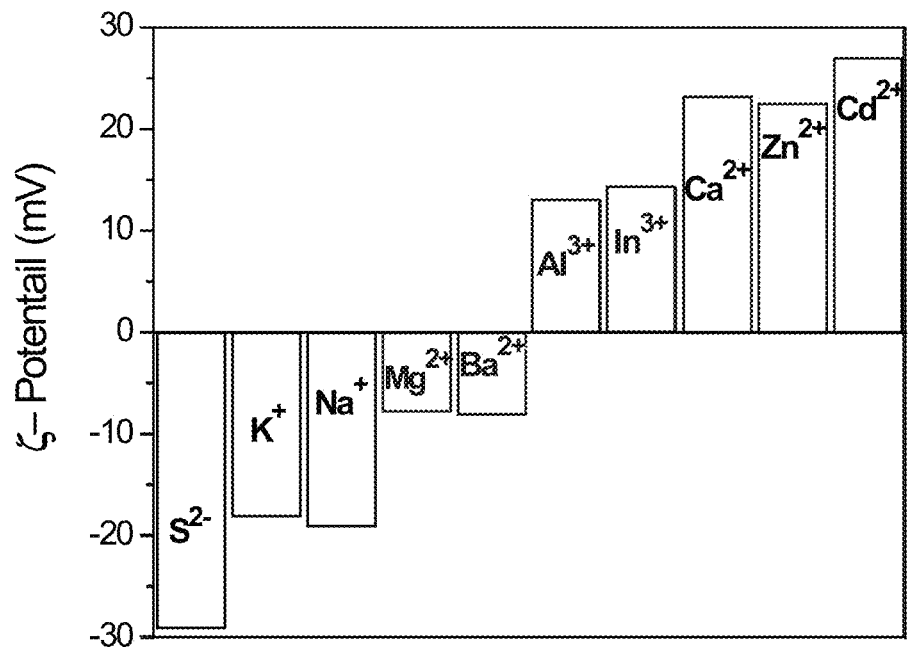
Figure 48:
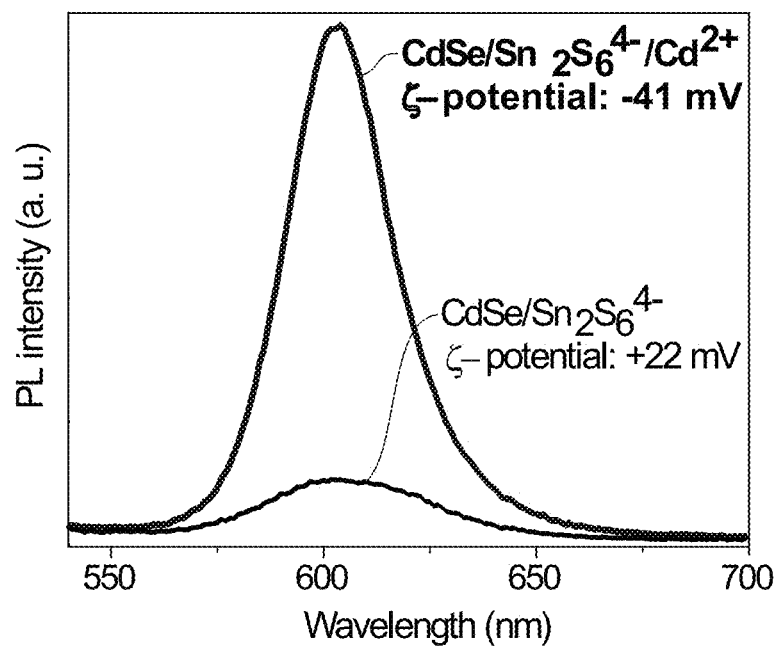
Figure 49:
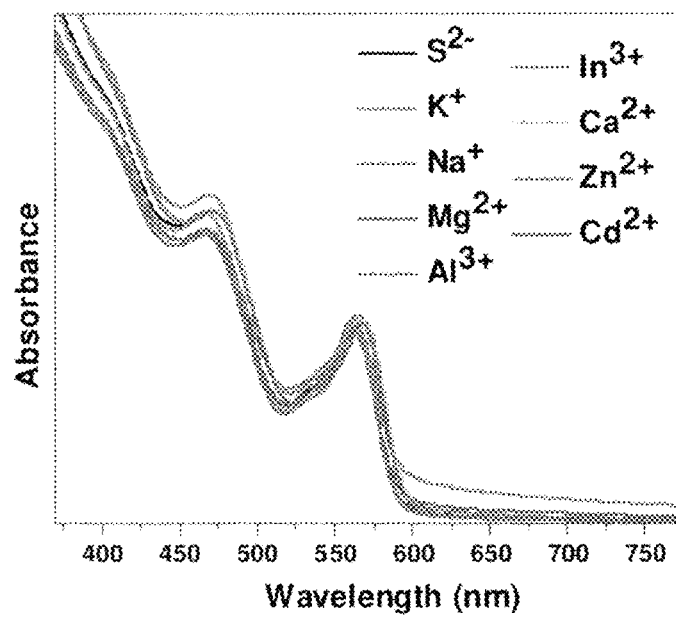
Figure 50:
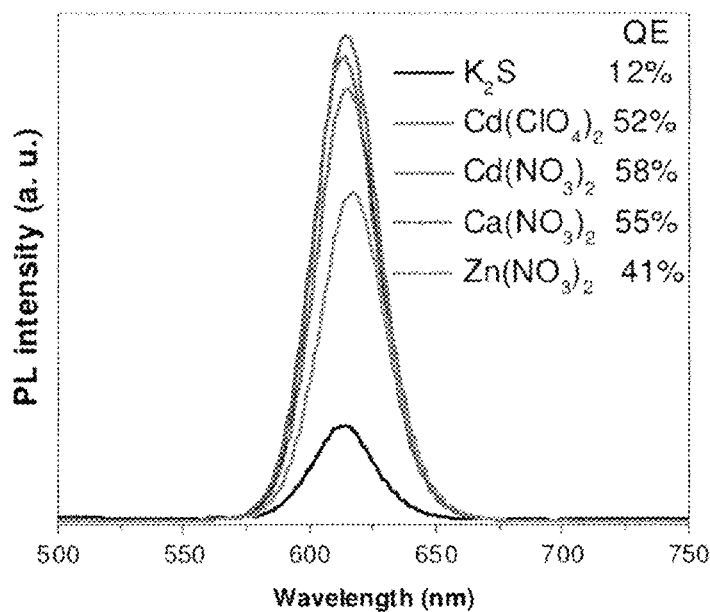
Figure 51:
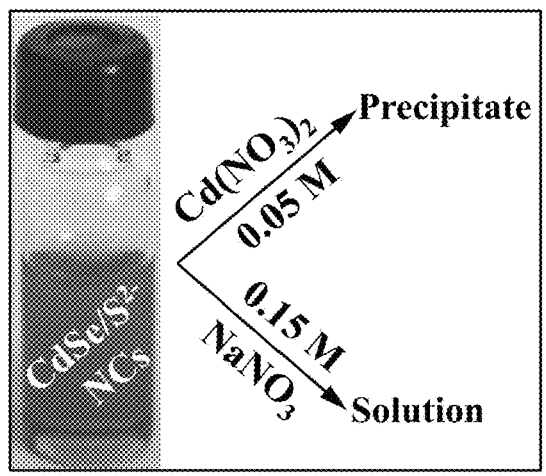
Figure 52:
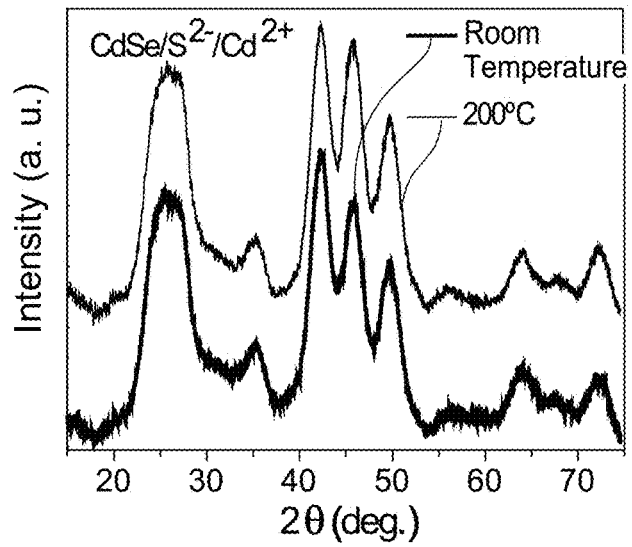
Figure 53:
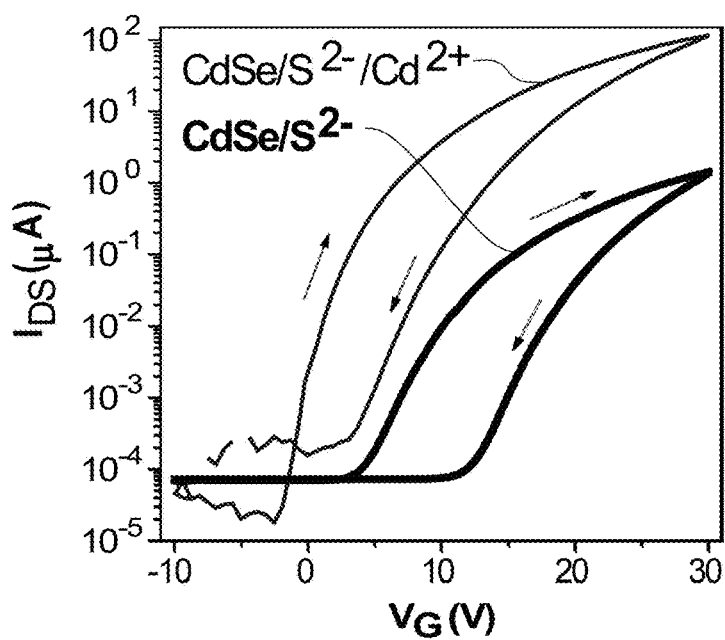
Figure 54A:
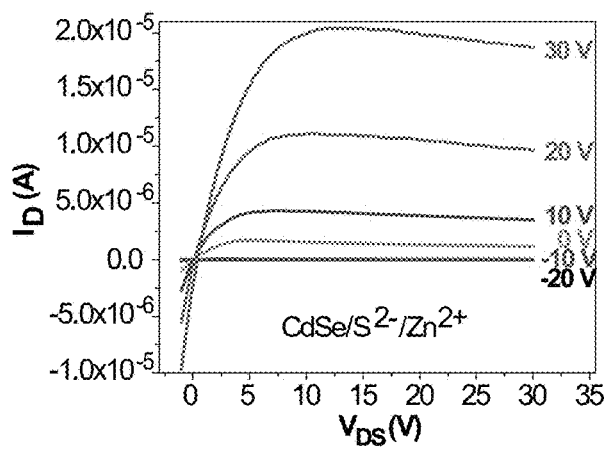
Figure 54B:
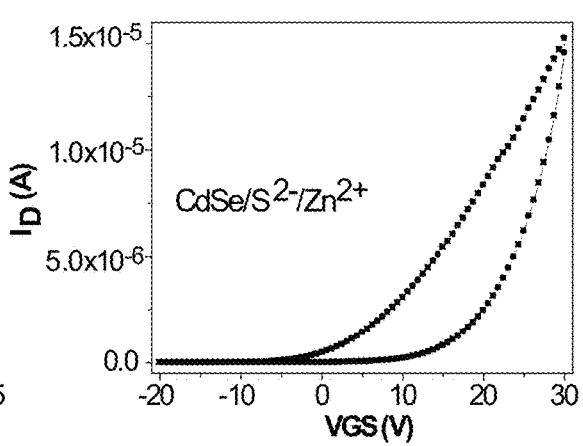
Figure 54C:
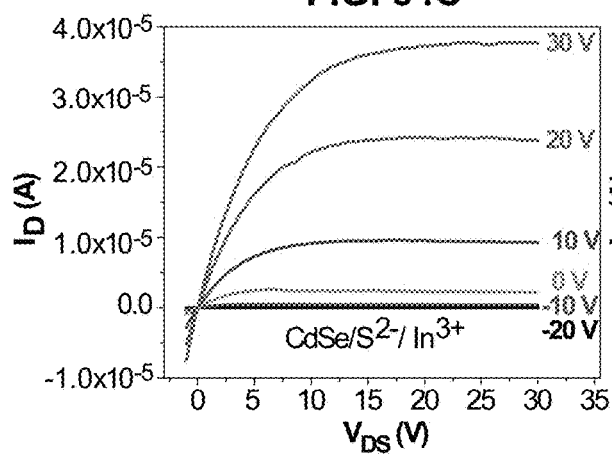
Figure 54D:
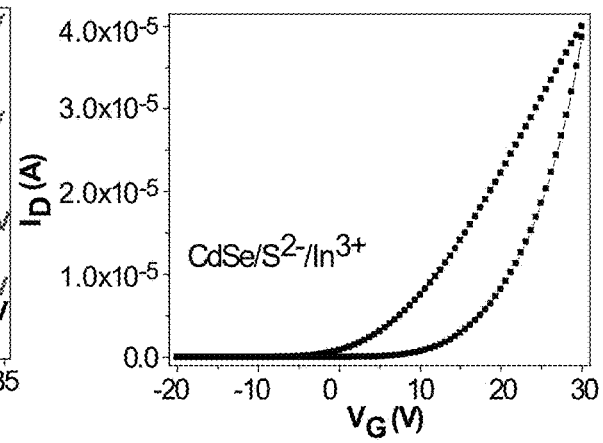
Figure 54E:
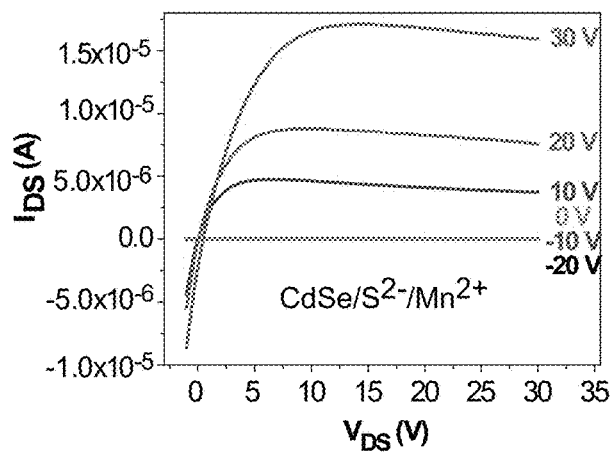
Figure 54F:
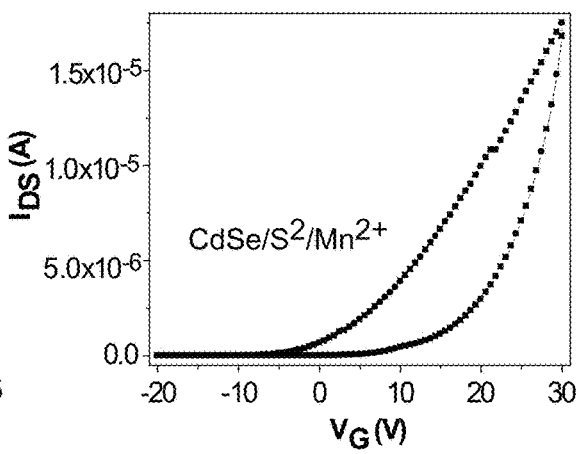
Figure 55A:
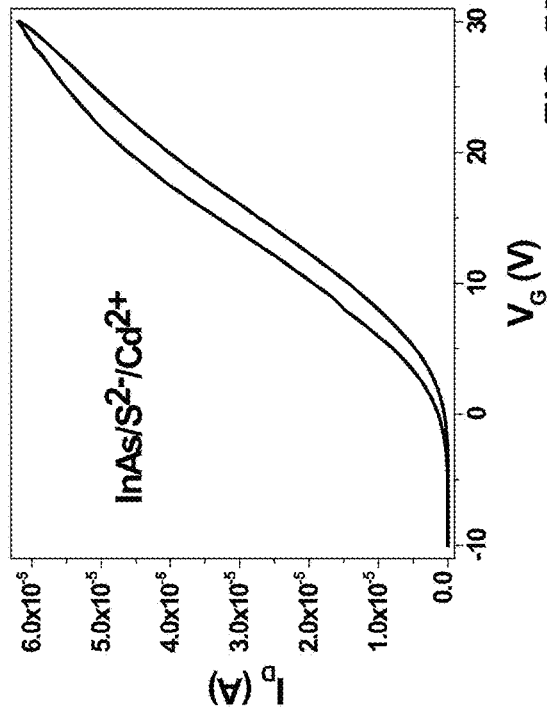
Figure 55B:
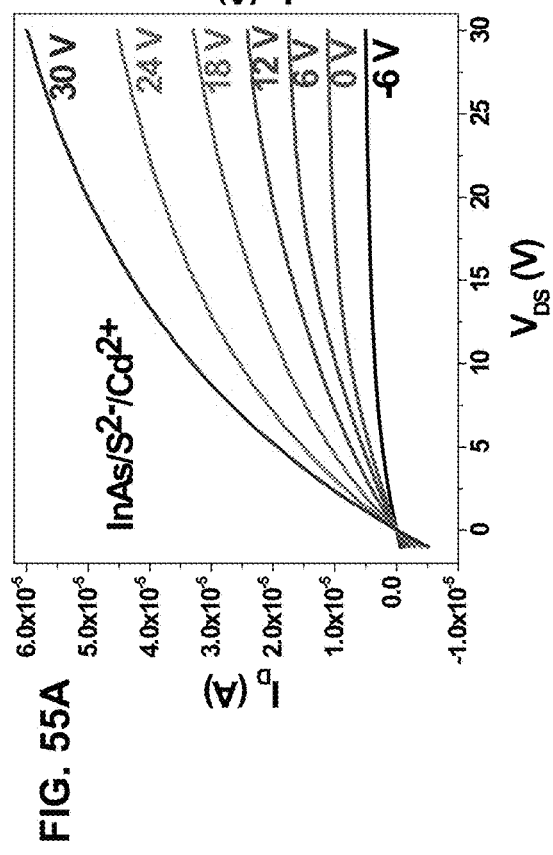
Figure 55C:
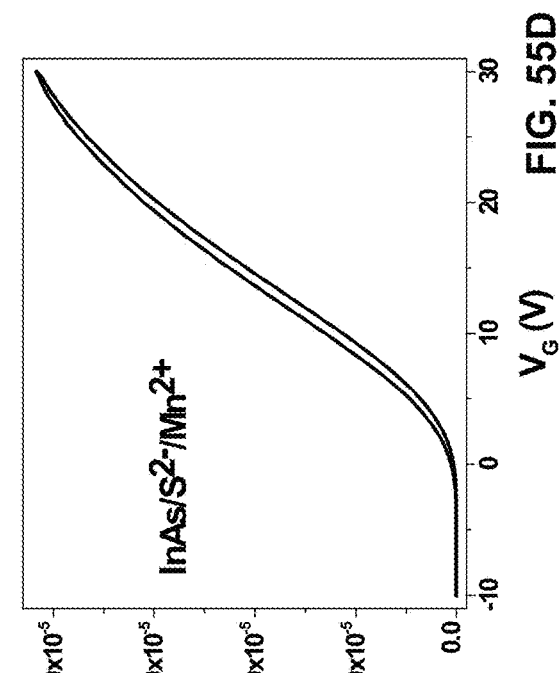
Figure 55D:
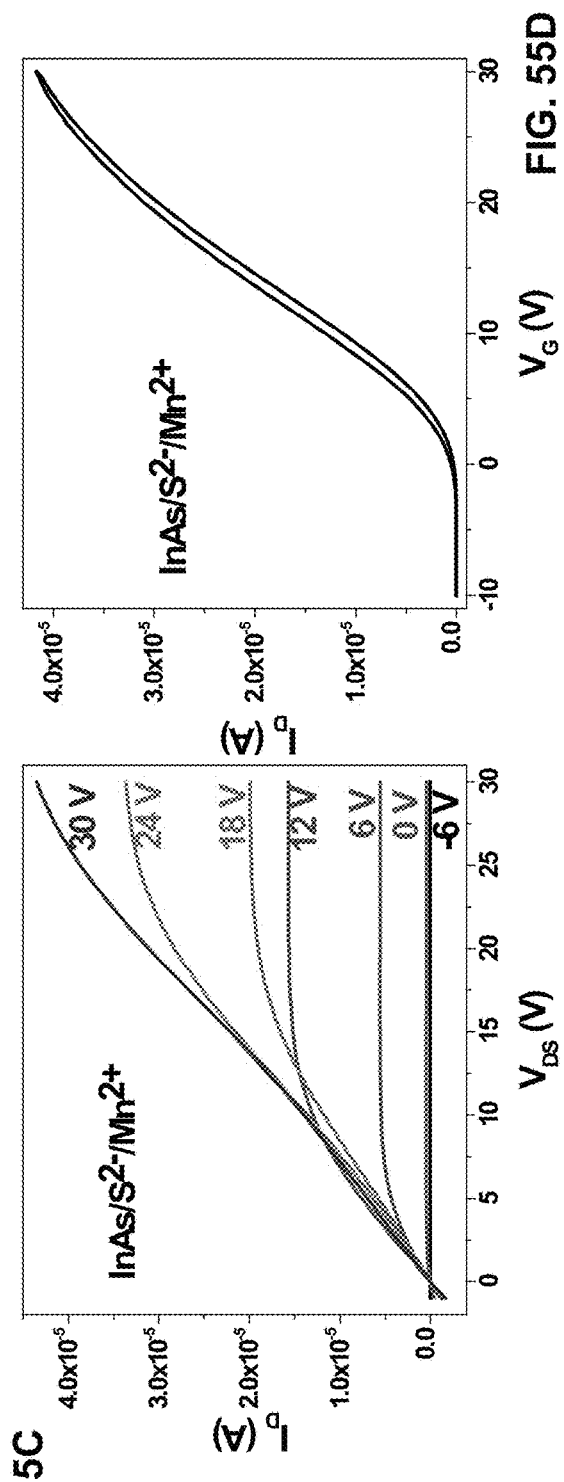
Figure 56A:
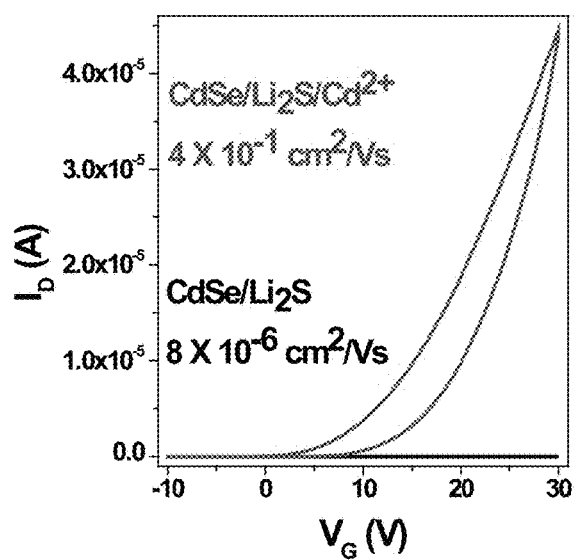
Figure 56B:
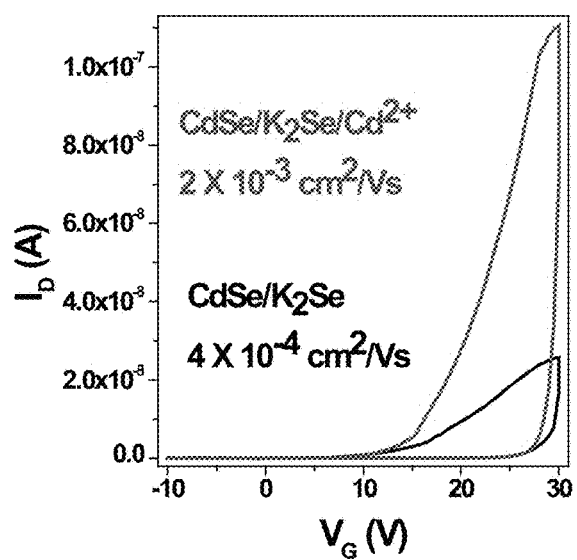
Figure 57A:
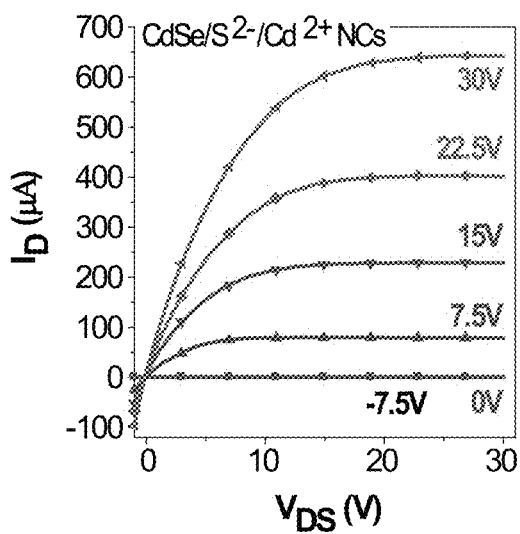
Figure 57B:
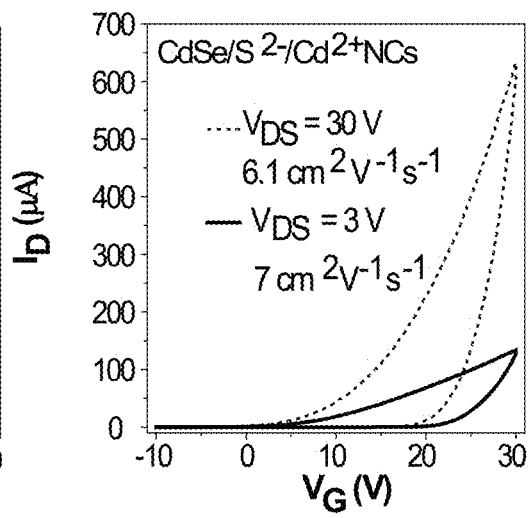
Figure 58:
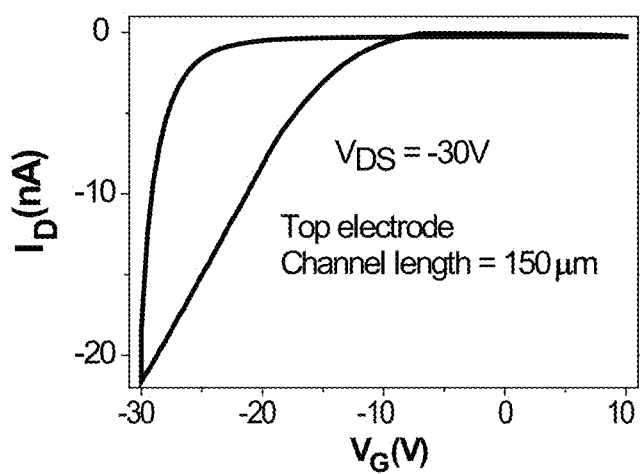
Figure 59A:
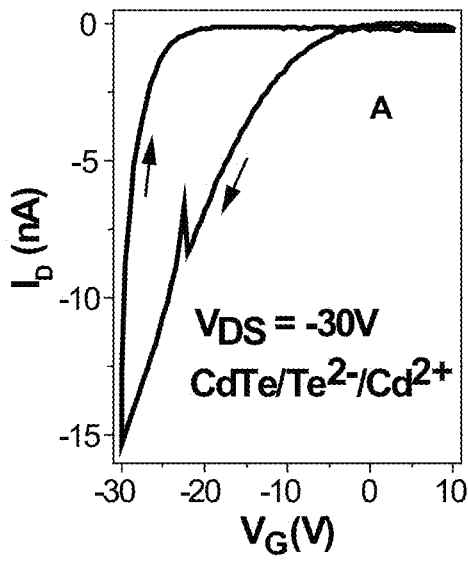
Figure 59B:
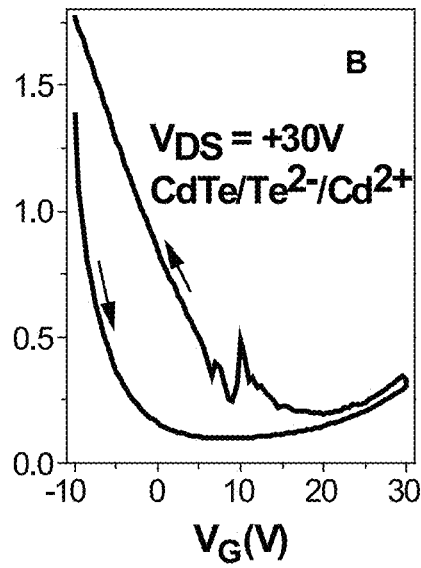
Figure 60A:
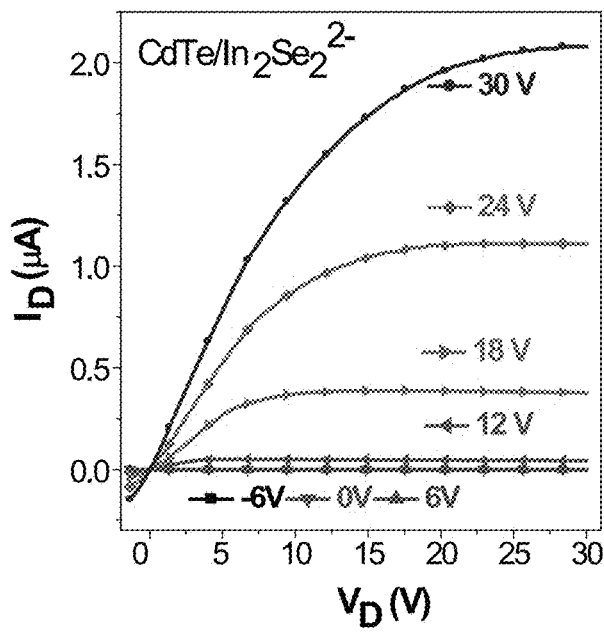
Figure 60B:
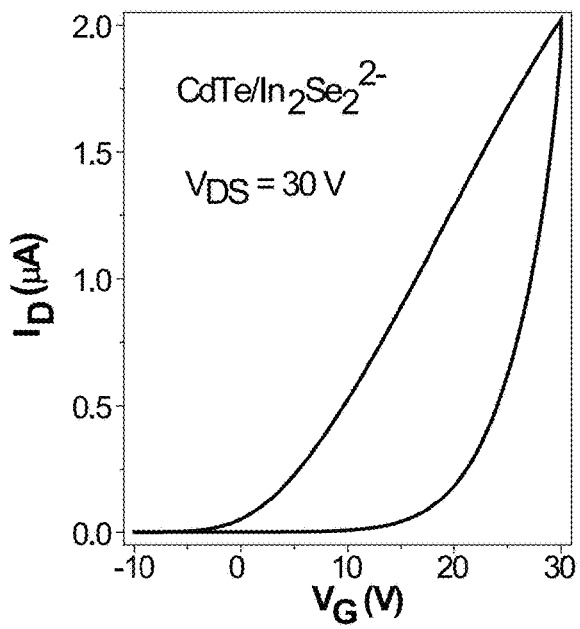
Figure 61:
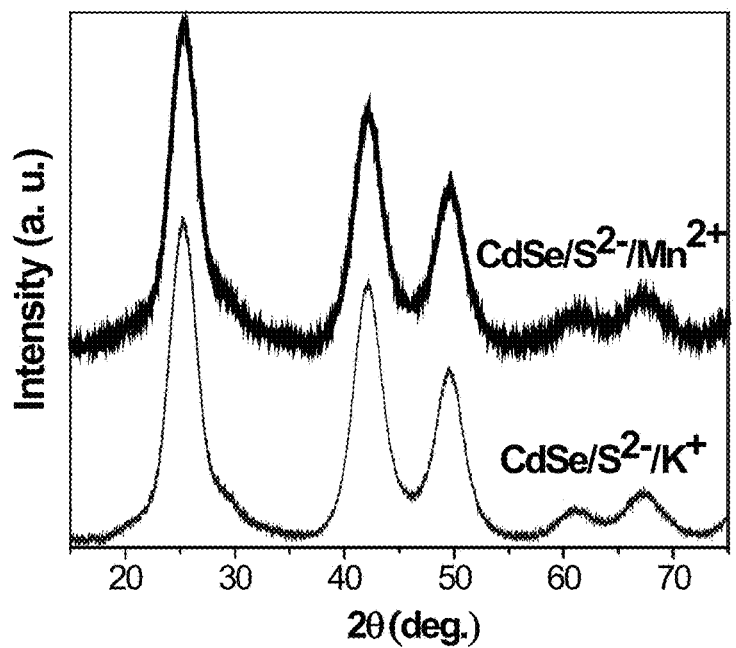
Figure 64:
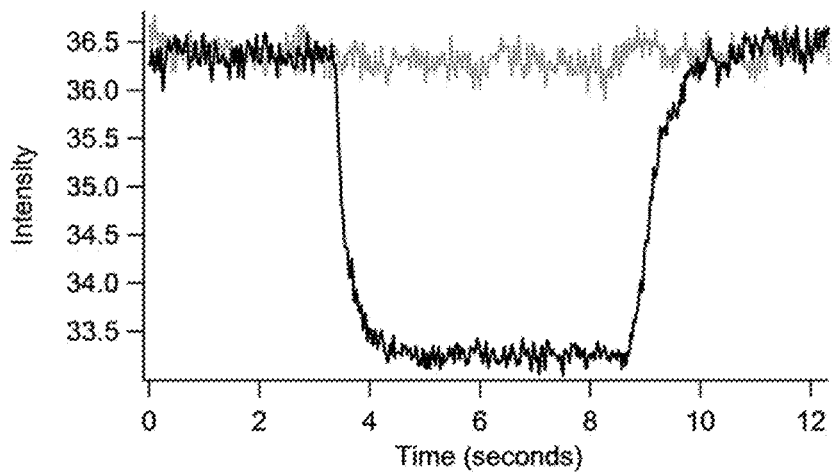
Figure 65:
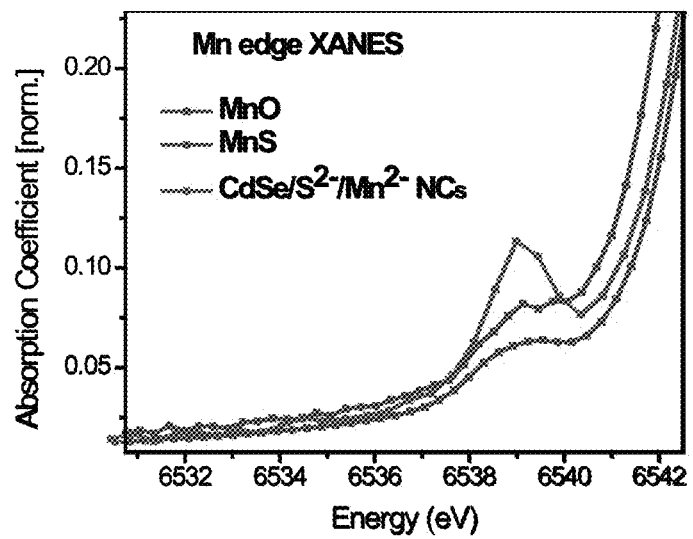
Figure 66:
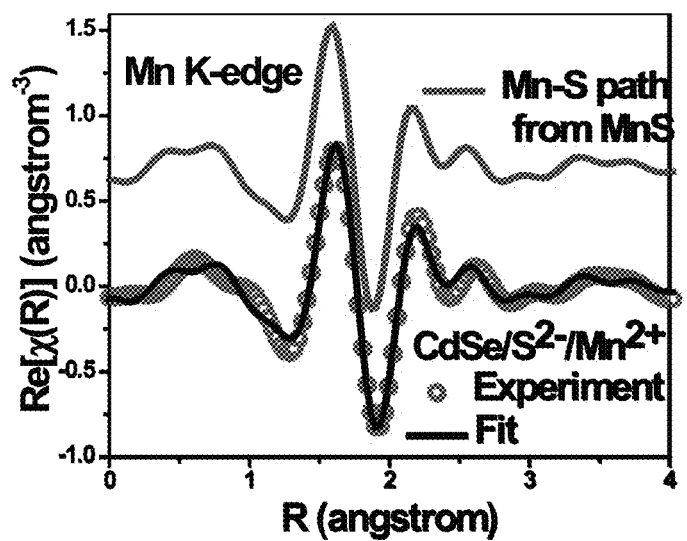
Figure 67:
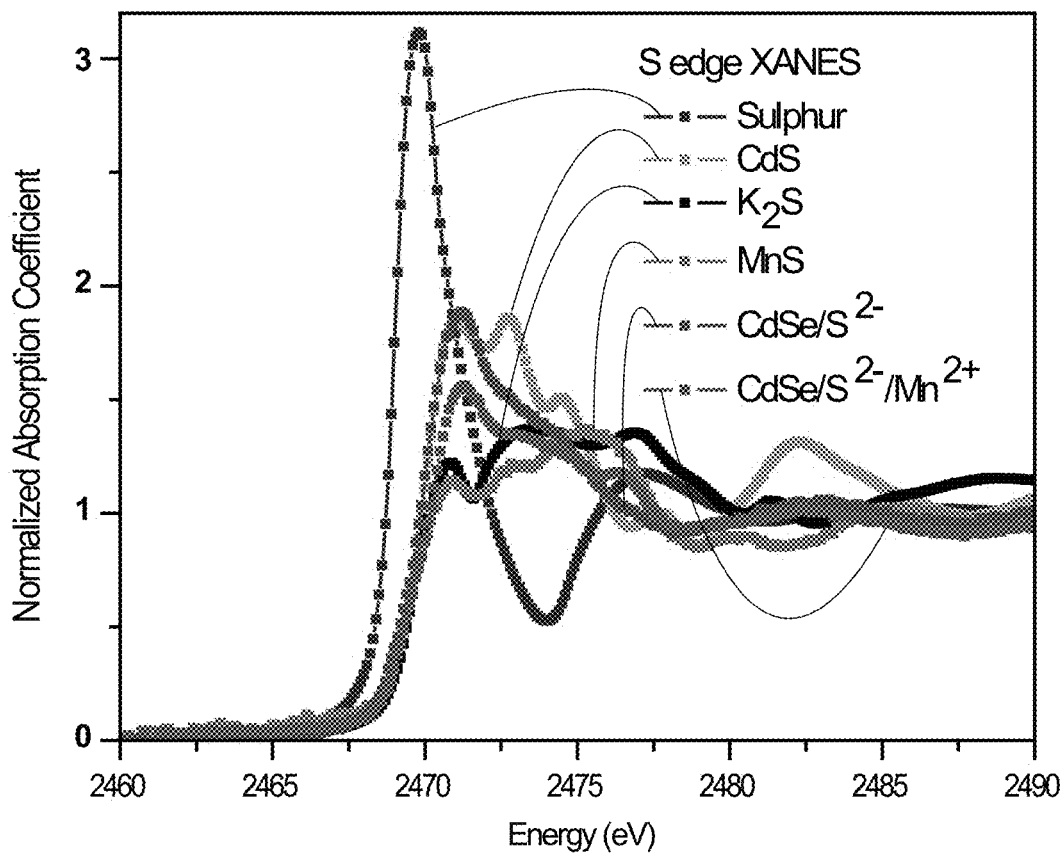
Figure 68:
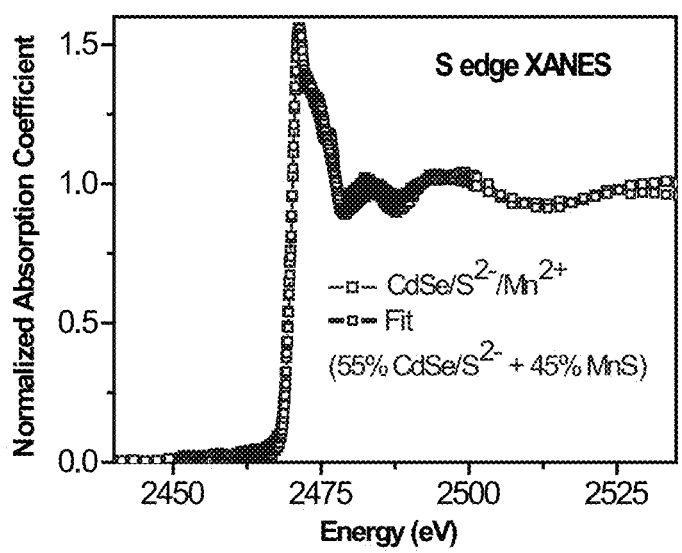
Figure 69:
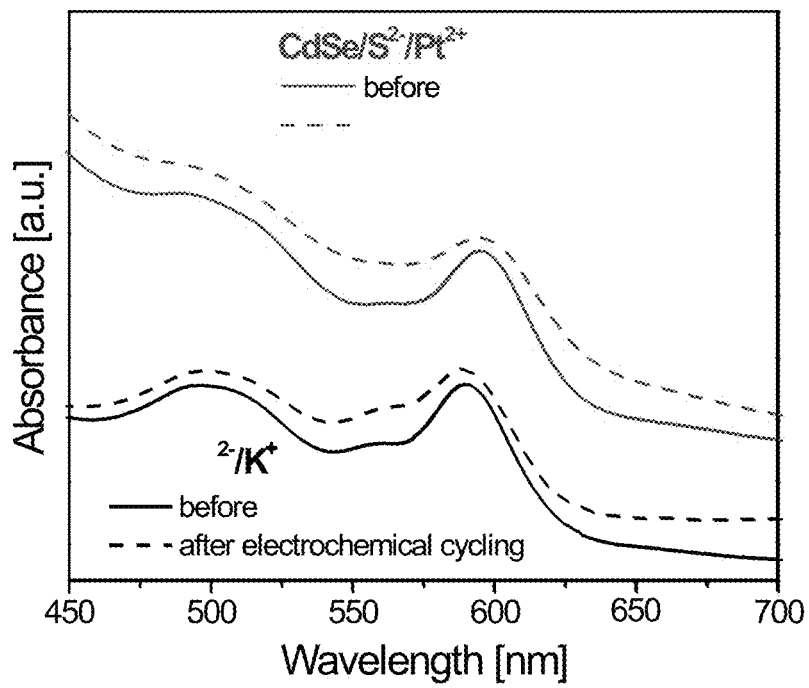
Figure 70:
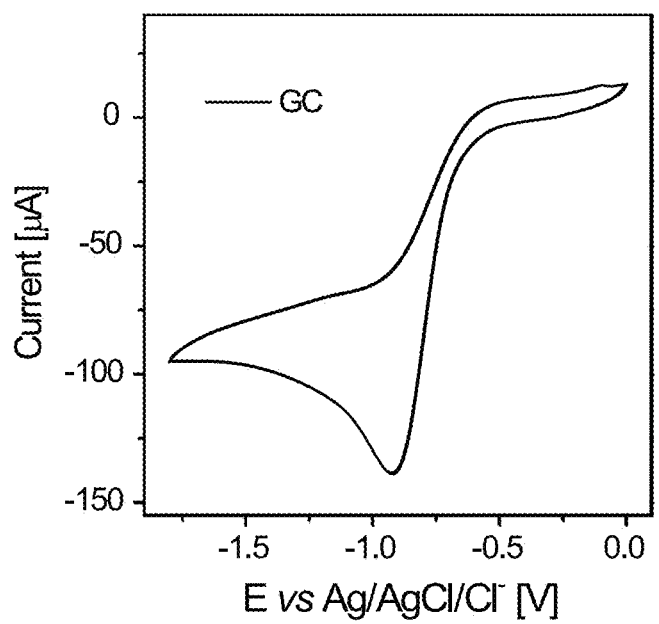

FIG. 29C shows a TEM image of CdSe-10SCd;

FIG. 30A shows Absorption spectra of CdSe(nanoplatelets absorbing at 462 nm)/xSCd, all the spectra have been done at the same concentration;

FIG. 30B shows variation of the first excitonic peak absorption wavelength, wavelength of photoluminescence maximum and the FWHM in function of the thickness of the shell;

FIG. 30C is a picture of the aliquots CdSe/SCd;

FIG. 31 shows absorption spectra of CdS-xSZn doped with manganese in the third layer for x=1 ... 6 and emission spectrum of CdS-6SZn:Mn showing the phsophorescence coming from $Mn^{2+}$;

FIG. 32A shows Ligand exchange of TOP capped InAs NCs with $(N_2H_4)_2(N_2H_5)_2In_2Se_4$ upon phase transfer from hexane to $N_2H_4$;

FIG. 32B shows Absorption spectra of InAs NCs capped with TOP and $(N_2H_4)_2(N_2H_5)_2In_2Se_4$ in toluene and $N_2H_4$, respectively;

FIG. 32C is a TEM image of InAs NCs capped with $(N_2H_4)_2(N_2H_5)_2In_2Se_4$;

FIG. 32D shows Absorption spectra of InP NCs capped with TOP/TOPO and $(N_2H_4)_3(N_2H_5)_4Sn_2S_6$ in toluene and $N_2H_4$, respectively;

FIG. 32E is a TEM image of InP NCs capped with $(N_2H_4)_3(N_2H_5)_4Sn_2S_6$;

FIG. 32F shows size distribution of InAs NCs measured by Dynamic Light Scattering after ligand exchange with $(N_2H_4)_2(N_2H_5)_2In_2Se_4$;

FIG. 33A shows Fourier transform infrared spectra of InAs NCs capped with TOP (red line) and $(N_2H_4)_2(N_2H_5)_2In_2Se_4$ before (green line) and after (blue line) annealing at 200° C.;

FIG. 33B shows Fourier transform infrared spectra for InP NCs capped with myristic acid (red line) and $(N_2H_4)_2(N_2H_5)_2In_2Se_4$ ligand before (green line) and after (blue line) annealing at 200° C.;

FIG. 33C shows Powder X-ray ($CuK_\alpha$ radiation) diffraction of InAs NCs capped with $(N_2H_4)_2(N_2H_5)_2In_2Se_4$ before (red line) and after (blue line) annealing at 280° C.;

FIG. 33D shows Powder X-ray ($CuK_\alpha$ radiation) diffraction of InP NCs capped with $(N_2H_4)_2(N_2H_5)_2In_2Se_4$ before (red line) and after (blue line) annealing at 280° C.;

FIG. 33E shows Thermogravimetric scans for $(N_2H_4)_2(N_2H_5)_2In_2Se_4$ (black line) and $(N_2H_4)_2(N_2H_5)_2In_2Se_4$ capped InAs NCs;

FIG. 33F shows Absorption spectra taken with an integrated sphere for thin film of $(N_2H_4)_2(N_2H_5)_2In_2Se_4$ capped InAs NCs before and after annealing at 200° C.;

FIG. 34A shows a plot of drain current ($I_D$) vs drain-source voltage ($V_{DS}$) measured at different gate voltages ($V_G$) for field-effect transistor (FETs) assembled from InAs NCs capped with $Cu_7S_4^{2-}$ where L=50 mm, W=1500 mm, 100 nm gate oxide;

FIG. 34B shows a plot of drain current ($I_D$) vs drain-source voltage ($V_{DS}$) measured at different gate voltages ($V_G$) for field-effect transistor (FETs) assembled from InAs NCs capped with $Sn_2S_6^{4-}$ where L=50 mm, W=1500 mm, 100 nm gate oxide;

FIG. 34C shows a plot of drain current ($I_D$) vs drain-source voltage ($V_{DS}$) measured at different gate voltages ($V_G$) for field-effect transistor (FETs) assembled from InAs NCs capped with $Sn_2Se_6^{4-}$ where L=50 mm, W=1500 mm, 100 nm gate oxide;

FIG. 34D shows a plot of $I_D$ vs $V_G$ at constant $V_{DS}$=2V used to calculate current modulation and linear electron mobility for FETs assembled from InAs NCs capped with $Cu_7S_4^{2-}$ where L=50 mm, W=1500 mm, 100 nm gate oxide;

FIG. 34E shows a plot of $I_D$ vs $V_G$ at constant $V_{DS}$=2V used to calculate current modulation and linear electron mobility for FETs assembled from InAs NCs capped with $Sn_2S_6^{4-}$ where L=50 mm, W=1500 mm, 100 nm gate oxide;

FIG. 34F shows a plot of $I_D$ vs $V_G$ at constant $V_{DS}$=2V used to calculate current modulation and linear electron mobility for FETs assembled from InAs NCs capped with $Sn_2Se_6^{4-}$ where L=50 mm, W=1500 mm, 100 nm gate oxide;

FIG. 35A shows photoresponse measured at a bias of 2V as a function of excitation energy in closed-packed films of InAs NC capped with $In_2Se_4^{2-}$, where L=50 μm, W=1500 μm, 100 nm gate oxide;

FIG. 35B photoresponse measured at a bias of 2V as a function of excitation energy in closed-packed films of InAs NC capped with $Cu_7S_4^{2-}$, where L=50 μm, W=1500 μm, 100 nm gate oxide;

FIG. 35C shows photoresponse measured at a bias of 2V as a function of excitation energy in closed-packed films of InAs NC capped with $Sn_2S_6^{4-}$, where L=50 μm, W=1500 μm, 100 nm gate oxide;

FIG. 35D shows Gate dependent photoresponse for the FETs assembled from colloidal InAs NCs capped with $Sn_2S_6^{4-}$, where L=50 μm, W=1500 μm, 100 nm gate oxide;

FIG. 36A shows a plot of drain current ($I_D$) vs drain-source voltage ($V_{DS}$) measured at different gate voltages ($V_G$) for the FETs assembled from colloidal InP NCs capped with $In_2Se_4^{2-}$, where L=4.5 μm, W=7800 μm, 100 nm gate oxide;

FIG. 36B shows a plot of $I_D$ vs $V_G$ at constant $V_{DS}$=30 V used to calculate current modulation and saturation mobility for FETs assembled from colloidal InP NCs capped with $In_2Se_4^{2-}$, where L=4.5 μm, W=7800 μm, 100 nm gate oxide;

FIG. 36C shows I-V curves of films of InP NCs capped with $In_2Se_4^{2-}$ as a function of excitation energy;

FIG. 36D shows Photoresponse measured at the bias of 3 V as function of excitation energy in closed-packed films of InP NC capped with $In_2Se_4^{2-}$;

FIG. 37A shows a schematic representation of surface charges for $K_2S$ capped CdSe NCs, before treatment with strongly binding metal ions $M^{n+}$;

FIG. 37B shows a schematic representation of surface charges for $K_2S$ capped CdSe NCs after treatment with strongly binding metal ions $M^{n+}$, where the variations of ζ-potential of $K_2S$ capped CdSe NCs in formamide in presence of 5 mM various metal ions, and the inset showing the variation of ζ-potential in the $Mg^{2+}$, $Ca^{2+}$, $Ba^{2+}$ series plotted against the metal ion radius relative to the ionic radius of $Cd^{2+}$;

FIG. 37C shows UV-visible absorption and PL spectra of CdSe NCs capped with $K_2S$, before and after addition of 5 mM $Cd^{2+}$ ions;

FIG. 37D shows Room temperature PL efficiency of $CdSe/S^{2-}$ NCs in the presence of different metal ions, plotted against ζ-potential;

FIG. 38A shows Photoluminescence spectra for CdSe/ZnS NCs capped with $K_2S$ in the presence of different concentrations of $Cd^{2+}$ ions;

FIG. 38B shows PL decay profiles for CdSe/ZnS NCs with different surface modifications, where the excitation wavelength was 400 nm;

FIG. 39A shows UV-visible absorption spectra for a film of CdSe NCs capped with $K_2S$ before and after treatment with $Cd^{2+}$ ions, where the measurements were carried out using an integrating sphere;

FIG. 39B shows schematics of NC linking with metal ions;

FIG. 39C shows schematics of a field-effect transistor used for studies of electronic coupling in the NC solids;

FIG. 40A generally illustrates the effect of metal ion on the electron mobility in all-inorganic NC solids, where output characteristics, $I_D$ vs. $V_{DS}$ as a function of gate voltage $V_G$ for the field-effect devices (FETs) using films of 4.2 nm CdSe NCs capped with $K_2S$ ($CdSe/S^{2-}/K^+$);

FIG. 40B illustrates the effect of metal ion on the electron mobility in all-inorganic NC solids, where output characteristics, $I_D$ vs. $V_{DS}$ as a function of gate voltage $V_G$ for the field-effect devices (FETs) using films of 4.2 nm CdSe NCs capped with $CdSe/S^{2-}$ NCs treated with $Cd^{2+}$ ions ($CdSe/S^{2-}/Cd^{2+}$);

FIG. 40C illustrates transfer characteristics, $I_D$ vs. $V_G$ at $V_{DS}$=3V for FET devices using $CdSe/S^{2-}/K^+$ and $CdSe/S^{2-}/Cd^{2+}$ NC solids, where the inset shows the turn-on gate voltage ($V_{th}$) for $CdSe/S^{2-}$ NCs treated with different cations;

FIG. 40D illustrates a plot of output characteristic;

FIG. 40 E illustrates a plot of output characteristic;

FIG. 40F illustrates a plot of transfer characteristics for FETs made of $K_2S$ capped 4.5 nm InAs NCs before (InAs/$S^{2-}/K^+$) and after (InAs/$S^{2-}/In^{3+}$) treatment with $In^{3+}$ ions;

FIG. 40G illustrates a plot showing the effect of different metal ions in the field-effect electron mobility in $CdSe/S^{2-}$ NC film;

FIG. 40H illustrates a plot showing the effect of different metal ions in the field-effect electron mobility in InAs/$S^{2-}$ NC film;

FIG. 41A generally illustrates output characteristics, $I_D$ vs. $V_{DS}$ as a function of gate voltage $V_G$ for FET devices using $K_2Te$ capped CdSe NC films ($CdTe/Te^{2-}/K^+$), where data was obtained using bottom gate/bottom source-drain FET device geometry (Ti/Au source and drain electrodes, channel length=5 μm and width=7800 μm);

FIG. 41B generally illustrates output characteristics, $I_D$ vs. $V_{DS}$ as a function of gate voltage $V_G$ for FET devices using the same films treated with $In^{3+}$ ions ($CdTe/Te^{2-}/In^{3+}$) where data was obtained using bottom gate/bottom source-drain FET device geometry (Ti/Au source and drain electrodes, channel length=5 μm and width=7800 μm);

FIG. 41C generally illustrates output characteristics, $I_D$ vs. $V_{DS}$ as a function of gate voltage $V_G$ for FET devices using the same films treated with $In^{3+}$ ions ($CdTe/Te^{2-}/In^{3+}$), where data was obtained using bottom gate/bottom source-drain FET device geometry (Ti/Au source and drain electrodes, channel length=5 μm and width=7800 μm);

FIG. 41D is a plot of the output characteristics for an n-type FET using CdTe NCs capped with $In_2Se_4^{2-}$ ions ($CdTe/In_2Se_4^{2-}$), where data was obtained using bottom gate/top source-drain FET geometry (Al electrodes, channel length=150 μm and width=1500 μm);

FIG. 41E is a plot of transfer characteristics, $I_D$ vs. $V_G$ in the saturation limit for FET devices made of $CdTe/Te^{2-}/K^+$, where data was obtained using bottom gate/bottom source-drain FET device geometry (Ti/Au source and drain electrodes, channel length=5 μm and width=7800 μm);

FIG. 41F is a plot of transfer characteristics, $I_D$ vs. $V_G$ in the saturation limit for FET devices made of $CdTe/Te^{2-}/In^{3+}$ NCs, where data was obtained using bottom gate/bottom source-drain FET device geometry (Ti/Au source and drain electrodes, channel length=5 μm and width=7800 μm);

FIG. 41G is a plot of transfer characteristics, $I_D$ vs. $V_G$ in the saturation limit for FET devices made of $CdTe/Te^{2-}/In^{3+}$ NCs, where data was obtained using bottom gate/bottom source-drain FET device geometry (Ti/Au source and drain electrodes, channel length=5 μm and width=7800 μm);

FIG. 41H is a plot of transfer characteristics, $I_D$ vs. $V_G$ in the saturation limit for FET devices made of $CdTe/In_2Se_4^{2-}$ NCs, where data were obtained using bottom gate/top source-drain FET geometry (Al electrodes, channel length=150 μm and width=1500 μm);

FIG. 42 is a plot of magnetization (M) vs field (H) plots for $K_2S$ capped CdSe NCs, before ($CdSe/S^{2-}/K^+$) and after ($CdSe/S^{2-}/Mn^{2+}$) treatment with $Mn^{2+}$ ions, where the upper-left inset shows M-H data for $CdSe/S^{2-}/Mn^{2+}$ in the low-field region, and the bottom-right inset shows ZFC and FC curves measured at 100 Oe for $CdSe/S^{2-}/Mn^{2+}$ NCs;

FIG. 43 is a plot of X-band EPR spectrum of CdSe/$S^{2-}$/$Mn^{2+}$ NCs measured at 4.6K, where the inset shows the variation of EPR signal intensity at 305.9 mT during on/off illumination cycles;

FIG. 44A is a plot of a comparison of Mn K-edge XANES spectra for $Mn^{2+}$ treated $K_2S$-capped CdSe NCs (CdSe/$S^{2-}$/$Mn^{2+}$) with standard compounds containing Mn in different oxidation states;

FIG. 44B is a plot of magnitude of the Fourier transformed Mn K-edge EXAFS data and the fit for CdSe/$S^{2-}$/$Mn^{2+}$ NCs;

FIG. 44C is a plot of a comparison of the S-edge XANES spectra for CdSe/$S^{2-}$/$K^+$ and CdSe/$S^{2-}$/$Mn^{2+}$ NCs with XANES spectra of $K_2S$ and MnS used as standards;

FIG. 45A is a schematic of CdSe/$S^{2-}$ NC surface with coordinated $Pt^{2+}$ ions showing that electrons supplied by NC can drive proton reduction;

FIG. 45B is a plot of cyclic voltammogramms measured for CdSe/$S^{2-}$/$K^+$ and CdSe/$S^{2-}$/$Pt^{2+}$ NC films in anhydrous acetonitrile in presence of 0.01 M [H(DMF)]OTf as a proton source and 0.1 M tetrabutylammonium perchlorate as an electrolyte;

FIG. 45C is a plot of cyclic voltammogramms measured for CdSe/$S^{2-}$/$K^+$ and CdSe/$S^{2-}$/$Pt^{2+}$ NC films in aqueous solution buffered at pH 6.5 with a phosphate buffer. The inset shows onsets of hydrogen reduction process for different electrodes;

FIG. 46 illustrates FTIR spectra of original 4.2 nm CdSe NCs capped with octadecylphosphonic acid (red line) and after the exchange of the organic ligands with $K_2S$ (blue line);

FIG. 47 illustrates the variation of ζ-potential of $K_2S$ capped CdSe NCs after treatment with various metal nitrates, where the concentrations of metal ions were adjusted such that the total ionic strength was 15 mM for all solutions;

FIG. 48 is a plot comparison of PL spectra of $Sn_2S_6^{4-}$ capped CdSe NCs before and after $Cd^{2+}$ treatment, where corresponding ζ-potential values are shown in figure legend;

FIG. 49 is a plot of UV-visible absorption spectra of solutions of $K_2S$ capped CdSe NCs in formamide, before and after treatment with different metal ions;

FIG. 50 is a plot of PL spectra of $K_2S$ capped CdSe/ZnS NC dispersion in FA, before and after treatment with different cations, where the PL intensity was normalized to the absorbance of colloidal solutions at the excitation wavelength (450 nm);

FIG. 51 is a schematics showing agglomeration of CdSe/$S^{2-}$ NCs due to linking of NCs by $Cd^{2+}$ ions;

FIG. 52 is a plot of powder X-ray diffraction patterns for $Cd^{2+}$ treated $S^{2-}$ capped CdSe (CdSe/$S^{2-}$/$Cd^{2+}$) NCs at room temperature and after annealing the sample at 200° C. for 30 minutes;

FIG. 53 is a plot showing transfer characteristics for the field-effect transistors with FET channel assembled from CdSe/$S^{2-}$/$K^+$ NCs (black line) and CdSe/$S^{2-}$/$Cd^{2+}$ NCs (red line). The $I_D$ vs. $V_G$ curves were measured at $V_{DS}$=3V, where channel length is 150 μm, width is 1500 μm;

FIG. 54A is a plot of output characteristics ($I_D$ vs. $V_{DS}$) as a function of gate voltage $V_G$ for FET devices made of CdSe/$S^{2-}$/$K^+$ NC solids treated with $Zn^{2+}$;

FIG. 54B is a plot of output characteristics ($I_D$ vs. $V_{DS}$) as a function of gate voltage $V_G$ for FET devices made of CdSe/$S^{2-}$/$K^+$ NC solids treated with $In^3$;

FIG. 54C is a plot of output characteristics ($I_D$ vs. $V_{DS}$) as a function of gate voltage $V_G$ for FET devices made of CdSe/$S^{2-}$/$K^+$ NC solids treated with $Mn^{2+}$;

FIG. 54D is a plot of transfer characteristics, ($I_D$ vs. $V_G$ at $V_{DS}$=3V) for FET devices made of CdSe/$S^{2-}$/$K^+$ NC solids treated with $Zn^{2+}$;

FIG. 54E is a plot of transfer characteristics, ($I_D$ vs. $V_G$ at $V_{DS}$=3V) for FET devices made of CdSe/$S^{2-}$/$K^+$ NC solids treated with $In^3$;

FIG. 54F is a plot of transfer characteristics, ($I_D$ vs. $V_G$ at $V_{DS}$=3V) for FET devices made of CdSe/$S^{2-}$/$K^+$ NC solids treated with $Mn^{2+}$;

FIG. 55A plots output characteristics ($I_D$ vs. $V_{DS}$) as a function of gate voltage $V_G$ for FET devices made of InAs $S^{2-}$/$K^+$ NC solids treated with $Cd^{2+}$ ions (InAs/$S^{2-}$/$Cd^{2+}$);

FIG. 55B plots output characteristics ($I_D$ vs. $V_{DS}$) as a function of gate voltage $V_G$ for FET devices made of InAs $S^{2-}$/$K^+$ NC solids treated with $Mn^{2+}$ ions (InAs/$S^{2-}$/$Mn^{2+}$);

FIG. 55C plot x transfer characteristics ($I_D$ vs. $V_G$ at $V_{DS}$=3V) for InAs/$S^{2-}$/$Cd^{2+}$;

FIG. 55D plots transfer characteristics ($I_D$ vs. $V_G$ at $V_{DS}$=3V) for InAs/$S^{2-}$/$Cd^{2+}$;

FIG. 56A is a plot of transfer characteristics ($I_D$ vs. $V_G$ at $V_{DS}$=3V) for $Li_2S$ capped CdSe NCs before (CdSe/$S^{2-}$/$Li^+$) and after treatment with $Cd^{2+}$ ions (CdSe/$Li_2S$/$Cd^{2+}$);

FIG. 56B is a plot of transfer characteristics at $V_{DS}$=3V for $K_2Se$ capped CdSe NC before (CdSe/$Se^{2-}$/$K^+$) and after treatment with $Cd^{2+}$ ions (CdSe/$K_2Se$/$Cd^{2+}$);

FIG. 57A is a plot of output characteristics ($I_D$ vs. $V_{DS}$);

FIG. 57B is a plot transfer characteristics ($I_D$ vs. $V_G$) for $Cd^{2+}$ treated $S^{2-}$ capped CdSe (CdSe/$S^{2-}$/$Cd^{2+}$) NC film annealed at 300° C. for 10 seconds using rapid thermal annealing;

FIG. 58 is a plot of transfer characteristics ($I_D$ vs. $V_G$ at $V_{DS}$=−30V) for $K_2Te$ capped CdTe NC using FET geometry bottom-gate and top source/drain gold electrodes;

FIG. 59A is a plot of transfer characteristics ($I_D$ vs. $V_G$) at $V_{DS}$=−30V using bottom-gated and bottom source/drain electrodes geometry (Ti/Au electrodes, channel length=5 μm, width=7800 μm) for $K_2Te$ capped CdTe NC treated with $Cd^{2+}$ ions (CdTe/$Te^{2-}$/$Cd^{2+}$);

FIG. 59B is a plot of transfer characteristics ($I_D$ vs. $V_G$) at $V_{DS}$=+30V using bottom-gated and bottom source/drain electrodes geometry (Ti/Au electrodes, channel length=5 μm, width=7800 μm) for $K_2Te$ capped CdTe NC treated with $Cd^{2+}$ ions (CdTe/$Te^{2-}$/$Cd^{2+}$);

FIG. 60A is a plot of output characteristics ($I_D$ vs. $V_{DS}$);

FIG. 60B is a plot of transfer characteristics ($I_D$ vs. $V_G$) $In_2Se_4^{2-}$ capped CdTe NCs (CdTe/$In_2Se_4^{2-}$/$N_2H_5^+$) using bottom gate/top source-drain geometry with Au source and drain electrodes;

FIG. 61 is an illustration of powder X-ray diffraction patterns for $K_2S$ capped CdSe NCs before (CdSe/$S^{2-}$/$K^+$) and after (CdSe/$S^{2-}$/$Mn^{2+}$) treatment with $Mn^{2+}$ ions;

FIG. 62A is a plot of temperature dependence of magnetic susceptibility for $Mn^{2+}$ treated $S^{2-}$ capped 4.5 nm InAs NCs (InAs/$S^{2-}$/$Mn^{2+}$), where the linear dependence is expected in $\chi_{exp}T$ vs. T coordinates if $\chi_{exp}$=C/(T−θ)+$\chi_{TIP}$, where $\chi_{exp}$ is the magnetic susceptibility measured in experiment, $\chi_{TIP}$ is temperature-independent component of the magnetic susceptibility, C is the Curie constant, θ is the Curie temperature and T>>θ;

FIG. 62B is a plot of temperature dependence of magnetic susceptibility for $Mn^{2+}$ treated $S^{2-}$ capped 4.2 nm CdSe NCs (CdSe/$S^{2-}$/$Mn^{2+}$) plotted in Curie-Weiss coordinates, where the linear dependence is expected in $\chi_{exp}T$ vs. T coordinates if $\chi_{exp}$=C/(T−θ)+$\chi_{TIP}$, where $\chi_{exp}$ is the magnetic susceptibility measured in experiment, $\chi_{TIP}$ is temperature-independent component of the magnetic susceptibility, C is the Curie constant, θ is the Curie temperature and T>>θ;

FIG. 62C is a modified Curie-Weiss plot for CdSe/$S^{2-}$/$Mn^{2+}$ NCs confirming the presence of temperature-independent paramagnetism, where the linear dependence is expected in $\chi_{exp}T$ vs. T coordinates if $\chi_{exp}=C/(T-\theta)+\chi_{TIP}$, where $\chi_{exp}$ is the magnetic susceptibility measured in experiment, $\chi_{TIP}$ is temperature-independent component of the magnetic susceptibility, C is the Curie constant, $\theta$ is the Curie temperature and $T\gg\theta$;

FIG. 63 is a plot of normalized EPR spectra of a central sextet after subtracting broad signals showing that the EPR parameters are the same for $Mn^{2+}$ treated $S^{2-}$ capped CdSe NCs (InAs/$S^{2-}$/$Mn^{2+}$) and $Mn^{2+}$ treated $S^{2-}$ capped InAs NCs (InAs/$S^{2-}$/$Mn^{2+}$), where spectra were measured at 4.6K;

FIG. 64 is a plot of variation of the EPR signal intensity at 305.9 mT during light on/off cycle, where gray and black lines were obtained after illuminating the sample with a Xe-lamp using a combination of IR-blocking filter and a long-pass filter with cutoff at 700 nm and 400 nm, respectively;

FIG. 65 is a plot comparison of Mn pre-edge (K-edge) XANES spectra for $Mn^{2+}$ treated $K_2S$-capped CdSe NCs (CdSe/$S^{2-}$/$Mn^{2+}$) with MnS and MnO bulk standard samples;

FIG. 66 is a plot of the real part of the Fourier transformed Mn K-edge EXAFS data and model fit for of $Mn^{2+}$ treated $K_2S$ capped CdSe (CdSe/$S^{2-}$/$Mn^{2+}$) NCs, the fit parameters are given in Table 2;

FIG. 67 is a comparison of S K-edge XANES for $K_2S$ capped CdSe NCs before (CdSe/$S^{2-}$/$K^+$) and after (CdSe/$S^{2-}$/$Mn^{2+}$) $Mn^{2+}$ treatment along with different standards;

FIG. 68 is a plot of the S-edge XANES for $K_2S$ capped CdSe NCs (CdSe/$S^{2-}$/$K^+$) after $Mn^{2+}$ treatment (CdSe/$S^{2-}$/$Mn^{2+}$), and a linear combination fit using XANES data for CdSe/$S^{2-}$/$K^+$ NCs and MnS;

FIG. 69 is a plot of UV-visible absorption spectra of ITO-covered glass electrodes coated with thin films of $K_2S$ capped CdSe NCs before (black) and after (blue) dipping in 0.1 M solutions of $K_2[PtCl_4]$ in FA, where spectra were taken before (solid) and after (dashed) electrochemical cycling in acetonitrile between −1.7 V and 0 V vs. $Ag^+$/Ag reference electrode at 100 mV/s;

FIG. 70 is a plot of cyclic voltammogramms measured for CdSe/$S^{2-}$/$K^+$ and CdSe/$S^{2-}$/$Pt^{2+}$ NC films in aqueous solution buffered at pH 6.5 with a phosphate buffer, where the inset shows onsets of hydrogen reduction process for different electrodes;

FIG. 71A is a plot of cyclic voltammogramms measured for bare glassy carbon (GC) electrodes before (black curve) and after (blue curve) treatment with 0.1 M $K_2PtCl_4$ solution in FA for 30 min; and FIG. 71B is a plot of cyclic voltammogramms measured for bare glassy carbon electrode (black curve) and films of TDPA-capped CdSe NCs before (blue curve) and after (red curve) treatment with 0.1M $K_2PtCl_4$ solution in FA for 30 min, where all measurements were carried out in aqueous solutions buffered at pH 6.5 with a phosphate buffer. and the potential scan rate was 100 mV/s.

Figure 72:
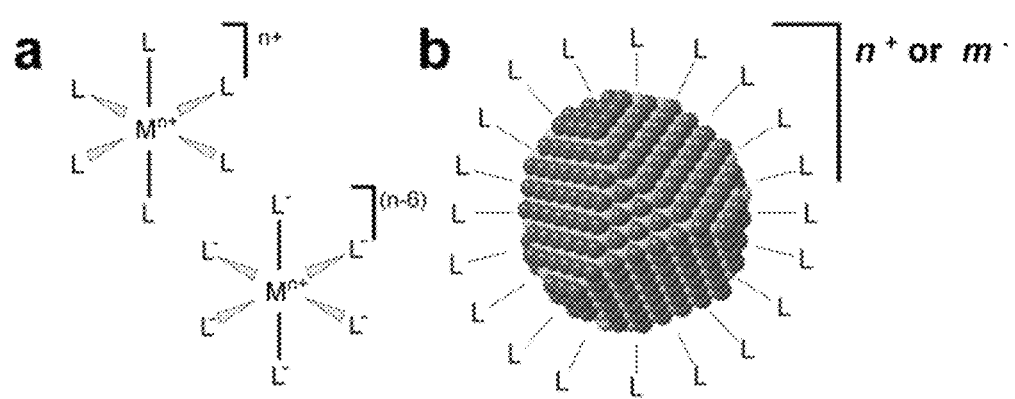

FIG. 72 shows in (a) typical metal complexes and in (b) a nanocrystal with surface ligands.

While the disclosed compositions and methods are susceptible of embodiments in various forms, there are illustrated in the drawings (and will hereafter be described) specific embodiments of the invention, with the understanding that the disclosure is intended to be illustrative, and is not intended to limit the invention to the specific embodiments described and illustrated herein.

DETAILED DESCRIPTION OF THE INVENTION

The compositions and methods described herein generally relate to a new colloidal material, a composite, made from nanometer scale particles and soluble precursors to inorganic matrices. The colloidal material can be facilely produced from single or multi-component mixtures of colloidal particles. These new colloidal materials and the general methods described herein may reduce the time, expense, and uncertainty in the manufacture of advanced materials. Disclosure of U.S. patent application Ser. No. 13/266,079 (published as U.S. Patent Application No. 2012/104325 and as International Patent Publication No. WO 10/124212) is incorporated by reference in its entirety.

Colloidal particles, from which colloidal materials can be produced, are discrete particles and are generally suspendable in at least one solvent. Often colloidal particles have sizes ranging from the nanometer scale to the micron scale and commonly exist as mixtures of colloidal particles with broad size ranges. One subset of colloidal particles are nanoparticles, specifically those colloidal particles where at least the cross-sections of the particle in two dimensions are between about 1 and about 1000 nanometers (nm). Nanoparticles can be produced in a large variety of morphologies and sizes all of which are applicable herein. Nonlimiting examples of the morphologies of nanoparticles include nanocrystals, nanorods, nanoplates, nanowires, and dendritic nanomaterials. Within each morphology there is an additional large variety of shapes available, for example nanocrystals can be produced in spheres, cubes, tetrahedra, octahedra, icosahedra, prisms, cylinders, wires, branched and hyperbranched morphologies and the like. The morphology and the size of the nanoparticles do not inhibit the general method for making colloidal materials described herein; specifically the selection of morphology and size of the nanoparticle allows for the tuning and control of the properties of the colloidal material, as will become clear.

Non-limiting examples of nanoparticles applicable herein include: AlN, AlP, AlAs, Ag, Au, Bi, $Bi_2S_3$, $Bi_2Se_3$, $Bi_2Te_3$, CdS, CdSe, CdTe, Co, Cu, Fe, FeO, $Fe_2O_3$, $Fe_3O_4$, FePt, GaN, GaP, GaAs, GaSb, GaSe, Ge, HgS, HgSe, HgTe, InN, InP, InSb, InAs, Ni, PbS, PbSe, PbTe, Pd, Pt, Ru, Rh, Si, Sn, ZnS, ZnSe, ZnTe, and mixtures thereof. Examples of applicable nanoparticles include core/shell nanoparticles like CdSe/CdS, CdSe/ZnS, InP/CdSe, InP/ZnS, InP/ZnSe, InAs/CdSe, and InAs/ZnSe; nanorods like CdSe, core/shell nanorods like CdSe/CdS; nano-tetrapods like CdTe, and core/shell nano-tetrapods like CdSe/CdS.

Often nanoparticles are synthesized in such a manner that the resulting nanoparticle is capped, or coated, in a stabilizing organic material, an organic capping agent. One typical example of an organic capping agent is trioctylphosphine oxide (TOPO), used in the manufacture of CdSe. The TOPO capping agent prevents the agglomeration of the nanoparticle during and after the synthesis of the particle, additionally the long organic chains radiating from the capping agent on the surface of the nanoparticle assist in the suspension and/or solubility of the nanoparticle in a solvent. A second type of organic capping agent is a organic thiol, often used in the manufacture of silver or gold nanoparticles. These organic thiols range from simple long chain alkane thiols, like dodecane thiol, to complex monothiols. The long organic chain of the organic thiol capping agent, as with the TOPO capping agent, assists in the suspension and/or solubility of the capped nanoparticle. Other known capping agents include long-chain aliphatic amines, long-chain aliphatic phosphines, long-chain aliphatic carboxylic acids, long-chain aliphatic phosphonic acids and mixtures thereof.

The present disclosure provides techniques for replacement of the organic capping agents with inorganic capping agents. As used herein, inorganic capping agents refer to those soluble reagents free of organic functionality that displace organic capping agents from nanoparticles and wherein the inorganic capped nanoparticle is dispersible, that is suspendable and/or soluble. One aspect of the technique for replacing the organic capping agents with inorganic capping agents is the complete displacement of the organic capping agents from the nanoparticle and replacement with the inorganic capping agent.

Inorganic capping agents can be neutral or ionic, and can be discrete species, linear or branched chains, or two-dimensional sheets. Ionic inorganic capping agents are commonly referred to as salts, a pairing of a cation and an anion, and the portion of the salt specifically referred to as an inorganic capping agent is the ion that displaces the organic capping agent and caps the nanoparticle. Often an inorganic ion is paired with an ion that has organic functionality; the paired ion that does not displace organic capping agents is referred to herein as a counter ion. The counter ion can affect the solubility and reactivity of the inorganic capping agent as well as the inorganic capped nanomaterial but the great variability of counter ions allows for their facile replacement and a balance of desired properties.

Inorganic capped nanoparticles differ from core/shell nanoparticles. Core/shell nanoparticles are those particles where, often, one nanocrystal is subjected to a treatment with a reagent such that a crystalline layer forms over all or a portion of the original nanocrystal. Core/shell nanoparticles are commonly designated through the simple formula of (core composition)/(shell composition), for example CdSe/CdS has a CdSe core and a CdS shell. The crystalline layer, the shell, generally forms over the entire nanocrystal but as used herein core/shell nanoparticles refers to those nanoparticles where at least one surface of the nanocrystal is coated with a crystalline layer. While the inorganic capping agents may form ordered arrays on the surface of a nanocrystal these arrays differ from a core/shell crystalline layer because the thickness of the array is dependent on the size of the inorganic capping agent not the concentration of reagent provided or the growth time of the layer, because, without being bound by theory, the ordering of the inorganic capping agent array on the nanocrystal is believed to be dependent on the exposed crystal face of the nanocrystal not the crystal structure of the crystalline (shell) layer, and because the interaction with the face of the nanocrystal is independent of the crystal structure of the crystalline (shell) layer there is no crystal structure mismatch between the inorganic capping agent and the crystal faces of the nanocrystal.

The disclosed colloidal particles, e.g. inorganic capped nanoparticles, are soluble and/or suspendable in a solvent. Typically, the purification of chemicals requires some isolation procedure and for inorganic materials this procedure is often the precipitation of the inorganic product. The precipitation of inorganic products permits one of ordinary skill to wash the inorganic product of impurities and/or unreacted materials. The isolation of the precipitated inorganic products then allows for the selective application of those materials.

Moreover, the disclosed colloidal particles are isolable and dispersible, soluble or suspendable, in a variety of solvents. Manufacturing techniques, environmental and/or work-place rules often require the application of certain solvents. Colloidal materials dispersible in a variety of solvents are applicable for a broader use than those colloidal materials that require specific, toxic, environmentally hazardous, or costly solvents.

Solvents applicable to the isolation of the disclosed colloidal particles include but are not limited to: 1,3-butanediol, acetonitrile, ammonia, benzonitrile, butanol, dimethylacetamide, dimethylamine, dimethylethylenediamine, dimethylformamide, dimethylsulfoxide, dioxane, ethanol, ethanolamine, ethylenediamine, ethyleneglycol, formamide, glycerol, methanol, methoxyethanol, methylamine, methylformamide, methylpyrrolidinone, pyridine, tetramethylethylenediamine, triethylamine, trimethylamine, trimethylethylenediamine, and water.

The above-described colloidal particles are made by mixing the nanoparticle with the inorganic capping agent in accordance with the techniques described herein. Often the mixing of the nanoparticle with the inorganic capping agent causes a reaction of the nanoparticle with the inorganic capping agent and rapidly produces insoluble and intractable materials. Herein a mixture of immiscible solvents is used to control the reaction of the nanoparticle with the inorganic capping agent. Immiscible solvents facilitate a rapid and complete exchange of the organic capping agents with the inorganic capping agents and prevent the production of the common intractable/insoluble materials.

Generally, the inorganic capping agent is dissolved in a polar solvent while the nanoparticle is dissolved in an immiscible, generally non-polar, solvent. These two solutions are then combined in a single vessel. Non-limiting examples of polar solvents include 1,3-butanediol, acetonitrile, ammonia, benzonitrile, butanol, dimethylacetamide, dimethylamine, dimethylethylenediamine, dimethylformamide, dimethylsulfoxide, dioxane, ethanol, ethanolamine, ethylenediamine, ethyleneglycol, formamide, glycerol, methanol, methoxyethanol, methylamine, methylformamide, methylpyrrolidinone, pyridine, tetramethylethylenediamine, triethylamine, trimethylamine, trimethylethylenediamine, water, and mixtures thereof. Non-limiting examples of non-polar solvents include pentane, pentanes, cyclopentane, hexane, hexanes, cyclohexane, heptane, octane, nonane, decane, dodecane, hexadecane, benzene, 2,2,4-trimethylpentane, toluene, petroleum ether, ethyl acetate, diisopropyl ether, diethyl ether, carbon tetrachloride, carbon disulfide, and mixtures thereof; provided that the non-polar solvent is immiscible with the polar solvent. Other immiscible solvent systems that are applicable include aqueous-fluorous, organic-fluorous, and those using ionic liquids.

Without wishing to be bound by theory, it is thought that the nanoparticle reacts with the inorganic capping agent at or near the solvent boundary, the region where the two solvents meet, and a portion of the organic capping agent is exchanged/replaced with the inorganic capping agent, that is the inorganic capping agent displaces an organic capping agent from a surface of the nanoparticle and the inorganic capping agent binds to the surface of the nanoparticle. Without wishing to be bound by theory, it is thought that this process continues until an equilibrium is established between the inorganic capping agent on a nanoparticle and the free inorganic capping agent. Preferably, the equilibrium favors the inorganic capping agent on a nanoparticle, although other equilibria are applicable for making mixed colloidal particles. The herein described immiscible solvent method of forming nanoparticles capped with inorganic capping agents has the added benefit of providing for the extraction of the organic capping agents from the polar-solvent-soluble reaction product.

The sequential addition of inorganic capping agents on a nanoparticle is available under the disclosed method. Depending, for example, upon concentration, nucleophilicity, capping agent to nanoparticle bond strength, and crystal face dependent capping agent to nanoparticle bond strength, the inorganic capping of the nanoparticle can be manipulated to yield hereto unknown combinations. For example, assume that a nanoparticle has two faces, face A and face B, and that the bond strength of the organic capping agent to face A is twice that of the bond strength to face B. The organic capping agents on face B will be preferentially exchanged when employing the herein described methodology. Isolation and reaction of this intermediate species, having organic and inorganic capping agents, with a second inorganic capping agent will produce a colloidal particle with a first inorganic capping agent on face B and a second inorganic capping agent on face A. Alternatively, the preferential binding of inorganic capping agents to specific nanoparticle faces can yield the same result from a single mixture of multiple inorganic capping agents.

Another aspect of the disclosed method is the possibility of a chemical reactivity between inorganic capping agents. This inorganic capping agent reactivity can be employed to make colloidal particles wherein, for example, the nanoparticle is capped by an inorganic capping agent. For example, a first inorganic capping agent bound to the surface of a nanocrystal and reactive with a second inorganic capping agent can directionally react with the second inorganic capping agent. This methodology provides for the synthesis of colloidal particles that could not be selectively made from a solution of nanoparticle and inorganic capping agents. The interaction of the first inorganic capping agent with the nanoparticle controls both the direction and scope of the reactivity of the first inorganic capping agent with the second inorganic capping agent. Furthermore, this methodology controls what part of the new inorganic capping agent binds to the nanocrystal. Presumably, the result of the addition of a combined-inorganic capping agent capping to a nanocrystal by other methods will produce a random arrangement of the combined-inorganic capping agent on the nanocrystal.

Yet another method of making colloidal particles involves the mixing of a nanoparticle in a non-polar organic solvent with a purified colloidal particle in a polar organic solvent. In this example, the colloidal particle in the polar solvent is the inorganic capping agent. These methodologies can form colloidal particle capped nanoparticles and other variations on the capping architecture.

Still another aspect of the current disclosure is the bridging of colloidal particles with metal ions. Herein bridging means that one or more metal ions individually bind, ionically or covalently, binding sites on the exterior of a plurality of colloidal particles. Preferably, binding sites are parts of the inorganic capping agent that is disposed perpendicular to a surface on the nanoparticle. Understanding that the bridging between two colloidal particles can involve a plurality of metal ions, for descriptive purposes the binding of a single metal ion between two colloidal particles is exemplified herein. As described above, inorganic capping agents include anionic and neutral capping agents, when for example, anionic inorganic capping agents are bound to the surface of a nanoparticle the anionic charge associated with the inorganic capping agent remains (providing a theoretical basis for electrostatic repulsion between colloidal particles having anionic inorganic capping agents). The addition of a cationic ion, preferably a cationic metal ion, still more preferably a polycationic (wherein the charge on the metal ion is greater than 1) metal ion to the colloidal particle can produce a colloidal particle with the cationic ion bound to a surface of the colloidal particle (herein, an inorganic capping agent). Preferably, the cationic ion additionally binds to the surface of a second colloidal particle thereby bridging between the two colloidal particles. Preferably, the cationic ion is a transition metal ion, a main group ion, a lanthanide ion, or an actinide ion. More preferably, the cationic ion is selected from those ions that can impart advanced electronic, magnetic (e.g., $Mn^{2+}$, $Co^{2+}$), or photophysical properties on the bridged colloidal particles. Still more preferably the cation ion is $Pt^{2+}$, $Zn^{2+}$, $Cd^{2+}$, $Mn^{2+}$, $Mn^{3+}$, $Eu^{2+}$, $Fe^{2+}$, $Fe^{3+}$, $Co^{2+}$, $Ge^{4+}$, $Cu^{2+}$, $Cu^+$, $Pb^{2+}$, $Bi^{3+}$, $Sb^{3+}$, $In^{3+}$, $Ga^{3+}$, $Au^+$, $Au^{3+}$, $Ag^+$, $Sn^{2+}$, $Sn^{4+}$, or $Hg^{2+}$. When the addition of the cationic ion to the colloidal particle is conducted on a scale wherein there is a multiplicity of colloidal particles, the binding and bridging of the colloidal particles is termed a polycondensation reaction. Herein, a controlled polycondensation reaction yields colloidal materials. Moreover, the selection of cationic ion and polycondensation reaction conditions allows for control of the three-dimensional structure of the colloidal material. Without being bound by theory, these polycondensation reactions are envisioned as behaving analogously to molecular self-assembled three-dimensional arrays.

Another aspect of the current disclosure is the isolation of the colloidal particles as colloidal materials. As used herein, colloidal materials are samples of the herein described colloidal particle in a solid form. The form can be ordered or disordered. The nanoparticle may have a crystalline, that is, ordered internal structure but the precipitation of the colloidal particles may produce a random (disordered) arrangement of particles. Alternatively, the controlled dissolution or spontaneous self-assembly of the colloidal particles can yield ordered arrays of particles.

The careful deposition of thin layers of colloidal arrays yields ordered arrays dependent on the possible packing of the colloidal particle in three dimensional space. As non-limiting examples, the deposition of colloidal particles of nanocrystals that are roughly spherical has yielded hexagonal close-packed arrays of colloidal particles or cubic close-packed arrays of colloidal particles. Such selective deposition of colloidal particles has advanced materials applications for which the selection of the nanoparticle and the ordering of the three dimensional array can change the physical and electronic characteristics of the material.

The deposition of layers of the colloidal particles to make colloidal material thin films is another aspect of the current disclosure. Depending on the desired application or the available resources, multiple film deposition methodologies are available. One method that is applicable to form colloidal material thin films is a reverse Langmuir-Blodgett technique. Herein the insolubility of the colloidal particle in nonpolar solvents permits the monolayer deposition of films of the colloidal particle on a substrate. Multiple application of the Langmuir-Blodgett technique can be employed to grow multilayer films of the colloidal particle or mixed layer films of colloidal particles.

A second applicable technique for the deposition of layers of the colloidal particles to make colloidal material thin films is spin coating. Here a solution of the colloidal particle is applied to a substrate and the substrate and solution are rapidly rotated to leave a thin layer of the solution on the substrate, this solution is then dried leaving the colloidal material thin film. Herein, the use of multiple solvents described above provide a hereto before unknown control in the manufacture of these films. The wetting of the substrate by the colloidal particle solution is an important factor in achieving uniform thin films and the ability to apply the colloidal particle in a variety of different solvents enhances the commercial applicability of this technique. One method to achieve uniform wetting of the substrate surface is to match the surface free energy of the substrate with the surface tension of the liquid (colloidal particle solution). The perfect wetting of a substrate by a colloidal particle solution will yield a uniform colloidal material thin film on the substrate.

Additional techniques for the deposition of layers of the colloidal particles to make colloidal material thin films include spray coating, spray pyrolysis, dipping, sputtering, printing, and the like and combinations of spray coating, spray pyrolysis dipping, sputtering, printing and the like with spin coating.

Colloidal material can additionally be produced through a combination of one of the above processes with the bridging of the colloidal particles with cationic ions. One example of this combination method is the alternating dipping of a substrate into a solution of colloidal particles and a solution of cationic ions. Preferably, the substrate has a sufficient affinity for the first material, whether colloidal particles or cationic ions, that a layer of the first material uniformly deposits on the surface of the substrate. Examples of substrates wherein the colloidal particle would be the first material include but are not limited to mono or multilayers of copper, silver, gold, nickel, palladium, platinum, alloys, and amalgams thereof. Moreover, when a colloidal particle has sulfur, selenium, and or tellurium atoms on the exposed surface (the outermost surface of the colloidal particle) thiophilic substrates are preferentially employed. Herein, thiophilic means having a thermodynamic preference for binding to sulfur, selenium, and/or tellurium. Examples of thiophilic substrates include monolayers, multilayers, or bulk amounts of silver, gold, and other known thiophilic substrates. Another preferred substrate applicable when the first material is a colloidal particle is a positively charged substrate. Substrates made from glass, sapphire, quartz, silicon, or other solid materials can be manipulated to have a positive charge through many known methods. For example, the chemical treatment of a substrate with an amine functionalized siloxane can produce a positively charged surface on the substrate. Alternatively, the substrate can be coated with a cationic polymer through any of the known methods for forming polymer coatings on substrates. Examples of polymers applicable to coat substrates to form the positive charged substrate include the known polyquaternium polymers. One of the preferred cationic polymers is poly(diallyldimethylammonium) chloride (polyquaternium-6 (CAS #: 26062-79-3)). A typical procedure for this alternating dip coating process is to repetitively, dip the substrate in a first solution, rinse the substrate, dip the substrate in a second solution, and rinse the substrate. Typically, as described above, the substrate prior to any dipping preferentially binds the colloidal particle thereby the first solution is a solution having the colloidal particle dispersed therein. Additional combination procedures are available, for example first spin coating a substrate with a solution of a colloidal particle then dipping the substrate in a solution of a cationic ion and then repeating.

Another technique wherein the ability to select the solvent in which the colloidal material is dissolved and from which it is deposited is ink-jet deposition. Similar to the necessary balance in the wetting of a substrate, ink-jet deposition often requires the ability to adjust liquid surface tensions to applicable ranges. One easy method for adjusting the surface tension of a liquid containing colloidal particles is the blending or mixing of a multiplicity of solvents.

Yet another application of the present disclosure is the deposition of colloidal particles to make non-thin film solids. Herein, the described colloidal particles are deposited by bulk techniques to yield three dimensional solids. Known bulk deposition techniques include pressing of powders, growth of three-dimensional ordered arrays, painting, printing, and the like.

Still another aspect of the techniques described above for the production or deposition of colloidal materials is the production or deposition of mixed, colloidal particle, solids. These hetero-colloidal materials comprise a plurality of colloidal particles in the resulting solid material. Similar to the disclosure above, multiple techniques can be used to produce hetero-colloidal materials. Non-limiting examples include, mixing of colloidal particles in a solvent followed by deposition of a hetero-colloidal material, alternating deposition of colloidal material films to produce a layered hetero-colloidal material, multispray coating of a substrate, and blending of colloidal material solids followed by pressing into a cohesive material.

One example of the hetero-colloidal materials described herein is a binary superlattice. Binary superlattices are those organized structures wherein the three-dimensional packing of two different nanoparticles produces an ordered structure. Multiple physical and chemical characteristics can facilitate the production of binary superlattices, for example, nanoparticle size, nanoparticle shape, and nanoparticle Coulombic potential. This assembly of two different colloidal particles into a binary superlattice is a general and inexpensive method to produce multiple hetero-colloidal materials with precise control of the chemical composition and physical properties. D. V. Talapin, et al., "Dipole-dipole interactions in nanoparticle superlattices." *Nano Letters* 2007, 7, 1213-1219.

Yet another aspect of the current disclosure is the thermal treatment of the herein described colloidal materials. As discussed above, many of the inorganic capping agents are precursors to inorganic materials (matrices) and low-temperature thermal treatment of these inorganic capping agents provides a gentle method to produce crystalline films from these materials. The thermal treatment of colloidal materials yields, for example, ordered arrays of nanoparticles within an inorganic matrix, hetero-alloys, or alloys. A multiplicity of thermally treated colloidal materials are available from the disclosed colloidal particles.

As used herein, colloidal matrices are ordered arrays of nanoparticles within an inorganic matrix. Generally, the inorganic matrix has larger crystal domains than the nanoparticles and, importantly, separates the nanoparticles. The inorganic matrix can be a glass, a solid, or a crystalline material. Additionally, the order of the array of nanoparticles can be short range or long range. Very dilute samples of nanoparticles in the inorganic matrix are expected to have lower relative ordering than concentrated samples wherein the nanoparticles may be ordered prior to and preferably after the formation of the inorganic matrix.

Additional embodiments of the hetero-colloidal matrix include selective deposition of colloidal materials in confined spatial arrangements followed by thermal treatment to form the inorganic matrix. The layered, structured, or patterned deposition of a plurality of colloidal materials followed by thermal treatment to form the inorganic matrix creates solid-state architecture that is not available by other known methodologies.

The colloidal matrices can be produced in thin films, films, coatings, solids and/or mixed solids. Moreover, the colloidal matrices can be produced in bulk, layered, structured, or patterned arrangements on a substrate. Additionally, the procedure described herein yields colloidal matrices that effectively preserve the electronic characteristics of the nanoparticle after thermal treatment.

Another embodiment of the materials and methods disclosed herein is an alloy made from a nanoparticle and an inorganic capping agent. Alloys are continuous homogeneous phases of a composition and herein alloys are produced by the thermal treatment of the disclosed colloidal particles. Similar to the colloidal matrices, the formulation of the alloy is dependent on the nanoparticle and inorganic capping agent. Unlike the colloidal matrices, the formation of the alloy involves the destructive reaction of the inorganic capping agent, and/or optionally additional reagent(s), with the nanoparticle, herein a destructive reaction means the nanoparticle loses at least one aspect of its defining physical characteristic, examples include size, shape, photoactivity, formulation, and the like.

Generally, the formation of an alloy requires some atom mobility during the thermal treatment phase and processing conditions can and often do affect the formation of an alloy. The incomplete alloying of the disclosed materials, whether purposefully or serendipitously, yields a hetero-alloy. As used herein, hetero-alloys are solid state materials formed from the thermal treatment of a colloidal material that is characterized by a multiplicity of domains, wherein the domains may have different formulations and/or crystal structures and/or crystallinity. Whether a thermal treatment of a colloidal material forms an alloy or a hetero-alloy is often difficult to determine, but, without being bound by theory, it is believed that a lower temperature thermal treatment limits atom mobility and therefore prohibits the formation of a homogeneous phase (alloy).

Yet another embodiment of the materials and methods disclosed herein is the deposition of colloidal matrices, alloys, or hetero-alloys on a surface to form an advanced material, a printed circuit, a solar cell, a thermoelectric cell, a light emitting diode, and the like. The colloidal materials disclosed herein are applicable for the printing or deposition of colloidal matrices, alloys, or hetero-alloys through the application and heating of the colloidal material on a substrate. Representative examples of the application of the disclosed colloidal materials include sputter deposition, electrostatic deposition, spray deposition, spin coating, inkjet deposition, laser printing (matrices), and the like. An alternative method of deposition is the electrochemical deposition of a colloidal matrix from a solution of a colloidal material.

The low temperature formation of the colloidal matrix, alloy, or hetero-alloy makes the disclosed methodology compatible with photolithographic patterning, for example, wherein a photolithographic applied substrate mask is removed after the thermal treatment of the colloidal material.

Another aspect of the disclosed materials and methods is the formation of materials that exhibit enhanced thermoelectric properties; that is the direct conversion of a thermal gradient to electrical energy. Thermoelectric energy conversion is an all-solid-state effect that converts thermal gradients directly to electrical energy without an electromechanical generator. The derived voltage and power, work, drains the heat from the location of the thermal gradient. Materials that display thermoelectric energy conversion are useful in heat pumps, power generators, and thermoelectric coolers.

Thermoelectric devices have no moving parts and therefore have advantages in reliability, silent operation, high power density, and high efficiency for moderate power applications. In addition, thermoelectric materials can be used for cooling by driving current through the material.

The NC can be capped with an inorganic ligand. Contemplated inorganic ligands include oxo- and polyoxometalates (POMs). POMs are heavily charged anions that can accept one or more electrons without significant structural changes. The delocalization of these electrons within the POM framework makes them candidates in catalysis or related applications. Unlike some other inorganic ligands, most of the oxo-ligands do not replace the surface organic ligands directly. A two-step ligand exchange procedure was used, including the removal of original organic ligands followed by the adsorption of negatively charged inorganic ligands.

In some exemplary embodiments, metal oxide $Fe_2O_3$ NCs and semiconductor CdSe NCs were used as standard systems. POMs of early transition metals molybdenum or tungsten are specifically contemplated, as are Keggin type and Dawson type POMs. Most Keggin type POMs $[X^{n+}M_{12}O_{40}]^{(8-n)-}$ are commercially available (X=P, Si; M=Mo, W). Dawson type POMs $[(X^{n+})_2M_{18}O_{62}]^{(16-2n)-}$, polymolybdate giant wheels $\{Mo_{11}\}_{14}$ and known water oxidation catalyst $Rb_8K_2[\{Ru_4O_4(OH)_2(H_2O)_4\}(\gamma\text{-}SiW_{10}O_{36})_2]$ $25H_2O$ were prepared following literature protocols. (Graham et al., *Inorg. Chem.*, 2008, 47: 3679-3686; Geletii et al., *Angew. Chem.*, 2008, 120: 3960-3963; and Rosen et al., *Angew. Chem. Int. Ed.*, 51:684-689) Simple oxo-molecules were also explored such as $VO_4^{3-}$, $MoO_4^{2-}$, $WO_4^{2-}$, $PO_4^{3-}$, $AsO_4^{3-}$, $HPO_3^{2-}$, $H_2PO_2$, and the like.

Figure 1A:
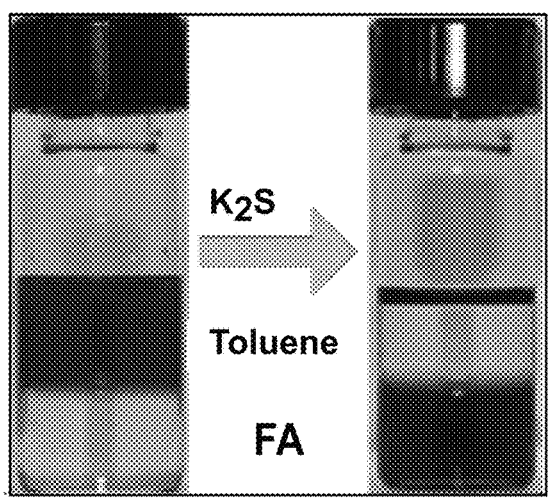
FIG. 1A illustrates a red colored colloidal dispersion of CdSe NCs undergoes the phase transfer from toluene to FA upon exchange of the original organic surface ligands with $S^{2-}$.

For a typical ligand exchange, a solution of organic-capped NCs in a nonpolar solvent (toluene or hexane) were combined with a solution of an inorganic ligand ($K_2S$, KHS, $(NH_4)_2TeS_3$, KOH, $KNH_2$, etc) in formamide (FA). The two-phase mixture containing immiscible layers of FA and nonpolar solvent was stirred for about 10 min, after which complete transfer of NCs from non-polar solvent to FA (FIG. 1a) was observed. Such exchange can be carried out in different solvents, ruling out a special role of FA in colloidal stabilization. For example, $S^{2-}$-capped CdSe NCs can be easily prepared using $(NH_4)_2S$ aqueous medium or $Na_2S$ and $K_2S$ in dimethylsulphoxide (DMSO). Experimental results suggested that colloidal stability of NC dispersions is mainly determined by the solvent dielectric constant; highly polar FA ($\varepsilon$=106) was found to be the best solvent, while water ($\varepsilon$=80) and DMSO ($\varepsilon$=47) provided moderate stability. DMF, the least polar in this series ($\varepsilon$=36), did not stabilize the colloidal dispersions.

In some cases, the ligand exchange can be performed in the following manner. For organic ligands removal, either phase transfer or direct ligand removal can be performed. For a typical phase transfer process, certain amount of nitrosonium tetrafluoroborate ($NOBF_4$), fluoroboric acid ($HBF_4$) or trimethyloxonium tetrafluroborate ($Me_3OBF_4$) was first dissolved in fresh dimethylformamide (DMF). NCs in fresh hexane were added on top of the DMF phase. The resulting mixture was stirred vigorously until NCs were completely transferred into DMF phase. For a direct ligand removal process, NCs were first diluted with excessive solvent such as hexane, followed by addition of nitrosonium tetrafluoroborate ($NOBF_4$), fluoroboric acid ($HBF_4$) or trimethyloxonium tetrafluroborate ($Me_3OBF_4$). The mixture was stirred vigorously until NCs were precipitated. NCs were collected and dispersed into fresh DMF.

To functionalize NCs with oxo-molecules or POMs, they were precipitated from DMF with addition of toluene or toluene/hexane mixture. Certain amount of oxo-molecules or POMs in formamide (FA) was added to NCs in FA. The stabilization of oxo-molecules or POMs capped NCs in FA was strongly depending on the pH. NCs treated with $NOBF_4$ or $HBF_4$ to remove organic ligands usually formed very acidic solution in DMF. They needed to be further purified with FA/acetonitrile to increase the pH to a value suitable for oxo-ligands adsorption. Following this approach, both CdSe and $Fe_2O_3$ NCs can be colloidally stabilized with $VO_4^{3-}$, $MoO_4^{2-}$, $WO_4^{2-}$, $PO_4^{3-}$, $AsO_4^{3-}$, $HPO_3^{2-}$, $H_2PO_2$ etc. $Fe_2O_3$ NCs can be further stabilized with POMs such as $Na_3[PMo_{12}O_{40}]$, $K_6[P_2MO_{18}O_{62}]$ etc (Table 1). Other metal oxide NCs such as ZnO, CoFeO and $TiO_2$ with some of the POMs are also contemplated (Table 1).

Different characterization techniques were used to confirm that oxo-molecules or POMs were attached to the NCs surface. Dynamic light scattering measurements showed that the size of NCs decreased from 15 nm to 13 nm after organic ligands removal and increased around 1-2 nm after capping with POMs (FIG. 22A). Zeta potential measurement showed that both CdSe and $Fe_2O_3$ NCs surface charge changed from positive to negative after oxo-ligands exchange. In aqueous or similar media, a zeta potential of ±30 mV is regarded as the borderline between stable and unstable colloids. FIG. 23B indicated that CdSe and $Fe_2O_3$ NCs capped with $PO_4^{3-}$ were stable in FA. FTIR spectra acquired for both CdSe and $Fe_2O_3$ NCs showed that the majority of the surface organic ligands were removed after $NOBF_4$ or $HBF_4$ treatment (FIG. 22C, 22D). C—H vibration coming from organics from 2500-3300 $cm^{-1}$ was strongly suppressed. TEM images of CdSe and $Fe_2O_3$ NCs capped with various oxo-ligands were taken from either FA or N-methylformamide (NFA) (FIGS. 23, 24). In NFA, the spacing between NCs was larger than that in FA possibly due to NFA molecules also acting as ligands to stabilize NCs.

TABLE 1

| Ligands | NCs | | | |
|---|---|---|---|---|
| | $Fe_2O_3$ | ZnO | CoFeO | $TiO_2$ |
| $H_3[PMo_{12}O_{40}]$ | Stable | | | Stable |
| $H_3[PW_{12}O_{40}]$ | Stable | | | Stable |
| $Na_3PMo_{12}O_{40}$ | Stable | | | Stable |
| $Na_6H_2W_{12}O_{40}$ | Stable | | | Stable |
| $H_4[SiW_{12}O_{40}]$ | Stable | | | |
| $(NH_4)_6[H_2W_{12}O_{40}]$ | Unstable | | | |
| $K_6[P_2W_{18}O_{62}]$ | Stable | Stable | Stable | Stable |
| $K_6[P_2Mo_{18}O_{62}]$ | Stable | | Stable | Stable |
| $Mo_{154}$ | Stable | | Stable | Stable |
| $Rb_8K_2[\{Ru_4O_4(OH)_2(H_2O)_4\}(\gamma\text{-}SiW_{10}O_{36})_2]$ | Stable | | | |

To further explore the ligand chemistry, simplified zeta potential titration experiments were performed to study the ligand binding process. In a typical experiment, CdSe or $Fe_2O_3$ NCs were treated with $NOBF_4$, $HBF_4$ or $Me_3OBF_4$ to remove the surface ligands resulting in stable colloidal solution in DMF (~5 mg/ml). These NCs were positively charged due to unbound metal sites on the surface such as $Cd^{2+}$ or $Fe^{3+}$. For zeta potential titration, 50 μl of positively charged NCs in DMF (5 mg/ml) was added to 1 ml of DMF or FA. Oxo-ligands stock solutions were prepared at different concentrations such as 3 mM, 5 mM, 10 mM and 15 mM. Zeta potential of the colloidal solution was measured with the addition of oxo-ligands of increasing volume. Ideally, the surface positive charge would be slowly neutralized by negatively charged oxo-ligands until the surfaces of NCs were fully passivated at which point the surface charge would be saturated (FIG. 22E).

To compare the binding capability of different ligands such as oxo-ligands and chalcogenide ligands, $K_2S_2O_3$, $Na_2MoO_4$, $(NH_4)_2MoS_4$ were selected as typical ligands for CdSe NCs. The electrophoretic mobilities were measured using Zetasizer Nano-ZS. Excessive $NaBF_4$ was added to the samples to contribute to the total ionic strength. The electrophoretic mobilities were plotted according to the ligands concentration, which indicated $S_2O_3^{2-}$, $MoS_4^{2-}$ have stronger binding affinity to CdSe NCs compared to $MoO_4^{2-}$ (FIG. 25A). The same experiments were performed on $Fe_2O_3$ NCs (15 nm) as well. $Na_3AsS_3$, $H_3[PMo_{12}O_{40}]$, $Na_2MoO_4$, $(NH_4)_2MoS_4$ were chosen as ligands. Similar results were obtained as CdSe NCs (FIG. 25B). It showed $[PMo_{12}O_{40}]^{3-}$, $MoO_4^{2-}$ binded to $Fe_2O_3$ NCs stronger than $MoS_4^{2-}$, and $AsS_3^{3-}$ which, without being bound by theory, can be explained by the hard and soft acids and bases (HSAB) principles.

From the experiments of zeta potential titration, pH was an influential parameter for $Fe_2O_3$ NCs just after treatment with either $NOBF_4$ or $HBF_4$ showed strong acidity (~1.4-1.8 in DMF) while they showed a higher pH around 3 after treatment with $Me_3OBF_4$. After washing the original solution with different solvents/non-solvents combinations, the pH increased to around 7-11, and showing a difference in zeta potential titration. The solution with a higher pH showed the ligands binding trend as expected while the same ligand did not show a strong binding capability to NCs in a less acidic solution (FIG. 26).

In the case of CdSe NCs, there was not a huge influence of pH on ligands binding capability. Possible reasons could be: pH affects the surface charge density of $Fe_2O_3$ NCs and pH affects the actual binding species existing in the solution.

Chalcogenide and Hydrochalcogenide Ligands ($S^{2-}$, $HS^-$, $Se^{2-}$, $HSe^-$, $Te^{2-}$ and $HTe^-$).

Figure 1B:
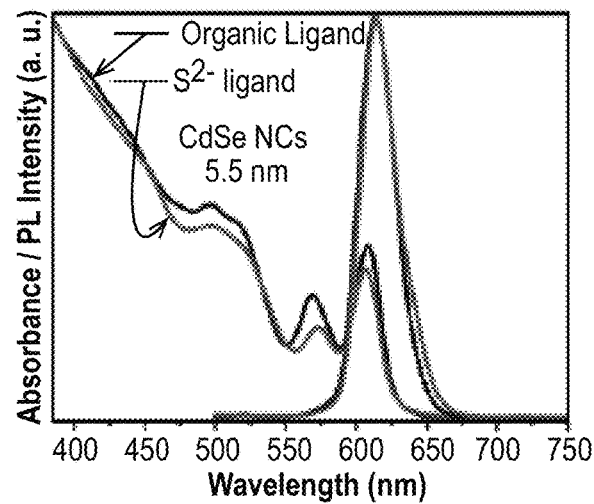
FIG. 1B illustrates Absorption and PL spectra of 5.5 nm CdSe NCs capped with organic ligands and $S^{2-}$ ligands dispersed in toluene and FA respectively.

FIG. 1B compares the absorption and photoluminescence (PL) spectra of 5.5 nm CdSe NCs capped with organic ligands in hexane and $S^{2-}$ in FA. The excitonic features in the absorption spectrum of CdSe NCs remained unchanged after the ligands exchange, implying no changes in size, shape and size-distribution of CdSe NCs. $S^{2-}$-capped CdSe NCs in FA also showed band-edge photoluminescence with ~2% QE, which was rather unexpected since alkylthiols are well-known PL quenchers for CdSe NCs. In contrast to thiols, charged $S^{2-}$ ligands do not introduce midgap states serving as fast non-radiative recombination channels. CdSe NCs capped with HS ligands also retained their band-edge PL (FIG. 7). $S^{2-}$ can replace different kinds of organic ligands such as carboxylates, amines, phosphonic acids, and alkylphosphonic oxide from surface of CdSe NCs.

Regarding FIGS. 1A-1F; (a) Red colored colloidal dispersion of CdSe NCs undergoes the phase transfer from toluene to FA upon exchange of the original organic surface ligands with $S^{2-}$. (b) Absorption and PL spectra of 5.5 nm CdSe NCs capped with organic ligands and $S^{2-}$ ligands dispersed in toluene and FA respectively. (c) FTIR spectra of 5.5 nm CdSe NCs with different combinations of ligands and solvents. (d) NC size-distributions measured by Dynamic Light Scattering for ~12 nm CdSe NCs capped with organic ligands and $S^{2-}$ ions. Inset shows TEM image of the NCs capped with $S^{2-}$ ligand. (e) TEM images of $S^{2-}$-$DDA^+$ capped CdS nanorods. (f) Absorption spectra of 5.5 nm CdSe NCs capped with different ligands.

Figure 1C:
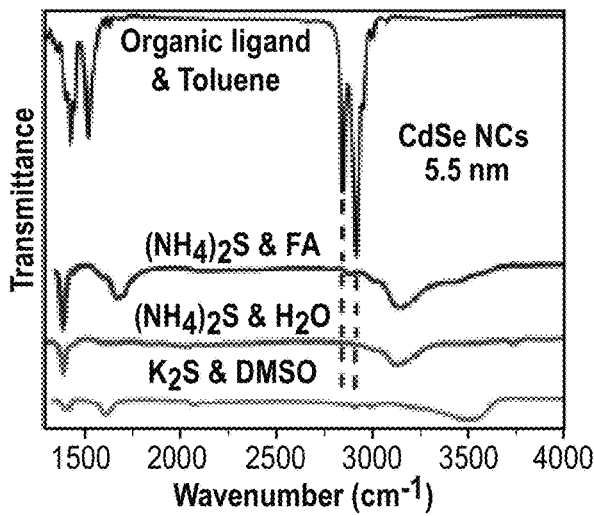
FIG. 1C illustrates FTIR spectra of 5.5 nm CdSe NCs with different combinations of ligands and solvents.
Figure 1D:
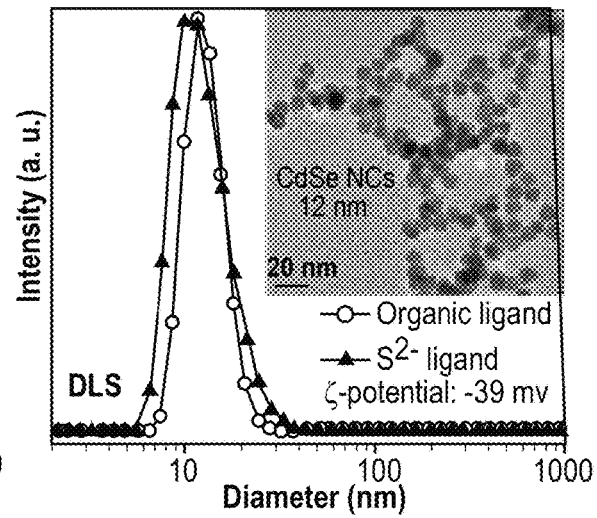
FIG. 1D illustrates NC size-distributions measured by Dynamic Light Scattering for ~12 nm CdSe NCs capped with organic ligands and $S^{2-}$ ions. Inset shows TEM image of the NCs capped with $S^{2-}$ ligand.

FIG. 1C shows FTIR spectra of 5.5 nm CdSe NCs taken before and after the exchange of organic ligands with $S^{2-}$. The transfer of NCs from toluene to FA resulted in complete disappearance of the bands at 2852 and 2925 cm$^{-1}$ corresponding to C—H stretching in the original organic ligands. Other bands in the FTIR spectra for $S^{2-}$ capped NCs can be assigned to the solvent and $(NH_4)_2S$ (FIG. 8). For example, FTIR spectra of $S^{2-}$capped CdSe NCs prepared from water dispersion showed no observable C—H bands. These results confirm the efficacy of $S^{2-}$ ligands in complete removal of the original organic ligand, forming all-inorganic colloidal NCs.

NC surface with electrophilic sites, for example, a Cd rich surface of CdSe NC, should favor adsorption of nucleophilic $S^{2-}$ ions compared to positively charged counter ions (e.g., $K^+$ or $NH_4^+$ ions). In addition, in polar solvents cations are generally more solvated than anions. Colloidal stabilization of NCs in FA was achieved through binding negatively charged $S^{2-}$ ions to NC surface, leading to the formation of an electrical double layer around each NC. The negative charging of CdSe NC surface resulted in a negative (−40 mV) ζ-potential, sufficient for electrostatic stabilization of the colloidal dispersion. Dynamic light scattering (DLS) studies also confirmed single-particle populations in the solutions of $S^{2-}$ capped CdSe NCs (FIG. 1D, for NCs with the TEM image shown in the inset). The direct comparison of the volume distribution curves calculated from DLS revealed that average hydrodynamic diameter of $S^{2-}$ capped NCs was smaller by ~1.7 nm than that of the same NCs capped with n-tetradecylphosphonic acid, which accounted for the effective length of the hydrocarbon chains.

Figure 1E:
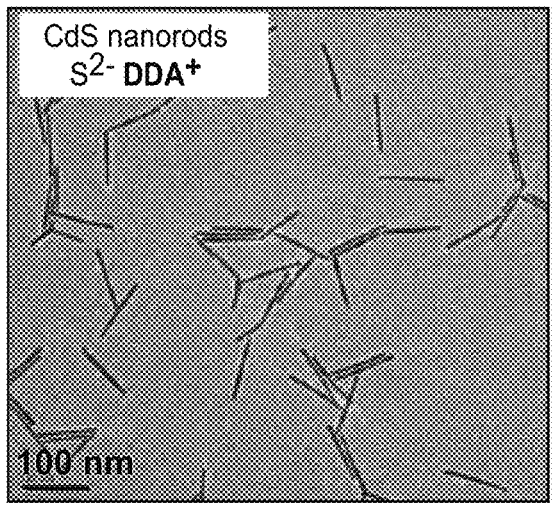
FIG. 1E illustrates TEM images of $S^{2-}$-$DDA^+$ capped CdS nanorods.

In polar solvents like FA, we used small inorganic cations like $K^+$, $Na^+$, $NH_4^+$ to balance the negative charge of anions adsorbed on the NC surface. These cations can be replaced with hydrophobic quaternary ammonium ions by treatment with didodecyldimethylammonium bromide ($DDA^+Br^-$), rendering NC insoluble in FA, but soluble in toluene. This technique was applied to $S^{2-}$ capped CdS nanorods. FIG. 1E shows a TEM image of $S^{2-}$-$DDA^+$ capped CdS nanorods. The shape and dimensions of nanorods remained intact during the transfer from toluene (ODPA-TOPO ligands) to FA ($S^{2-}$ ligands) to toluene ($S^{2-}$-$DDA^+$ ion pair ligands).

Figure 1F:
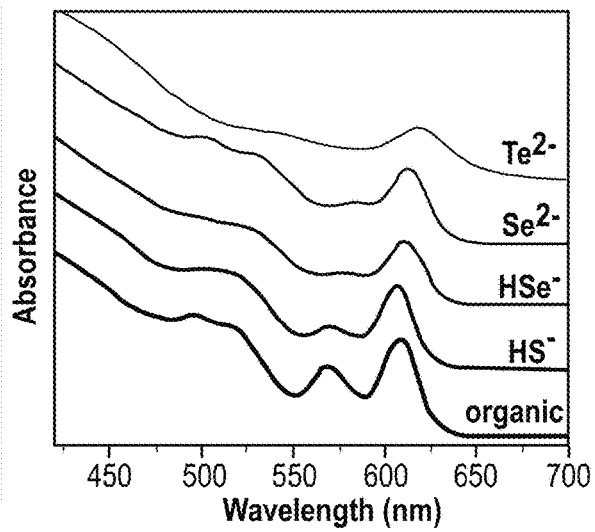
FIG. 1F illustrates Absorption spectra of 5.5 nm CdSe NCs capped with different ligands.

Stable colloidal solutions of CdSe NCs can be prepared in FA using different chalcogenide ($S^{2-}$, $Se^{2-}$ and $Te^{2-}$) and hydrochalcogenide ($HS^-$, $HSe^-$ and $HTe^-$) ions. FIG. 1F shows the absorption spectra for colloidal solutions of the same CdSe NCs stabilized with different ligands. In all cases of chalcogenide and hydrochalcogenide ligands the formation of stable colloidal solutions of negatively charged NCs was observed. It should be noted that selenide and telluride ions can be easily oxidized in air and corresponding colloidal solutions should be handled under inert atmosphere.

Chalcogenide ions can stabilize different nanomaterials in polar solvents. For example, FIG. 2A shows $S^{2-}$ capped CdSe/ZnS core-shell NCs with strong band edge PL with QE about 25%. All-inorganic films of $S^{2-}$ capped CdSe/ZnS NCs also showed bright emission, even after annealing at 250° C. for 30 min. $S^{2-}$ ligand worked well for InP NCs (FIG. 2B) providing the first example of all-inorganic colloidal III-V NCs. The absorption spectra of $S^{2-}$ capped InP NCs in FA were similar to those of the organically capped NCs in toluene. The ζ-potential of $S^{2-}$ capped InP NCs was about −60 mV. The ability of chalcogenide ions to provide colloidal stabilization was not limited to semiconductors; FIG. 2C compares the absorption spectra for spherical 7 nm Au NCs capped with dodecanethiol in toluene and with $S^{2-}$ ions in FA. A 11 nm red-shift for surface plasmon band in $S^{2-}$ capped Au NCs was observed, consistent with the difference in dielectric constants of toluene and FA. DLS studies revealed that $S^{2-}$ capped Au colloids retained size distribution after the ligands exchange (FIG. 2D), with no agglomeration for both organic and $S^{2-}$ capped NCs. The ζ-potential of $S^{2-}$ capped Au NCs was about −60 mV.

Regarding FIGS. 2A-2D; (a) Absorption and PL spectra of CdSe/ZnS core/shell NCs capped with $S^{2-}$ ligands dispersed in FA; inset shows the luminescence of NC dispersion upon illumination with 365 nm UV light. (b) Absorption spectra of InP NCs capped with organic ligands and $S^{2-}$ ligands dispersed in toluene and FA respectively. Inset shows the optical photograph of colloidal dispersion of InP NCs in FA. (c) Absorption spectra of Au NCs capped with dodecanethiol and $S^{2-}$ ligands dispersed in toluene and FA, respectively. Inset shows the optical photograph of a colloidal dispersion of Au NCs in FA. (d) DLS size-distribution plots for Au NCs capped with the organic and $S^{2-}$ ligands.

Figure 10C:
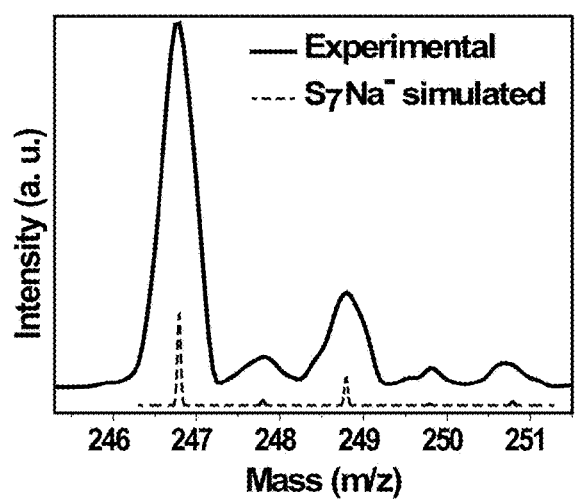

Mild oxidation of chalcogenide ions typically results in the formation of polychalcogenide ions ($S_n^{2-}$, $Se_n^{2-}$, $Te_n^{2-}$). In fact, polychalcogenides are often present as an impurity in commercial metal chalcogenide chemicals. As a simple test, aqueous sulfide solutions should be colorless whereas polysulfides absorb visible light and appear yellow to red. ESI-MS was used to identify the presence and stability of polychalcogenides in different solvents. The mass spectra of the red $Na_2S_n$ solution prepared by adding an excess of sulfur to aqueous 0.7 M $Na_2S$ solution showed the presence of polysulfides with n=5, 6, and 7 unlike to colorless $Na_2S$ solution (FIGS. 9-11). Both $(NH_4)_2S_n$ and $Na_2S_n$ solutions can stabilize colloidal NCs in polar solvents, suggesting that polysulfides behave similarly to sulfide ions.

Mixed Chalcogenide $TeS_3^{2-}$ Ligands.

Figure 3A:
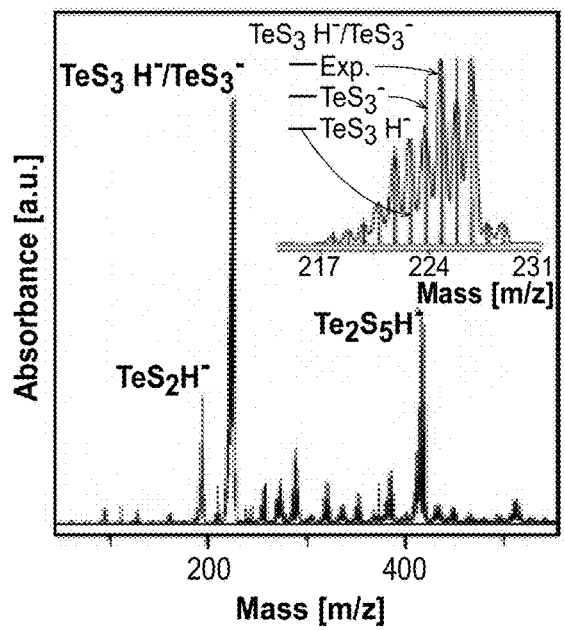
FIG. 3A illustrates ESI-MS spectrum of $(NH_4)_2TeS_3$ solution, in which the inset compares an experimental high-resolution mass-spectrum with simulated spectra for $TeS_3H^-$ and $TeS_3^-$ ions.
Figure 3B:
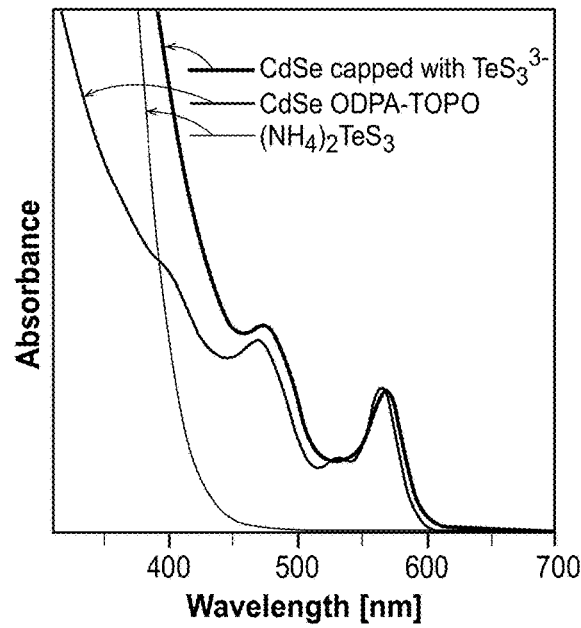
FIG. 3B illustrates Absorption spectra for $(NH_4)_2TeS_3$, for CdSe NCs capped with the organic ligands in toluene and for CdSe NCs capped with $TeS_3^{2-}$ ions in formamide.

Having molecular structure intermediate between MCCs and polychalcogenide ions, mixed chalcogenide ions such as $TeS_3^{2-}$ represent another interesting choice of metal-free ligands. For the study, light-yellow aqueous $(NH_4)_2TeS_3$ was used to stabilize colloidal CdSe NCs via ligand exchange in FA. ESI-MS spectra show that $(NH_4)_2TeS_3$ aqueous solution contains mainly $TeS_3^{2-}$ ions along with $Te_2S_5^{2-}$ (FIG. 3A). Adsorption of submonolayer amounts of Te—S ions onto the surface of 4.4 nm CdSe NCs was confirmed by elemental analysis, indicating Te-to-Cd atomic ratio 0.25. The atomic ratio of S-to-Te equal to 3.67 suggests the adsorption of $TeS_3^{2-}$ ions, along with possibility for some additional $S^{2-}$ incorporated onto the NC surface. Note that Cd-to-Se ratio of 1.25 was similar to that in original NCs. The integrity of CdSe NC core was also evident from the similar excitonic absorption features in the optical absorption spectra (FIG. 3B). The main difference lies in the high energy part of absorption spectra (5450 nm) showing the contribution from the $TeS_3^{2-}$ ions. Surface affinity of $TeS_3^{2-}$ ions is rather similar to that of MCC ligands. For example, stable colloidal solutions of PbS NCs can be formed with $TeS_3^{2-}$ ions in FA, whereas capping with $S^{2-}$ cannot provide stable colloidal solutions for IV-VI NCs.

The presence of two chalcogens in different oxidation states opens interesting possibilities for surface redox reactions. $Te^{4+}$ can oxidize its own ligand ($S^{-2}$) releasing elemental Te and S, which explains limited stability of $(NH_4)_2TeS_3$ in the solid state, under light or heat. Another redox pathway is the reaction of $Te^{4+}$ with the NC material. For example, metal telluride NCs such as CdTe and PbTe slowly reacted with $TeS_3^{2-}$ releasing elemental Te ($Te^{4+}$+ $Te^{2-}$→$Te^0$ comproportionation reaction) and leading to partial or complete conversion to CdS and PbS. For PbTe NCs this reaction occurred within minutes after the ligand exchange, while more covalent CdTe converted to CdS only upon heating of NC films at 120° C. CdSe NCs are significantly more stable, and only partially react under the thermal treatment (FIG. 12). At the same time, PbS NCs do not react with $TeS_3^{2-}$ as confirmed by powder XRD patterns for dried and annealed samples (FIG. 13). Therefore, the use of mixed chalcogenide ligands can be advantageous for compositional modulations in nanogranular solid materials such as thermoelectric Pb and Sb chalcogenides.

Regarding FIGS. 3A and 3B; (a) ESI-MS spectrum of $(NH_4)_2TeS_3$ solution. The inset compares an experimental high-resolution mass-spectrum with simulated spectra for $TeS_3H^-$ and $TeS_3^-$ ions. (b) Absorption spectra for $(NH_4)_2TeS_3$, for CdSe NCs capped with the organic ligands in toluene and for CdSe NCs capped with $TeS_3^{2-}$ ions in formamide.

Other Metal-Free Anionic Ligands ($OH^-$- and $NH_2^-$).

Figure 4A:
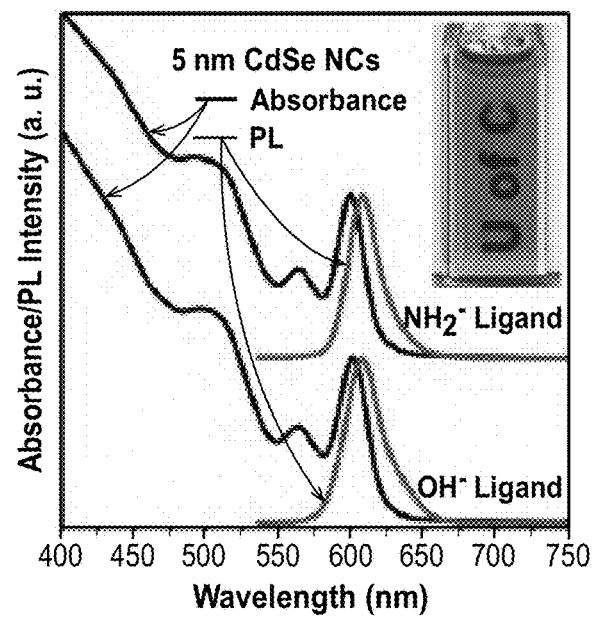
FIG. 4A illustrates Absorption and PL spectra of $OH^-$ and $NH_2^-$ capped CdSe NCs dispersed FA, in which the inset shows a photograph of the colloidal solution.
Figure 4B:
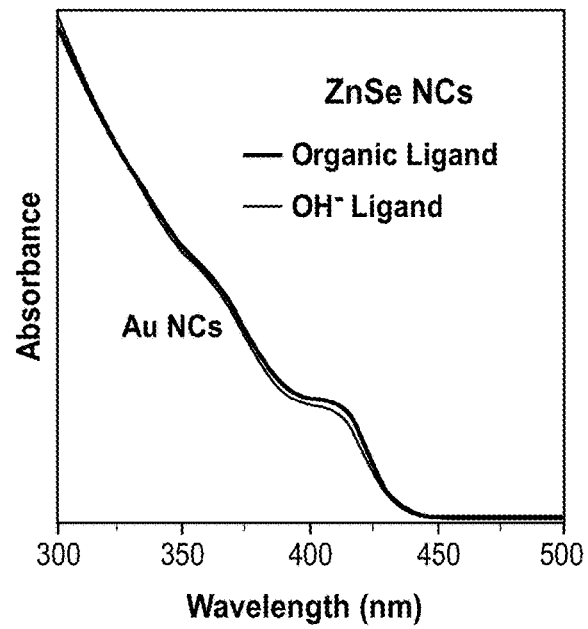
FIG. 4B illustrates Absorption spectra of ZnSe NCs capped with oleylamine and $OH^-$ ligands dispersed in toluene and FA, respectively.

Stabilization of colloidal NCs with other inorganic anions was explored. $OH^-$ and $NH_2^-$ successfully replaced organic ligands at the surface of CdSe NCs and stabilized colloidal solutions in FA. FIG. 4A shows that absorption and PL spectra of $OH^-$ and $NH_2^-$ capped 5.5 nm CdSe NCs did not change compared to original NCs (FIG. 1Bb); no change was also detected in the XRD patterns of corresponding NCs (FIG. 14). Similar to $S^{2-}$ capped NCs, $OH^-$ capped CdSe NCs exhibited negative ζ-potentials in polar solvents, consistent with the electrostatic stabilization. The value of ζ-potential for $OH^-$ capped CdSe NCs in FA (−20 mV) was substantially lower than that for $S^{2-}$ capped NCs. Right after the ligand exchange, colloidal solutions can be easily filtered through a 0.2 μm filter but they slowly aggregated and precipitated in several days. Unlike $S^{2-}$ capped NCs, FTIR spectra of $OH^-$ capped CdSe NCs (FIG. 15) did not show complete removal of $CH_2$ bands at 2852 and 2925 $cm^{-1}$, but the intensity of C—H bands decreased by >90% compared to the original NCs. Similar behavior and ζ-potentials have been observed for $NH_2$ capped CdSe NCs. These observations point to somewhat lower affinity of $OH^-$ and $NH_2^-$ toward CdSe surface compared to chalcogenides. In contrast, ZnSe NCs did not form stable colloidal solutions with $S^{2-}$ ligands but can be easily stabilized with $OH^-$ in FA (FIG. 4B). The possible origin of such selectivity will be discussed in the next section.

Regarding FIGS. 4A and 4B; (a) Absorption and PL spectra of $OH^-$ and $NH_2^-$ capped CdSe NCs dispersed FA. Inset shows a photograph of the colloidal solution. (b) Absorption spectra of ZnSe NCs capped with oleylamne and $OH^-$ ligands dispersed in toluene and FA, respectively.

Application of Hard and Soft Acid and Base (HSAB) Classification to Colloidal Nanostructures.

In 1963 Pearson proposed HSAB principle that explained many trends in stability of the complexes between Lewis acids and bases by classifying them into "hard" and "soft" categories. Generally, soft acids form stable complexes with soft bases, whereas hard acids prefer hard bases. The inorganic ligands used in this work represent classical examples of soft (highly polarizable $HS^-$, $S^{2-}$, $Se^{2-}$) and hard (less polarizable $OH^-$, $NH_2$) Lewis bases. It was noticed that original ligands on Au and CdTe NCs can be easily replaced with $S^{2-}$, $Se^{2-}$ or $HS^-$ ligands, but did not form stable colloidal solutions in the presence of $OH^-$. In contrast, ZnSe (FIG. 4b) and ZnO NCs can be stabilized with $OH^-$ but did not interact with $S^{2-}$ and $HS^-$. Other NCs, including CdSe and CdS, formed stable colloidal solutions with both hard and soft ligands. This difference in behavior was attributed to the differences in chemical affinity between NCs and Lewis bases and proposed that HSAB theory, originally developed for molecular coordination compounds, can be extended to the world of nanomaterials (FIG. 72). The ligands used in this work bind primarily to the electrophilic sites at NC surface. In agreement with HSAB, soft $Au^0$ and $Cd^{2+}$ sites exhibited stronger affinity to soft $S^{2-}$ and $HS^-$ ligands compared to hard $OH^-$, whereas harder $Zn^{2+}$ sites in ZnSe and ZnO NCs had higher affinity to $OH^-$ rather than to $HS^-$. More quantitative information on the binding affinity can be obtained from the comparison of ζ-potentials related to the charges on NC surface (FIG. 16). The extension of HSAB principle to NCs appears to fail for InP and InAs NCs. Free In is a hard acid, while InAs and InP behave as soft acids preferentially binding to $S^{2-}$ and $HS^-$ rather than to $OH^-$. This discrepancy, however, can be explained by taking into account the character of chemical bonding inside NCs. Small difference in electronegativity between In and P or As led to very small positive effective charge on the In surface sites, much smaller than the charge on isolated In ions. Low charge density softens the acidic sites at InP and InAs NCs surface. To further test this hypothesis, $In_2O_3$ NCs were synthesized, where the bonding has a higher ionic character compared to InP and InAs, and their interaction with $OH^-$ and $HS^-$ ligands was studied. Both $HS^-$ and $OH^-$ bound to $In_2O_3$ NC surface resulting in similar ζ-potentials (−40 mV), suggesting that the metal surface sites in $In_2O_3$ NCs were harder than those in InP and InAs NCs.

FIG. 72 shows (a) typical metal complexes and (b) a nanocrystal with surface ligands. Similarities between metal-ligand (M-L) bonding in both classes of compounds should be noted. HSAB theory, originally developed for metal complexes, can also apply to colloidal nanomaterials.

Comparison of Metal-Free Inorganic Ligands to MCCs.

Negatively charged metal-free ligands can be viewed as an addition to the family of all-inorganic colloidal NCs that started with the discovery of MCC ligands. In this section, observations comparing metal-free inorganic ligands to MCCs are summarized.

The solutions of MCCs in polar solvent are expected to contain a certain equilibrium concentration of free chalcogenide ions. The possibility of using chalcogenide ions to prepare stable colloidal solutions of NCs in hydrazine, typically used with MCC ligands have been explored. It turned out that chalcogenides can not stabilize II-VI, IV-VI and III-V NCs in hydrazine. Probably, the dielectric constant of hydrazine (ε=51) and its solvation ability were not sufficient to obtain stable colloids with pure chalcogenides. In contrast, $Sn_2Se_6^{4-}$ and other MCC ligands provided long-term, up to several years, stability to CdSe NC colloids in hydrazine. In FA, both chalcogenides and MCCs generated stable colloidal solutions, e.g., for Au and CdSe NCs. Direct comparison revealed that CdSe NCs capped with $SnS_4^{4-}$ or $AsS_3^{3-}$ MCC ligands exhibited higher ζ-potentials, typically in the range of −50 to −80 mV. That probably corresponded to a higher affinity of MCCs toward CdSe NCs. On the other hand, $S^{2-}$ was superior for CdSe/ZnS NCs, for which many MCCs showed poor affinity. MCCs and mixed chalcogenide ligands were better for Pb chalcogenide NCs, for which $S^{2-}$-capping failed. Compared to the MCCs, free chalcogenide ions were somewhat more prone to oxidative degradation. Both, sulfide-based MCC-capped NCs and $S^{2-}$-capped nanomaterials can be prepared and handled in air, but $S^{2-}$-capped NCs were stable much longer if prepared and stored in a glovebox.

Electrostatic Stabilization of Colloidal Nanocrystals in the Absence of Charged Ligands ("Ligand-Free" Nanocrystals).

Inorganic ligands that provided negative charge to the NC surface have been discussed. All-inorganic positively charged NCs are rarer, presumably, without wishing to be bound by theory, because NCs typically have electrophilic metal-rich surfaces with preferential affinity toward nucleophilic ligands. Recently, Murray and coworkers reported colloidal NCs with positively charged surface. They used nitrosonium tetrafluoroborate ($NOBF_4$) and aryldiazonium tetrafluoroborate to perform ligand exchange on $Fe_3O_4$, FePt, $Bi_2S_3$ and $NaYF_4$ NCs, resulting in positively charged NC surface. Unfortunately this approach did not work with CdSe and other semiconductor NCs. Nitrosonium salts are known as strong one-electron oxidants, resulting in the etching of NC surface immediately after the addition of $NOBF_4$ (FIG. 17).

Figure 5A:
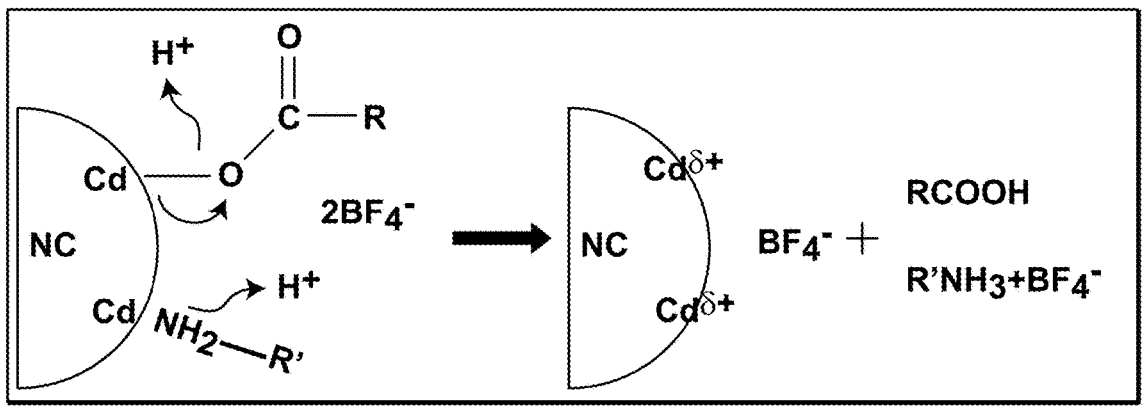
FIG. 5A illustrates removal of the organic ligands from the surface of CdSe NCs by $HBF_4$ treatment, and for simplicity, monodentate binding mode of carboxylate group is shown, and the proposed mechanism can hold for other chelating and bridging modes as well.
Figure 5B:
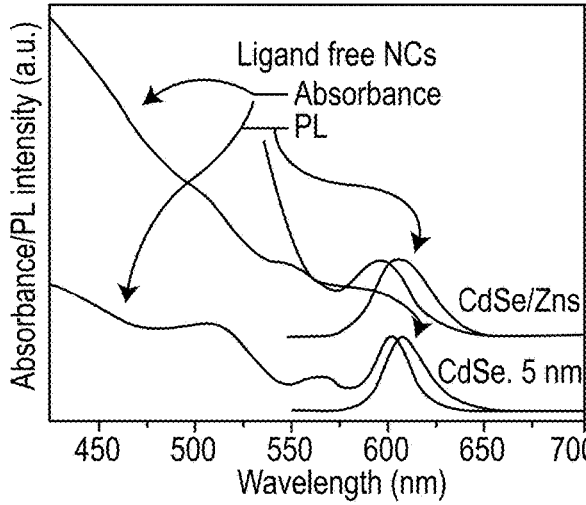
FIG. 5B illustrates Absorption and PL spectra of ligand-free colloidal CdSe and CdSe/ZnS NCs obtained after $HBF_4$ treatment.
Figure 5C:
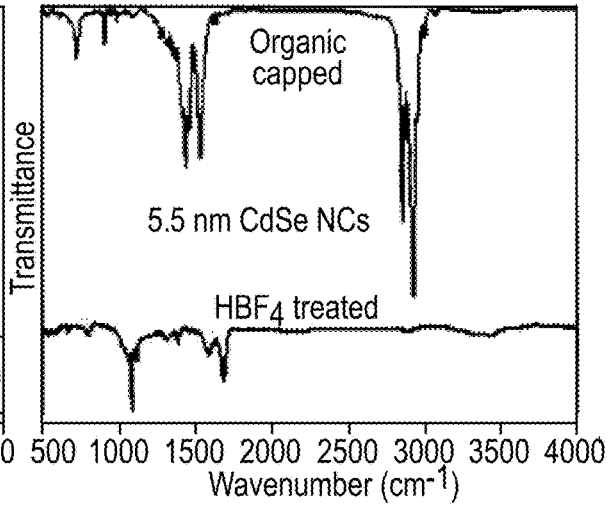
FIG. 5C illustrates FTIR spectra of organically capped and ligand-free CdSe NCs after $HBF_4$ treatment.

To cleave the bonds between CdSe NC and carboxylate organic ligands without oxidizing the NCs, $HBF_4$ and $HPF_6$ in polar solvents were used. This reaction resulted in the phase transfer of NCs from non-polar solvent (toluene) to a polar solvent (FA). In the case of oleylamine and oleate capping ligands, $H^+$ cleaved the Cd—N and Cd—O bonds, as schematically shown in FIG. 5A, leaving behind positively charged metal sites at the NC surface. $HBF_4$ treatment was efficient for NCs capped with carboxylate and alkylamine ligands whereas CdSe NCs capped with alkylphosphonic acid remained in the toluene phase even after extended $HBF_4$ treatment. $BF_4^-$ and $PF_6^-$ are known as very weak nucleophiles. These weakly coordinating anions did not bind to the NC surface, instead they acted as counter ions in the electrical double layer around NCs. FIG. 5B shows the absorption and PL spectra of 5.5 nm CdSe NCs and CdSe/ZnS core-shells after treatment with $HBF_4$ in FA. The size, size-distribution and band-edge emission remained, however, with a significant drop in the PL efficiency (<0.5% for CdSe NCs and ~2% for CdSe/ZnS NCs). ζ-potentials of CdSe and CdSe/ZnS NCs in FA were measured to be around +30 mV. Similar values were obtained with $HPF_6$. The removal of organic ligands was not possible with $NaBF_4$ and $NaPF_6$, emphasizing the role of $H^+$ ions in the reaction, which was also suggested in previous reports. FIG. 5C compares FTIR spectra of CdSe NCs capped with organic ligands and FTIR spectra of the same CdSe NCs after $HBF_4$ treatment. The absence of C—H bands at 2852 and 2925 $cm^{-1}$ constituted complete removal of the original organic ligand. The band centered at 2890 $cm^{-1}$ was from FA (FIG. 8). Apart from the FA related bands, a new sharp band at 1083 $cm^{-1}$ corresponding to $BF_4$ ions was observed.

Regarding FIGS. 5A-5C; (a) Removal of the organic ligands from the surface of CdSe NCs by $HBF_4$ treatment. For simplicity, the monodentate binding mode of carboxylate group is shown. The proposed mechanism can hold for other chelating and bridging modes as well. (b) Absorption and PL spectra of ligand-free colloidal CdSe and CdSe/ZnS NCs obtained after $HBF_4$ treatment. (c) FTIR spectra of organically capped and ligand-free CdSe NCs after $HBF_4$ treatment.

Growth of Metal Calcogenides on NCs at Room Temperature.

For the growth of metal chalcogenides on nanocrystals at room temperature, several approaches have been studied either in polar solvent or non polar solvent. In 2011, Talapin and co-workers have reported the use of chalcogenides and hydrochalcogenides as capping ligands for nanocrystals in polar solvents such as formamide of N-methylformamide. These ligands create a bond with the surface of nanocrystals and allow them to be soluble in a polar solvent. Hence it can be considered as the addition of a half monolayer, the second half monolayer would be induced through the addition of cadmium either in polar phase or in non polar phase. In an exemplary synthetic approach, ammonium sulfide or potassium sulfide are chosen as the sulfide source and cadmium nitrate, cadmium acetate, cadmium perchlorate or cadmium oleate are used as the cadmium source.

Several methods are contemplated, comprising use of both a polar and a nonpolar solvent. Contemplated nonpolar solvents include toluene, chloroform, methylene chloride, hexanes, octadecane, and mixtures thereof. Contemplated polar solvents include FA, DMF, NMFA, methanol, ethanol, and mixtures thereof. In some cases, the method further comprises adding a quaternary ammonium salt. Contemplated quaternary ammonium salts include Tetramethylammonium bromide; Tetramethylammonium chloride; Tetramethylammonium hexafluorophosphate; Tetramethylammonium hydroxide pentahydrate; Tetramethylammonium hydroxide; Tetramethylammonium hydroxide; Tetramethylammonium iodide; Tetramethylammonium nitrate; Tetramethylammonium perchlorate; Tetramethylammonium tetrafluoroborate; Triethylmethylammonium chloride; Tetraethylammonium bromide; Tetraethylammonium chloride monohydrate; Tetraethylammonium hydroxide; Tetraethylammonium hydroxide; Tetraethylammonium hydroxide; Tetraethylammonium iodide; Tetraethylammonium nitrate; Tetraethylammonium perchlorate; Tetraethylammonium tetrafluoroborate; Tetraethylammonium p-toluenesulfonate; (1-Hexyl)trimethylammonium bromide; Phenyltrimethylammonium bromide; Phenyltrimethylammonium chloride; Phenyltrimethylammonium iodide; Phenyltrimethylammonium methosulfate; Benzyltrimethylammonium bromide; Benzyltrimethylammonium chloride; Benzyltrimethylammonium hexafluorophosphate; Benzyltrimethylammonium hydroxide; Benzyltrimethylammonium hydroxide; Benzyltrimethylammonium iodide; (1-Butyl)triethylammonium bromide; (1-Octyl)trimethylammonium bromide; Tetra-n-propylammonium bromide; Tetra-n-propylammonium chloride; Tetra-n-propylammonium hydrogen sulfate; Tetra-n-propylammonium hydroxide; Tetra-n-propylammonium iodide; Phenyltriethylammonium iodide; Methyltri-n-butylammonium bromide; Methyltri-n-butylammonium chloride; (1-Decyl)trimethylammonium bromide; Benzyltriethylammonium bromide; Benzyltriethylammonium chloride; Benzyltriethylammonium hydroxide; Benzyltriethylammonium tetrafluoroborate; (1-Dodecyl)trimethylammonium chloride; (1-Dodecyl)trimethylammonium bromide; Benzyltri-n-propylammonium chloride; Tetra-n-butylammonium acetate; Tetra-n-butylammonium acetate, Tetra-n-butylammonium bromide; Tetra-n-butylammonium chloride; Tetra-n-butylammonium chloride; Tetra-n-butylammonium hexafluoro-phosphate; Tetra-n-butylammonium hydrogen sulfate; Tetra-n-butylammonium hydroxide; Tetra-n-butylammonium hydroxide; Tetra-n-butylammonium hydroxide; Tetra-n-butylammonium hydroxide; Tetra-n-butylammonium iodide; Tetra-n-butylammonium nitrate; Tetra-n-butylammonium perchlorate; Tetra-n-butylammonium perchlorate; Tetra-n-butylammonium phosphate; Tetra-n-butylammonium sulfate; Tetra-n-butylammoniumtrifluoromethane-sulfate; (1-Tetradecyl)trimethylammonium bromide; (1-Tetradecyl)trimethylammonium chloride; (1-Hexadecyl)trimethylammonium bromide; Ethyl(1-hexadecyl)dimethylammonium; Tetra-n-pentylammonium iodide; Benzyltri-n-butylammonium bromide; Benzyltri-n-butylammonium chloride; Benzyltri-n-butylammonium iodide; (1-Hexadecyl)pyridinium bromide monohydrate; (1-Hexadecyl)pyridinium chloride monohydrate; Di-n-decyldimethylammonium bromide; Tetra-n-hexylammonium bromide;

Tetra-n-hexylammonium hydrogen sulfate; Tetra-n-hexylammonium iodide; Tetra-n-hexylammonium perchlorate; Di-n-dodecyldimethylammonium bromide; Tetra-n-heptylammonium bromide; Tetra-n-heptylammonium iodide; Tetra-n-octylammonium bromide; Dimethyldistearylammonium chloride; Tetra-n-dodecylammonium iodide; Tetraoctadecylammonium bromide, or mixtures thereof.

In some cases, the method further comprises adding an alkyl amine to the admixture of nanoparticle and inorganic capping agent. Contemplated alkyl amines include mono-, di- and tri-substituted alkyl amines. The alkyl group can be a hydrocarbon of 6 to 20 carbon, optionally with one or more double bonds. A specific alkyl amine contemplated is oleylamine.

In one method, in a vial, 1 ml of FA, 30 µl of a solution at 0.1M of $K_2S$ in FA (($NH_4)_2S$ can also be used as sulfide precursor), 1 ml of toluene, 60 µl of a solution at 0.1M of DDAB (didodecyldimethylammonium bromide) in toluene and 200 µl of NCs (20 mg/ml) are stirred for five minutes. There is no transfer of phase and the NCs are stabilized with S-DDA in toluene. The non polar phase is washed two times with 1 ml of pure formamide by stirring one minute each time. Then 30 µl of a solution at 0.1M of cadmium oleate, $Cd(OA)_2$, in toluene is added to the mixture and stirred for one minute. Finally the NCs are precipitated with ethanol and resuspended in 400 µl of toluene. By repeating the same process with increasing the amount of precursors, it is possible to grow at least 10 monolayers.

It is possible to prevent from the precipitation of nanocrystals by using octadecene (ODE) as a solvent for NCs and by extraction the excess of $Cd(OA)_2$ with addition of toluene (or hexane or chloroform) and methanol (or ethanol). The NCs will stay in ODE while the excess of precursor will go in the mixture of Methanol/Toluene.

In another method, in a vial, 1 ml of FA, 2 µl of $(NH_4)_2S$, 200 µl of NCs (20 mg/ml), 1 ml of toluene and 15 µl of oleylamine are stirred for five minutes. There is no transfer of phase since NCs are stabilized by oleylamine. The non polar phase containing the NCs, is washed two times with pure formamide. Then 1 ml of formamide, and 30 µl of a solution at 0.1M of $Cd(OAc)_2$ in formamide are added to the polar phase and stirred for 5 minutes. The nanocrystals are still stabilized by oleylamine in the non polar phase, but cadmium has grown on the sulfide on surface of nanocrystals. The non polar phase is rinsed two times with formamide. The successive monolayers are grown by the same way. This process doesn't require a precipitating step after each monolayer.

Growth by Phase Transfer:

In a vial 1 ml of FA, 2 µl of $(NH_4)_2S$, 200 µl of NCs (20 mg/ml) and 1 ml of toluene are stirred until complete phase transfer. The NCs are then moved back with addition of toluene, DDAB and $Et_4NBr$ in formamide. The transfer from polar to non polar phase is fast. The addition of $Et_4NBr$ allows an increase of the ionic strength. The non polar phase is then rinse two times with fresh formamide. Then 1 ml of formamide, and 30 µl of a solution at 0.1M of $Cd(OAc)_2$ in formamide are added to the polar phase and stirred for 5 minutes. The polar phase is then rinse two times with fresh formamide.

Growth in Polar Phase:

In a vial 1 ml of NMFA, 2 µl of $(NH_4)_2S$, 200 µl of NCs and 1 ml of hexane are stirred until complete phase transfer. The NCs are then rinsed two times with hexane, precipitated with acetonitrile and redispersed with NMFA. Then 30 µl of a solution at 0.1M of $Cd(OAc)2$ in NMFA is added and stirred for 30 seconds. The NCs are then precipitated with toluene and redispersed with NMFA.

Colloidal NCs with Metal-Free Inorganic Ligands for Device Applications.

Small inorganic ligands like $S^{2-}$ or $Se^{2-}$ do not introduce insulating barriers around NCs and provide an exciting opportunity for the integration of colloidal NCs in electronic and optoelectronic devices. Detailed investigations of NCs with these new capping ligands will be a subject of a separated study. Here results on electron transport in the arrays of $S^{2-}$ capped CdSe NCs as well as CdSe/CdS and CdSe/ZnS core-shell NCs are shown.

The electron mobility in NC arrays can be conveniently measured from transfer characteristics of a field-effect transistor. For these studies, 20-40 nm thick close packed NC films were deposited on highly doped Si wafers with 100 nm thick $SiO_2$ thermal gate oxide. The NC films were spin-coated from FA solutions at elevated temperatures (80° C.), followed by short annealing at 200-250° C. When $(NH_4)_2S$ was used to stabilize the solution of CdSe NCs, this mild thermal treatment resulted in the complete removal of surface ligands and led to much higher carrier mobility in the NC array. Source and drain Al electrodes were patterned on the annealed NC films using a shadow mask. FIGS. 6A-6C show sets of drain current ($I_D$) vs. drain-source voltage ($V_{DS}$) scans at different gate voltages ($V_G$) for devices made of $(NH_4)_2S$ capped 4.6 nm CdSe NCs (originally capped with oleylamine and oleic acid), 10 nm CdSe/CdS, and 8 nm CdSe/ZnS core/shell NCs. $I_D$ increased with increasing $V_G$, characteristic of the n-type transport.

The electron mobility corresponding to the linear regime of FET operation (measured at $V_{DS}$=2V across a 80 µm long channel) for a film of CdSe NCs capped with $(NH_2)_2S$ annealed at 200° C. was $\mu_{lin}$=0.4 $cm^2V^{-1}s^{-1}$ with $I_{ON}/I_{OFF}$~$10^3$ (FIGS. 6a, d). FETs assembled from CdSe/CdS (FIGS. 6B, 6E) and CdSe/ZnS (FIGS. 6C, 6F) core-shell NCs capped with $(NH_4)_2S$ ligands annealed at 250° C. showed $\mu_{lin}$=0.04 $cm^2V^{-1}s^{-1}$ with $I_{ON}/I_{OFF}$~$10^4$ at $V_{DS}$=2V and $\mu_{lin}$=6·$10^{-5}$ $cm^2V^{-1}s^{-1}$ with $I_{ON}/I_{OFF}$~$10^2$ at $V_{DS}$=4V, respectively. The electron mobility measured in the saturation mode of FET operation ($V_{DS}$=30V, FIG. 18) was slightly higher than $\mu_{lin}$ for CdSe and CdSe/ZnS NCs: 0.5 $cm^2V^{-1}s^{-1}$ and 9·$10^{-5}$ $cm^2V^{-1}s^{-1}$, correspondingly. The devices assembled from CdSe/CdS core-shell NCs showed similar electron mobility in both linear and saturation regimes.

The channel currents were orders magnitude lower for CdSe NCs capped with $K_2S$ ligands as compared to $(NH_4)_2S$ ligands. Without wishing to be bound by theory, low conductivity is attributed to the presence of $K^+$ ions creating local electrostatic barriers around NCs and behaving as the electron scattering centers. The devices assembled from CdSe NCs capped with $(NH_4)_2TeS_3$ also showed n-type transport with $\mu_{lin}$=0.01 $cm^2V^{-1}s^{-1}$ (FIG. 19).

Although the films of CdSe/ZnS core-shell NCs showed rather low carrier mobility, these NCs preserved bright band-edge photoluminescence even after annealing at 250° C. (inset to FIG. 7C). Generally, metal-free ligands allowed obtaining conductive NC layers without introducing foreign metal ions that often introduce recombination centers. As a result, efficient band-edge PL in electronically conductive NC arrays were observed for the first time (FIG. 6C).

To conclude this work, it has been demonstrated that various metal-free inorganic ligands like $S^{2-}$, $OH^-$ and $NH_2^-$ can behave as the capping ligands for colloidal semiconductor and metallic NCs. These ligands significantly enrich the colloidal chemistry of all-inorganic NCs, and represent a useful strategy for integration of colloidal nanostructures in electronic and optoelectronic devices.

Regarding FIGS. 6A-6C; (a-c) Plots of drain current $I_D$ vs. drain-source voltage $V_{DS}$, measured as different gate voltages $V_G$ for the field-effect transistors (FETs) assembled from colloidal NCs capped with $(NH_4)_2S$: (a) CdSe, (b) CdSe/CdS core-shells and (c) CdSe/ZnS core-shells. Insets to panel (c) show the photoluminescence spectrum (left) and a photograph (right) for CdSe/ZnS NC film capped with $(NH_4)_2S$ ligands annealed at 250° C. for 30 min. (d,e) Plots of $I_D$ vs. $V_G$ at constant $V_{DS}$=2V used to calculate current modulation and linear regime field-effect mobility for FETs using CdSe and CdSe/CdS NCs. (f) Plots of $I_D$ vs. $V_G$ measured at constant $V_{DS}$=4V in a FET assembled from CdSe/ZnS NCs. L=80 μm, W=1500 μm, 100 nm $SiO_2$ gate oxide.

Mobility Calculations.

Linear Range Mobility ($\mu_{lin}$);

At low $V_{DS}$ the current $I_D$ increases linearly with $V_{DS}$. In this mode the FET operates like a variable resistor and the FET is said to be operating in a linear regime. $I_D$ can be obtained from the following equation:

$$I_D = \frac{WC_i\mu_{lin}}{L}\left(V_G - V_T - \frac{V_D}{2}\right)V_D, \quad (S1)$$

where L is the channel length, W is the channel width, $C_i$ is the capacitance per unit area of the dielectric layer, $V_T$ is the threshold voltage, and $\mu_{lin}$ is the linear regime field-effect mobility. $\mu_{lin}$ is usually calculated from the transconductance ($g_m$) by plotting $I_D$ versus $V_G$ at a constant low $V_D$. The slope of this plot is equal to $g_m$:

$$g_m = \left.\frac{\partial I_D}{\partial V_G}\right|_{V_D=const} = \frac{WC_iV_D}{L}\mu_{lin} \quad (S2)$$

Saturation Mobility ($\mu_{sat}$);

At high $V_{DS}$ the current saturates as the channel "pinches off" near the drain electrode. If $V_{DS}$ voltage is increased further, the pinch-off point of the channel begins to move away from the drain towards the source. The FET is said to be in the saturation regime. For $V_{DS} \geq (V_{GS}-V_T)$, $I_D$ can be expressed as:

$$I_D = \frac{WC_i\mu_{sat}}{2L}(V_G - V_T)^2 \quad (S3)$$

where $\mu_{sat}$ is the saturation regime field-effect mobility. This parameter is typically calculated from the slope of $[I_D]^{1/2}$ vs. $V_G$ curve.

Hysteresis-Free Operation of Field-Effect Transistors on CdSe Nanocrystals Capped with $S^{2-}$ Ligands For many practical applications of nanocrystal transistors, solar cells and other electronic and optoelectronic devices, the hysteresis free operation is a very important requirement that can be satisfied in addition to the high field effect mobility. Hysteretic response in FETs appears as a difference in the source-drain current ($I_{DS}$) values observed during forward and backward sweeps of the gate voltage. ($V_{GS}$) The mechanisms that cause hysteresis in transistors have been extensively studied on bulk inorganic or organic field effect transistors. In general, i) interface-trapped charge, ii) fixed charge in the dielectric layer and iii) mobile ions in the dielectric layer are known to be responsible for the hysteresis. By preventing these mechanisms, hysteresis free transistors have been reported in those fields.

However, the previous reports on nanocrystal transistors always have shown large hysteresis both in the output and transfer characteristics. Considering above mentioned mechanisms, the previously reported hysteresis in nanocrystal transistors can originate from hydrophilic $SiO_2$ surface, of which hydroxyl group can trap electron, and charge trapping ligand surrounding the nanoparticles. For example, by using an amorphous fluoropolymer (Cytop™) (hydroxyl free polymer) as the dielectric layer and $In_2Se_4^{2-}$ capped CdSe nanocrystals as the semiconductor layer, one can dramatically reduce the hysteresis of transfer curve. However one can still observe a certain hysteresis which can originate from the hole trapping by $In_2Se_4^{2-}$ ligands.

Based on the assumption that $S^{2-}$ ligands trap holes less efficiently than molecular metal chalcogenide (MCC) ligands, transistors were fabricated with top-gate geometry using Cytop™ as the gate dielectric layer and $S^{2-}$ capped CdSe as the semiconductor layer. As mentioned earlier, the use of Cytop™ can guarantee hydroxyl group free interfaces between semiconductor and dielectric layer, thus enabling electron trap-free operation for transfer curves. The devices were fabricated as follows: MCC- or S2-capped nanocrystal solutions were spin-coated onto heavily doped Si wafers served as substrate under dry nitrogen atmosphere. As-deposited NC films were annealed at 200° C. for 30 min and Al source-drain electrode was patterned by thermal evaporation with channel length of 150 μm and channel width of 1500 μm. For the insulating layer, Cytop CTL-809M (solvent: CT-Solv.180) from Asahi Glass, Japan was spin coated onto the nanocrystal layer and dried for 30 min. at 150° C. The thickness of the insulating layer was determined to be 800-850 nm thick, which gives a gate capacitance of $C_i$=2.2-2.3 $nF/cm^2$. Finally Al gate electrode was deposited by thermal evaporation. (FIG. 20)

FIG. 21 shows very ideal transfer and output characteristics of $S^{2-}$ capped CdSe transistors without any hysteresis which tell that the interface between $S^{2-}$ capped CdSe nanocrystal and Cytop™ is free from both electron and hole traps. Considering that the transistor based on $In_2Se_4^{2-}$ capped CdSe nanocrystals using same transistor geometry still showed some hysteresis, it is probable that $S^{2-}$ capped CdSe nanocrystals have lower hole trap density than MCC capped CdSe nanocrystals. These results further confirm that $S^{2-}$ capped colloidal nanocrystal transistors can be useful for real application in integrated circuit with high reliability.

Producing Chalcogenide-Capped III-V Semiconductors

Bridging InAs NCs with $(N_2H_4)(N_2H_5)Cu_7S_4$ MCC ligands can lead to very high electron mobility approaching 15 $cm^2$/Vs. In addition, bipolar (positive/negative) photoresponse of MCC-capped InAs NCs solids was observed that can be tuned with ligands chemistry, temperature and wavelength and the doping of NC solid.

III-V semiconductors such as GaAs, InP, InAs combine a direct band gap with very high mobility, reliable p- and n-type doping and other characteristics making them excellent materials for various electronic and photonic applications. The fastest commercial transistors and the most efficient solar cells employ III-V semiconductors. At the same time, despite all the benefits, various technological difficulties with growing and processing single crystals do not allow III-V materials to successfully compete with silicon and chalcogenides for large consumer markets. As a possible solution, colloidal nanocrystals such as InAs and InP, can be used as a cost-efficient alternative to III-V single crystals for applications, for example, in photovoltaics, light detectors, field effect transistors (FET), and light emitting diodes (LED). For these applications efficient charge transport between NCs is preferred. The electronic properties of functional materials made of semiconductor NCs strongly depend on the ability of charge carriers to move from one NC to another through the interparticle boundaries. Charge transport through interfaces and grain boundaries is also of general importance for various applications of granular semiconducting materials.

Colloidal synthesis of high quality semiconductor nanocrystals has required the use of organic surface ligands that form insulating shells around each NC and negatively affect the charge transport. Removal of organic surfactants via thermal or chemical treatment often leads to surface traps and NCs sintering. A more useful approach is to chemically treat NCs with small ligands. These techniques have been originally developed for II-VI (e.g., CdSe) and IV-VI (e.g., PbSe) NCs. A few reported charge transport studies for InAs NCs used either postdeposition ligand exchange treatment of InAs NCs with ethanedithiol or solution ligand exchange of TOP capped InAs with aniline followed by postdeposition crosslinking with ethylenediamine (EDA). Such treatments converted highly insulating organics-capped InAs NCs into semiconducting NC solids.

Ligand exchange of organic capped nanocrystals with MCCs. All ligand exchange procedures were performed inside a nitrogen-filled glovebox (sub-1 ppm $O_2$ and $H_2O$ levels) using anhydrous solvents. The molar ratio of MCC to NC materials is around 0.5. As a typical example for 4 nm InAs—$In_2Se_4^{2-}$ NC system, 0.1 ml 0.25 M $(N_2H_4)_2(N_2H_5)_2$ $In_2Se_4$ solution was mixed with 2 ml $N_2H_4$. 0.16 ml of 0.30 M InAs NC solution in toluene was diluted with 2 ml hexane and then loaded onto the top of the hydrazine phase. The solution was stirred for around 30 min to 1 hour until the upper organic phase turned colorless and the lower hydrazine phase turned dark. The organic solution was removed carefully. And the lower hydrazine phase was purified to remove any organics by washing with anhydrous toluene for three times. Furthermore, the hydrazine solution was precipitated by minimal amount of anhydrous acetonitrile (approximately 50% of NC solution volume), collected by centrifugation, redissolved into hydrazine and filtered through a 0.2 µm PTFE.

FET Device fabrication. Samples for electrical measurements were prepared by depositing thin 10 nm-30 nm (±20%) films by spin-coating MCC-capped NCs onto highly doped Si wafers with a 100 nm thick $SiO_2$ thermal gate oxide. The oxide surface was hydrophilized by piranha solution prior to NC deposition. The film thickness can be controlled by adjusting concentration of the NC solution and the spinning rate. All sample preparations were carried out under dry nitrogen atmosphere. As-deposited NC films were dried at 80° C. for 30 min, followed by the annealing at 200° C. for 1 hr. Source and drain Al (~1000 Å) electrodes were directly patterned on the annealed NC films using a shadow mask.

Electrical measurements. The electrical measurements were performed using Agilent B1500A semiconductor parameter analyzer under dry nitrogen atmosphere. All FET measurements were carried out under quasi-static conditions with typical voltage scan rates of 0.12 $Vs^{-1}$ and 40 $mVs^{-1}$ for ID-VG and ID-VDS scans, respectively.

The electron mobility was calculated from the slope of the drain current (ID) versus VG measured when the gate voltage was scanned in the forward direction (i.e., from negative to positive). For an n-type FET, this measurement typically provides a conservative estimate for the field effect mobility.

Photoconductivity measurements. For the photoconductivity measurements, close-packed films of different MCCs ($In_2Se_4^{2-}$, $Cu_7S_4^{2-}$, and $Sn_2S_6^{4-}$) capped InAs and $In_2Se_4^{2-}$ capped InP NCs were deposited on a Si wafers with a thick layer of 100 nm $SiO_2$ gate oxide with Ti/Au (5/45 nm) electrodes patterned by photolithography. The surface of the substrates was hydrophilized by oxygen plasma treatment. As-deposited NC films were dried at 80° C. for 30 min, following by the annealing at 200° C. for 1 hr. For the photocurrent vs time (I-t) measurements, the devices were biased using Keithley 2400 source meter controlled by a LabView program. The photocurrent was measured under illumination with four different CW LED's emitting at 660 nm (1.88 eV), 980 nm (1.27 eV), 1310 nm (0.95 eV), and 1550 nm (0.80 eV), respectively.

For synthesis of hydrazinium chalcogenidometallates (MCCs used here) the Mitzi's approach was used based on the dissolution metals or metal chalcogenides in neat $N_2H_4$ in the presence of elemental chalcogens. The ligand exchange was carried out through a phase transfer procedure in which TOP-capped InAs or myristate-capped InP NCs in a nonpolar solvent such as hexane were transferred into the $N_2H_4$ phase as the organic ligands were replaced with MCCs forming a stable colloidal solution (FIG. 32A). To explore the versatility of the MCC ligand exchange with InAs and InP NCs, five inorganic $N_2H_4$-MCCs were studied: $(N_2H_4)_2$ $(N_2H_5)_2In_2Se_4$, $(N_2H_4)_3(N_2H_5)_4Sn_2S_6$, $(N_2H_4)(N_2H_5)_4$ $Sn_2Se_6$, $(N_2H_4)(N_2H_5)Cu_7S_4$, and $(N_2H_4)_x(N_2H_5)_3$ $\{In_2Cu_2Se_4S_3\}$. TOP-capped InAs NCs worked well with all above MCCs whereas InP NCs capped with myristic acid could be stabilized with all MCC ligands except $(N_2H_4)$ $(N_2H_5)Cu_7S_4$ that apparently etched InP NCs. The purity of the original organics-capped NCs was important to success of the ligand exchange and to the performance of the NC-based FET devices. The type of original organic ligand on the NCs also influenced the results of the ligand exchange. For instance, InP NCs initially capped with TOP/TOPO precipitated out in $N_2H_4$ after ligand exchange with MCCs. Among these precipitates, only $(N_2H_5)_4Sn_2S_6$ capped InP NCs can be redissolved into formamide (FA) which has much higher dielectric constant (ε=106) compared to $N_2H_4$(ε=55). The attempts to treat TOP/TOPO capped InP NCs with $NOBF_4$ to get ligand-free NCs following the approach of Murray et al. and then to perform ligand exchange with MCCs was not successful because $NOBF_4$ etched the InP NCs. On the other hand, successful inorganic MCC ligand exchange happened with myristic acid-capped InP NCs leading to the formation of colloidal NCs in $N_2H_4$. Simple chalcogenide ligands ($S^{2-}$, $Se^{2-}$ and $Te^{2-}$) worked well with InAs and InP NCs regardless of original organic surfactants.

The time required to complete the ligand exchange ranged from a few minutes to several hours. As confirmed by TEM images, the size and shape of the InAs and InP NCs were preserved after the ligand exchange as shown in FIGS. 32C and 32E. $In_2Se_4^{2-}$-capped InAs and $Sn_2S_6^{4-}$-capped InP NCs retained their excitonic features in the absorption spectra as shown in FIGS. 32B and 32D, inferring the preservation of NCs size distribution. A slight redshift in the first excitonic peak of $In_2Se_4^{2-}$-capped InAs NCs compared to TOP-capped InAs NCs can be explained by partial relaxation of the quantum confinement due to electron and/or hole wave function leakage to the MCC layer. FTIR spectra taken before and after ligand exchange showed the extent of ligand exchange (FIGS. 33A, 33B). The strong absorption bands at 2800-3000 cm$^{-1}$ arising from characteristic C—H stretching were completely diminished after the ligand exchange reaction, confirming the complete removal of the organic surfactants from the surface of the NCs. Two weak absorption lines characteristic of the N—H stretching appear at 3200-3300 cm$^{-1}$, indicating new N$_2$H$_4$-MCCs attachment to the NCs. The negatively charged InAs NC surface resulted in a negative zeta potential (FIG. 32F) which is sufficient to electrostatically stabilize the colloidal dispersion in N$_2$H$_4$. A zeta potential of ±30 mV is generally regarded as the borderline between electrostatically stable and unstable colloidal solution in aqueous or similar media.

Dynamic lighting scattering (DLS) measurements shown in FIG. 32F, confirm that the narrow size distribution after ligand exchange is similar to that of organic capped NCs. A small decrease in the particle size of the MCC capped NCs compared to the organic ones can be attributed to a smaller hydrodynamic diameter of the MCC capped NCs after removal of the longer organic ligands. Since all the electric and optoelectric measurements of inorganic capped InAs and InP NCs were performed after 200° C. annealing, various techniques were applied to probe their morphological and electronic properties before and after the heat treatment. TGA data (FIG. 33E) of (N$_2$H$_4$)$_2$(N$_2$H$_5$)$_2$In$_2$Se$_4$ capped InAs NCs showed much less weight loss than the pure ligand at 200° C. The weight loss at 200° C., was caused by the elimination of weakly bound and thermally unstable N$_2$H$_4$ and N$_2$H$_5^+$ as confirmed by FTIR data (FIG. 33A) that the N—H stretching bands disappear after annealing at 200° C. annealing for 30 min. The X-ray diffraction patterns of (N$_2$H$_4$)$_2$(N$_2$H$_5$)$_2$In$_2$Se$_4$ capped InAs and InP NCs were nearly identical before and after 200° C. annealing and showed no reflection of In$_2$Se$_3$ phase (FIGS. 33C and 33D). The first excitonic absorption peak (FIG. 33F) of (N$_2$H$_4$)$_2$(N$_2$H$_5$)$_2$In$_2$Se$_4$ capped InAs NCs thin film broadened and slightly blue shifted after annealing at 200° C. for 30 min, indicating enhanced electronic coupling between nanocrystals and etching of the InAs NCs by the In$_2$Se$_3$ ligand.

Charge Transport and Photoresponse in Arrays of MCC-Capped InAs NCs.

The exchange of bulky organic surfactants with small inorganic ligands such as In$_2$Se$_4^{2-}$, Cu$_7$S$_4^{2-}$, Sn$_2$S$_6^{4-}$ and Sn$_2$Se$_6^{4-}$ should facilitate strong electronic coupling between individual NCs (FIG. 33F). Strong electronic coupling provides an exciting path for the integration of colloidal NCs into electronic and optoelectronic application. For charge transport studies, source and drain electrodes were deposited on the films of MCCs-capped InAs NCs after annealing at 200° C., which preserving excitonic features in the absorption spectra of annealed films.

FIG. 34 shows the effect of inorganic MCCs ligands on the performance of FET in closed-packed films of MCC capped of InAs NCs. FIGS. 34A-34C shows representative drain current (ID) versus drain-source voltage (VDS) scans at different gate voltages (VG) for assemblies a films of InAs NCs capped with Cu$_7$S$_4^{2-}$, Sn$_2$S$_6^{4-}$, and Sn$_2$Se$_6^{4-}$ MCCs, respectively. ID increased with increasing VG as characteristic of n-type transport. The electron mobility corresponding to the linear regime of FET operation measured at VDS=2 V for a film of InAs NCs capped with Cu$_7$S$_4^{2-}$ annealed at 200° C. was $\mu_{lin}$=1.64 cm$^2$ V$^{-1}$s$^{-1}$ with I$_{ON}$/I$_{OFF}$ 8×10$^1$ (FIGS. 34A, 34D). The saturation mobility ($\mu_{sat}$) measured at VDS=30V was slightly lower than linear mobility ($\mu_{lin}$), $\mu_{sat}$~1.3 cm2/Vs. This result expected the high-quality channel layers fabricated from Cu$_7$S$_4^{-2}$-capped InAs NC. NH$_4$Cu$_7$S$_4$ required a relatively low decomposition temperature (~120° C.) due to the relatively weak hydrogen-bonding between the Cu$_7$S$_4^-$ anion and thydrozinium/hydrazine species, which allows the formation of high-quality channel layers in FET devices at low annealing process.

On the other hand, FETs assembled from InAs NCs capped with Sn$_2$S$_6^{4-}$ and Sn$_2$Se$_6^{4-}$ ligands annealed at 200° C. showed lower carrier mobility; $\mu_{lin}$=0.2 cm$^2$ V$^{-1}$s$^{-1}$ with I$_{ON}$/I$_{OFF}$ 3×10$^1$ (FIGS. 34B, 34E) and $\mu_{lin}$=0.05 cm$^2$ V$^{-1}$ s$^{-1}$ with I$_{ON}$/I$_{OFF}$ 2×10$^2$ at VDS=2 V (FIGS. 34C, 34F), respectively. The electron mobility measured in the saturation mode of FET operation (VDS=30V) was much lower than $\mu_{lin}$ for InAs NCs capped with Sn$_2$S$_6^{4-}$, and Sn$_2$Se$_6^{4-}$; 3.6×10$^{-5}$ cm$^2$ V$^{-1}$s$^{-1}$ and 4.4×10$^{-6}$ cm$^2$ V$^{-1}$s$^{-1}$, respectively. The measured electron mobility depends both on the intrinsic property of the material (particle size, monodispersity etc.) and on a number of parameters related to device characteristics (FET structure, gate dielectric, film uniformity, contacts, etc.). These are all reasons to expect that higher performance will be obtained after further optimization of the FET devices.

Photoconductivity:

The photoresponse of close-packed films of InAs NCs capped with In$_2$Se$_4^{2-}$, Cu$_7$S$_4^{2-}$ and Sn$_2$S$_6^{4-}$ at room temperatures were measured by four different excitation sources with respective energies at 660 nm (1.88 eV), 980 nm (1.27 eV), 1310 nm (0.95 eV), and 1550 nm (0.80 eV) under nitrogen atmosphere. The dependence of gate voltage on the photocurrent was also studied for films of InAs NC capped with Sn$_2$S$_6^{4-}$ For these studies, close-packed films of MCCs-capped InAs NCs were deposited on Si wafers with a thick layer of 100 nm SiO$_2$ gate oxide and Ti/Au (5/45 nm) electrodes patterned by photolithography, followed by annealing at 200° C. for 1 hr. The gate voltage was applied using a back gate electrode in bottom gate FET configuration (channel length=4.5 μm, W=7800 μm). The photoresponse for the colloidal inorganic capped InAs NCs reveals a strong dependence on MCC-ligands. The results show that the coupling of illumination and gate effect leads to changing the sign of the photocurrent.

FIG. 35A shows the photocurrent response as a function of excitation energy in films of In$_2$Se$_4^{2-}$ capped InAs NCs measured at a bias of 2V. The photocurrent shows a positive photoresponse for all excitation energy. With an increase in excitation energies, more free carriers photogenerated from the valance band to conduction band can be generated higher photocurrent. When the light was off the photocurrent generated with a higher energy (>1.27 eV) decayed exponentially with a time constant greater than several hundred seconds. FIGS. 35B and 35C show that the sign of photoreponse of Cu$_7$S$_4^{2-}$ and Sn$_2$S$_6^{4-}$-capped InAs NCs was converted from negative at the higher energy excitations of 1.88 eV and 1.27 eV to positive at the lower energy excitations of 0.95 eV and 0.80 eV. Negative photocurrent has been observed in several material systems such as nanowires, heterostructures, and quantum well structures. Without wishing to be bound by theory, the negative photocurrent was mainly attributed to a reduction in the number of carriers available for transport in conduction channel. The response time of the negative photogeneration was faster than that of the positive photoresponse. For an explanation of this phenomena, it is postulated that the closed-packed films of Cu$_7$S$_4^{2-}$- and Sn$_2$S$_6^{4-}$-capped InAs NCs annealed at 200° C. can be formed high-quality quasi-multi-quantum well (MQW) structures due to their relatively low decomposition temperature. These quasi-MQW structures can provide strong electron confinement resulting from the large energy difference between the conduction bands and a large type-II valance band offset between InAs and Cu$_2$S (InAs/Cu$_2$S/InAs) or InAs and SnS$_2$ (InAs/SnS$_2$/InAs), which provides the formation of a two-dimensional electron gas (2DEG) in the InAs layer. These carriers might produce donor-like defects in the barriers or donors at the InAs/MCC ligands interfaces. Positive photoconductivity, which increases the 2DEG density in the conduction channel layer, is detected upon illumination by photons with excitation energies lower than about 0.95 eV and might be attributed to the photoionization of deep donors. On the other hand, negative photoconductivity occurs upon illumination by excitation energies larger than about 1.27 eV. The negative photoresponse can be attributed to photogenerated electron-hole pairs in the large gap layer (MCC layer) followed by spatial charge separation by the built-in field in the heterojunction layer (NC/MCC). The photoexcited electrons are captured by ionized deep donors in the MCCs barriers, while the holes reaching the interface of NC/MCC recombine with electrons in the InAs NCs, resulting in a decrease of carrier density in the channel layer.

FIG. 35$d$ represents the gate-dependent photoresponse in films of Sn$_2$S$_4^{2-}$ capped InAs NCs measured by a function of back gate bias (−20<Vg<20V) at excitation energy of 1.27 eV (980 nm). The effect of applied back gate bias was found to be similar to that observed prior to illumination. The sign of the photocurrent was converted from negative to positive response by applying a gate bias from −20 Vg to 20 Vg. By increasing the negative gate bias (<−20 VG), negative photocurrent was decreased and by further increasing the negative bias to −30 Vg, the photocurrent was completely degenerated due to complete depletion of carriers in the inversion layer on the NC/dielectric layer. On the other hand, when a positive gate bias was applied, the sign of photocurrent changed above 3 Vg and the positive photocurrent increased with increasing of positive gate voltage due to the increase of the 2DEG sheet density.

FIGS. 36A-36B shows that FETs assembled from colloidal InP NCs capped with In$_2$Se$_4^{2-}$ show poor charge transport behavior even after annealing at 250° C. for 30 min. FIGS. 36C-36D show photoresponse for a film of In$_2$Se$_4^{2-}$ capped InP NCs. Upon illumination an excitation source above the band gap of InP (E$_g$=1.27 eV at 300K), the photocurrent sharply increased with respective energies at 1.88 eV and 1.27 eV. On the other hand, photocurrent in films of In$_2$Se$_4^{2-}$ capped InP NCs was not generated when lower energy excitation sources.

Examples

Chemicals:

Potassium sulfide (anhydrous, ≥95%, Strem), sodium sulfide nonahydrate (98%, Aldrich), ammonium sulfide (40-48 wt % solution in water, Aldrich), Potassium hydroxide (≥90%, Aldrich), Sodium amide (Aldrich), Sulfur (99.998%, Aldrich), Selenium (powder, 99.99%, Aldrich), tellurium (shot, 99.999%, Aldrich), formamide (FA, spectroscopy grade, Aldrich), dimethylsulfoxide (DMSO, anhydrous, 99.9%, Aldrich), acetonitrile (anhydrous, 99.8%, Aldrich), didodecyldimethylammonium bromide (DDAB, 98%, Fluka), Trioctylphosphine oxide (TOPO, 99%, Aldrich), tetradecylphosphonic acid (TDPA, 99%, Polycarbon), octadecylphosphonic acid (ODPA, 99%, Polycarbon), dimethylcadmium (97%, Strem), Cadmium oxide (99.995%, Aldrich), diethylzinc (Aldrich), trioctylphosphine (TOP, 97%, Strem), dodecanethiol (98%, Aldrich), oleylamine (Aldrich), tert-butylamine-borane (97%, Aldrich), InCl$_3$ (99.99%, Aldrich), Indium acetate (99.99%, Alfa Aesar), Al$_2$Se$_3$ (95%, Strem) and Al$_2$Te$_3$ (99.5%, CERAC Inc.).

Nanocrystal Synthesis.

Zinc blende phase CdSe NCs capped with oleic acid and oleylamine were prepared following Cao et al. Wurtzite phase CdSe NCs capped with n-octadecylphosphonic acid (ODPA) were prepared from CdO and TOPSe. Large, 12 nm CdSe NCs capped with n-tetradecylphosphonic acid (TDPA) were synthesized using Cd(CH$_3$)$_2$ and TOPSe as precursors. CdSe and CdSe/ZnS core/shell NCs capped with proprietary ligands obtained from Evident Technologies Inc. (Troy, N.Y.) were also used.

To synthesize InP NCs, InCl$_3$ solution (1.036 g InCl$_3$ in 3.44 mL TOP), 075 g P(SiMe$_3$)$_3$, 7.4 g TOP and 0.9 g TOPO were mixed at room temperature. The mixture was heated at 270° C. for 2 days, and cooled down to room temperature. Post-synthesis size selective precipitation was carried out using toluene and ethanol as solvent and non-solvent, respectively.

InAs NCs with TOP as capping ligands were prepared from InCl$_3$ and As[Si(CH$_3$)$_3$]$_3$.

Au NCs were synthesized following Stucky et al. 0.25 mmol AuPPh$_3$Cl was mixed with 0.125 mL of dodecanethiol in 20 mL benzene forming a clear solution. 2.5 mmol of tert-butylamine-borane complex was then added to the above mixture followed by stirring at 80° C.

ZnSe NCs were prepared with some modifications. 7 mL oleylamine was degassed at 125° C. under vacuum for 30 min and then heated to 325° C. under N$_2$ flow. The solution containing 0.5M Zn and Se precursors was prepared by co-dissolution of diethylzinc and Se in TOP at room temperature. 2 mL of the precursors solution was added to degassed oleylamine at 325° C. One mL of additional precursors solution was added to the reaction mixture after 1 h, followed by two successive injections of 1.5 mL precursors solution after 2.5 and 4 hrs. The reaction was continued for 1 h after the final injection of the precursors and then cooled to room temperature. The NCs were washed by precipitation with ethanol and redispersed in hexane. The washing procedure was repeated three times.

CdS nanorods were prepared by slightly modified procedure. 0.207 g CdO, 1.08 g n-ODPA, 0.015 g n-propylphosphonic acid, and 3.35 g TOPO were heated at 120° C. under vacuum for 1 h, followed by heating the mixture to 280° C. under N$_2$ until the formation of a clear solution. The mixture was degassed at 120° C. for 2 h before it was heated to 300° C. under N$_2$. 2 g TOP was injected into the mixture at 300° C. and temperature was immediately set to 320° C. 1.30 g TOPS (TOP:S=1:1) was injected at 320° C. and heating was continued for 2 h. The reaction mixture was cooled to room temperature, washed twice with toluene/acetone and redispersed in toluene.

In$_2$O$_3$ NCs were prepared using the recipe of Seo et al. by heating a slurry of In(OAc)$_3$ and oleylamine at 250° C.

CdTe NCs were synthesized similar to the recipe published.

PbS NCs capped with oleic acid were synthesized according to the protocol developed by Hines et al.

Synthesis of Inorganic Ligands.

Sulfides, hydrogen sulfide, hydroxides and amide ligands were purchased from Aldrich and Strem and used as received.

K$_2$Se was synthesized by the reaction of K (25.6 mmol) with Se (12.8 mmol) in about 50 mL liquid ammonia. Special care was taken to make sure that the chemicals and reaction environment were air and moisture free. A mixture of dry ice and acetone was used to liquefy NH$_3$ gas.

Gray-white $K_2Se$ powder was stored inside a glovebox. In air $K_2Se$ turned red because of the formation of polysenides. $K_2Te$ was prepared in the same way as $K_2Se$. 7.6 mmol of K and 3.8 mmol of Te were used.

0.05 M solutions of KHSe and KHTe in formamide (FA) were prepared by titrating 25 mL of 0.05 M KOH solution with $H_2Se$ (or $H_2Te$) gas generated by the reaction of $Al_2Se_3$ (or $Al_2Te_3$) with 10% $H_2SO_4$. 1.7 fold molar excess of $H_2Se$ (or $H_2Te$) was used. A rigorous $N_2$ environment was maintained while handling the KHSe and KHTe solutions.

$(NH_4)_2TeS_3$ was synthesized using a modified literature method of Gerl et al. $2TeO_2*HNO_3$ was prepared by dissolving 5 g Te (pellets, Aldrich) in 35 mL $HNO_3$ (65%, aqueous) diluted with 50 mL $H_2O$. The solution was boiled in an open beaker until volume decreased to about 30 mL. Upon cooling, $2TeO_2*HNO_3$ was precipitated as a white solid that was separated by filtering, rinsed with deionized water and dried. To prepare $(NH_4)_2TeS_3$, 2 g of $2TeO_2*HNO_3$ was mixed with 40 mL aqueous ammonia solution (30% $NH_3$, Aldrich). Solution was first purged with $N_2$ for 5 min, then with $H_2S$ until all telluronitrate dissolved forming a yellow solution, characteristic for $TeS_3^{2-}$ ions. Solvents and $(NH_4)_2S$ were removed by vacuum evaporation. The solid was redispersed in 36 mL $H_2O$, 4 mL $NH_4OH$ and 0.1 mL $N_2H_4$ (used as a stabilizer against oxidative decomposition) forming a clear yellow solution of $TeS_3^{2-}$ ions (with small amounts of $Te_2S_5^{2-}$ as confirmed by ESI-MS) at a concentration of about 0.25M.

Ligand Exchange.

Ligand Exchange with Chalcogenide ($S^{2-}$, $Se^{2-}$, $Te^{2-}$) and Hydrochalcogenide ($HS^-$, $HSe^-$, $HTe^-$) Ions.

The ligand exchange process was typically carried out under inert atmosphere. Colloidal dispersions of different NCs with organic ligands were prepared in nonpolar solvents like toluene or hexane while solutions of inorganic ligands were prepared in polar formamide (FA) immiscible with toluene and hexane. For a typical ligand exchange using $S^{2-}$ ions, 1 mL CdSe NC solution (2 mg/mL) was mixed with 1 mL of $K_2S$ solution (5 mg/mL). The mixture was stirred for about 10 min leading to complete phase transfer of CdSe NCs from toluene to FA phase. The phase transfer can be easily monitored by the color change for toluene (red to colorless) and FA (colorless to red) phases. The FA phase was separated out followed by triple washing with toluene to remove any remaining non-polar organic species. The washed FA phase was then filtered through a 0.2 m PTFE filter and 1 mL acetonitrile was added to precipitate out the NCs. The precipitate was re-dispersed in FA and used for further studies. The NC dispersion in FA was stable for months. Ligand exchange with $Se^{2-}$, $Te^{2-}$, $HS^-$, $HSe^-$ and $HTe^-$ ligands were carried out in a similar manner. In some cases, the ligand exchange can take longer time, up to several hours.

The exchange of organic ligands with $S^{2-}$ and $SH^-$ can be carried out in air as well. Moreover, one can use concentrated aqueous solutions of $(NH_4)_2S$, $K_2S$ and $Na_2S$ as $S^{2-}$ source to carry out the ligand exchange. As an example, 10 µL of $(NH_4)_2S$ solution (Aldrich, 40-48 wt % in water) was added to 1 mL FA and mixed with NC dispersion in toluene or hexane. The rest of the ligand exchange procedure was similar to the above protocol. When handled in air, the solutions of $S^{2-}$ capped NCs preserve their colloidal stability for only several days. Resulting precipitates can be easily re-dispersed after addition of ~5 µL $(NH_4)_2S$ solution; the dispersions stabilized with additional $S^{2-}$ remained stable for several weeks in air. Similar to water and FA, the ligand exchange can be carried out in DMSO.

Ligand Exchange with $TeS_3$.

The mixed chalcogenide Te—S species are stable in basic solutions, ($NH_4OH$ was typically used) and are highly susceptible to oxidation. All ligand-exchange reactions were carried out in a glovebox. In a typical ligand exchange for CdTe NCs, 0.4 mL CdTe NCs capped with oleic acid in toluene (~25 mg/mL) was mixed with 3 mL FA, 3 mL toluene, and 0.4 mL 0.25M $(NH_4)_2TeS_3$ solution. Upon stirring for 2-10 hours, CdTe NCs quantitatively transferred into FA phase. NC solution was rinsed 3 times with toluene and mixed with 3-6 mL acetonitrile. NCs were isolated by centrifuging and redispersed in FA.

Ligand Exchange with $OH^-$.

A stock solution of KOH was prepared by dissolving 135 mg KOH in 0.4 mL FA. For a typical ligand exchange reaction, ~2 mg 5.5 nm CdSe NCs were dispersed in 1 mL toluene. 1 mL FA was added to the NC solution followed by the addition of 20 µL KOH solution and stirred for about 10 min. Red colored FA phase was separated out, washed three times with toluene and passed through a 0.2 m PTFE filter. Acetonitrile was added to precipitate the NCs, followed by centrifugation and re-dispersion of NCs in FA. The process was carried out under inert atmosphere.

Ligand Exchange with $NH_2$.

0.05 g $NaNH_2$ was dissolved in 0.5 mL FA to prepare a stock solution. Then, 0.1 mL of the $NaNH_2$ stock solution was diluted to 1 mL by adding FA and the resulting solution was added to 1.5 mg CdSe NCs dispersed in 1 mL toluene. The mixture was stirred for about 10 min. The NCs were separated out to the FA phase, washed, precipitated, centrifuged and re-dispersed in FA under inert atmosphere.

Treatment with $HBF_4$ and $HPF_6$.

1.5 mg CdSe NCs was dispersed in 1 mL toluene followed by the addition of a solution of $HBF_4$ (prepared by mixing 25 µL of 50 wt % aqueous $HBF_4$ with 1 mL FA). NCs completely transferred to the FA phase within 5 minutes. The colorless toluene phase was discarded followed by the addition of pure toluene to wash out any remaining nonpolar organics. The washing was repeated 3-4 times in about 30 minutes and finally the NCs dispersed in FA were passed through a 0.2 µm PTFE filter. $HPF_6$ treatment was carried out in similar manner. All these steps were carried out under the nitrogen environment inside a glove box, and the FA dispersion of CdSe NCs obtained after the ligand exchange was found to be stable for a few days, after which the NCs precipitates out from the solution.

Characterization.

UV-vis absorption spectra of NC dispersions were recorded using a Cary 5000 UV-vis-NIR spectrophotometer. Photoluminescence (PL) spectra were collected using a FluoroMax-4 spectrofluorometer (HORIBA Jobin Yvon). PL quantum efficiency (QE) of the NC dispersions were measured using Rhodamine 6G (QE=95%) as a reference dye dissolved in ethanol. Fourier-transform infrared (FTIR) spectra were acquired in the transmission mode using a Nicolet Nexus-670 FTIR spectrometer. Samples for FTIR measurements were prepared by drop casting concentrated NC dispersions on KBr crystal substrates (International Crystal Laboratories) followed by drying at 90° C. under vacuum. Transmittance of different NC samples was normalized by the weight of NCs per unit area of the deposited film, assuming a uniform film thickness across the KBr substrate. Transmission Electron Microscopy (TEM) data were obtained using a FEI Tecnai F30 microscope operated at 300 kV. Dynamic light scattering (DLS) and ζ-potential data were obtained using a Zetasizer Nano-ZS (Malvern Instruments, U.K.). ζ-potential was calculated from the electrophoretic mobility using Henry's equation in the Smoluchowski limit. Electrospray ionization mass spectrometry (ESI-MS) was performed using Agilent 1100 LC/MSD mass-spectrometer. The peak assignments were based on the comparison of experimental mass-spectra with calculated isotope patterns.

Charge Transport Studies. Device Fabrication.

All fabrication steps were carried out under dry nitrogen atmosphere. Highly p-doped Si wafers (Silicon Quest, Inc) with a 100 nm thick layer of thermally grown $SiO_2$ gate oxide were used as a substrate. The oxide layer on the back side of the wafers was etched using 1% HF aqueous solution, followed by careful rinsing with high purity deionized water. The substrates were cleaned with acetone, iso-propanol and ethanol, followed by drying in a flow of $N_2$ gas. $SiO_2$ surface was hydrophilized by oxygen plasma or piranha ($H_2SO_4$:$H_2O_2$) treatments immediately prior to NC deposition. The substrates were treated by oxygen plasma (~80 W) for 10-15 min. Piranha treatment was usually carried out at 120° C. for 10 minutes followed by multiple washings with high purity deionized water. Piranha solution was prepared by adding concentrated sulfuric acid to 30% $H_2O_2$ solution (2:3 volume ratio).

The NC films for electrical measurements were prepared by depositing thin 20-40 nm films by spin-coating (spread: 600 rpm, 6 s; spin: 2000 rpm, 30 s) from FA solutions at elevated temperatures (80° C.) using an infrared lamp placed above the substrate. After deposition, the NC films were dried at 80° C. for 30 min, followed by the annealing at 200-250° C. for 30 min using a hot plate with calibrated temperature controller. The NC film thickness was measured using AFM or high resolution SEM of device cross-sections. The top source and drain electrodes were thermally evaporated at 1.0-2.5 Å/s rate up to ~1000 Å total thickness using a metal evaporator located inside nitrogen-filled glove box. After deposition of Al electrodes, the devices were post annealed at 80° C. for 30 min to improve the contacts.

Electrical Measurements.

All electrical measurements were performed using Agilent B1500A semiconductor parameter analyzer. The source electrode was grounded for the field-effect transistor measurements. All electrical measurements were performed under dry nitrogen atmosphere and under quasi-static conditions with slow scan of source-drain or source-gate voltage.

CdSe(zb)/CdS and CdSe(w)/CdS:

FIG. 27 shows the comparison between growth made on zinc blende CdSe NCs and wurtzite CdSe NCs. The XRay pattern of the cores confirm the two structures. Absorption spectra of CdSe-xSCd with x=1 . . . 10 and TEM images of CdSe-10SCd for two different ways to grow the shell: (A middle) with $(NH_4)_2S$ as a precursor of sulfide and cadmium oleate, $Cd(OA)_2$, as a precursor of cadmium, and the nanocrystals are washed after each monolayer; (B bottom) QDs are stabilized by oleylamine either when they are sulfide rich or cadmium rich. $Cd(OAc)_2$ and $(NH_4)_2S$ are used as precursors of cadmium and sufide. TEM images of each sample, scale bar=20 nm.

CdS/ZnS Doped with Manganese:

FIG. 31 shows absorption spectra (color) of CdS-xSZn doped with manganese in the third layer for x=1 . . . 6 and emission spectrum of CdS-6SZn:Mn showing the phosphorescence coming from $Mn^{2+}$.

As discussed above colloidal particles may be cross-linked (i.e., bridged) using metal ions, whereby one or more metal ions individually binds, ionically or covalently, binding sites on the exterior of a plurality of colloidal particles. The binding sites may be parts of the inorganic capping agent disposed perpendicular to a surface on the nanoparticle. Various example bridging configurations between colloidal particles are described herein using cationic ions, preferably cationic metal ions. And, as described, selection of the bridging cationic ions may be chosen to adjust various properties of the colloid particles. As described the cationic ion may be a transition metal ion, a main group ion, a lanthanide ion, or an actinide ion. Preferably, the cationic ion is selected from those ions that can impart advanced electronic, magnetic (e.g., $Mn^{2+}$, $Co^{2+}$), or photophysical properties on the cross-linked colloidal particles. Still more preferably the cationic ion is $Pt^{2+}$, $Zn^{2+}$, $Cd^{2+}$, $Mn^{2+}$, $Mn^{3+}$, $Eu^{2+}$, $Fe^{2+}$, $Fe^{3+}$, $Co^{2+}$, $Ge^{4+}$, $Cu^{2+}$, $Cu^+$, $Pb^{2+}$, $Bi^{3+}$, $Sb^{3+}$, $In^{3+}$, $Ga^{3+}$, $Au^+$, $Au^{3+}$, $Ag^+$, $Sn^{2+}$, $Sn^{4+}$, or $Hg^{2+}$. The ability to adjust such properties allows for tailored selectivity of colloidal particles, in particular colloidal nanocrystals (NCs) which provide convenient "building blocks" for various electrical, electromechanical, magnetic, electrooptic structures, photovoltaics, and thermoelectrics, including solar cells, light-emitting devices, photocatalytic systems, etc. The use of inorganic ligands for colloidal NCs dramatically improves inter-NC charge transport, enabling fast progress in NC-based devices.

As described herein, the cationic part of inorganic ligands may be used to systematically engineer the NC properties and to impart additional functionalities to all-inorganic colloidal NCs. And in this way, cations provide a convenient tool for tailoring optical, electronic, magnetic and catalytic properties of all-inorganic NCs and NC solids. In examples discussed herein, cationic metal ions such as $Cd^{2+}$, $Mn^{2+}$, $In^{3+}$ etc. can bind to the NC surface in solution and inverse the surface charge of the colloidal particles from negative to positive, along with dramatic improvement of luminescence efficiency. In a NC film, for example, cations can link adjacent NCs and improve electron mobility. Cationic metal ions (e.g., $K^+$, $In^{3+}$) can switch conductivity in CdTe NC solids from p-type to ambipolar to n-type. Cationic metal ions $Mn^{2+}$ can bridge $S^{2-}$ capped CdSe NCs via S—Mn—S bonds and impart magnetic properties to originally diamagnetic CdSe NCs. Bridging semiconductor NCs with $Pt^{2+}$ ions offer control over the catalytic properties of NC solids. Example empirical NC synthesis and cationic ion bridging and corresponding effects and effect on colloidal NC properties are now described.

Nanocrystal Synthesis.

4.4 nm Zinc blende CdSe NCs capped with oleic acid were prepared following the techniques as described by Cao et al. 4.2 nm Wurtzite CdSe NCs capped with octadecylphosphonic acid (ODPA) were prepared from CdO and n-trioctylphosphine selenide (TOPSe) following Manna, et al. As described below the Zinc blende NCs and the wurtzite NCs showed similar results in various studies. In addition, CdSe/ZnS core/shell NCs capped with proprietary amine-based ligands obtained from Evident Technologies Inc. (Troy, N.Y.) were used. InAs NCs capped with trioctylphosphine (TOP) were prepared by reacting $InCl_3$ and As[Si$(CH_3)_3$]$_3$. CdS nanorods were prepared. CdTe NCs capped with tetradecylphosphonic acid (TDPA) were then prepared.

Ligand Exchange.

The exchange of original organic ligands with $S^{2-}$ and $Te^{2-}$ was carried out per the foregoing. For example, in a typical experiment, 1 mL (5 mg/mL) organics-capped CdSe NCs dispersion in toluene was combined with 1 mL $K_2S$ solution (12 mg/mL) in formamide (FA), stirred for about 10 min leading to a complete phase transfer of NCs from toluene to the FA phase. The FA phase was separated out and washed three times with toluene. NCs were then precipitated by adding a minimum amount (0.8 mL) of acetonitrile, centrifuged and re-dispersed in FA. A similar ligand exchange with $Na_2Sn_2S_6$ was carried. All ligand exchange reactions were carried out in a glovebox filled with dry nitrogen.

NC Charge Inversion and Photoluminescence (PL) in Solution.

For studies of charge inversion and PL efficiency, 1 mL dilute solution (0.3 mg/mL) of $K_2S$ capped CdSe or CdSe/ZnS NCs in FA was combined with 2 mL FA solution of a salt containing desired cation and an anion with low nucleophilicity ($NaNO_3$, $KNO_3$, $Cd(NO_3)_2$, $Zn(NO_3)_2$, $Ca(NO_3)_2$, $Mg(NO_3)_2$, $Cd(ClO_4)_2$, $Ba(NO_3)_2$, $In(NO_3)_3$, or $Al(NO_3)_3$, etc). To ensure colloidal stability, all NC solutions were filtered through 0.2 m PTFE syringe filter prior to optical measurements. The NC solutions retained their colloidal stability in the presence of some metal ions for only several days and freshly prepared mixtures of NCs and metal ions for all optical and zeta-potential measurements were used. The solutions were typically handled inside a $N_2$ glovebox.

Linking NCs with Inorganic Cations and Fabrication of FET Devices.

20 nm thick films of inorganically-capped NCs were prepared by spin-coating (2000 rpm, 60 s) solutions of $K_2S$ capped CdSe NCs (~20 mg/mL) in FA on a suitable substrate at an elevated temperature (80° C.) using an infrared lamp placed above the substrate. Quartz substrates were used for UV-visible measurements and heavily p-doped Si wafers (Silicon Quest, Inc) with a 100 nm thick layer of thermally grown $SiO_2$ gate oxide were used for FET measurements. Substrates were hydrophilized by oxygen plasma or piranha ($H_2SO_4$:$H_2O_2$) treatments. Dried NC films were dipped into 50 mM solutions of metal salts ($Cd(NO_3)_2$, $Zn(NO_3)_2$, $In(NO_3)_3$, and $Mn(NO_3)_2$) in methanol for 30 min followed by washing the films in fresh methanol. For FET measurements, the cation treated NC films were annealed at 200° C. for 30 min to remove solvents and remaining volatile ligands without sintering the NCs. The NC film thickness was measured using AFM. The top source and drain electrodes (Al) were thermally evaporated at 1-2 Å/s rate up to ~1000 Å total thickness using metal evaporator installed inside a glovebox. The FET channel length was 150 m for the FET devices with bottom gate and top source-drain electrodes. After deposition of top electrodes, the devices were annealed at 80° C. for 30 min to improve the contacts. All steps were carried out under $N_2$ atmosphere inside a glovebox. For the CdTe NC devices, both bottom gate/top source-drain FET geometry (channel length 150 m) and bottom gate/bottom source-drain FET geometry (channel length 5 m) with Au or Al source and drain electrodes, were examined.

Electrical measurements were carried out under quasistatic conditions with slow scan of source-drain or source-gate voltage using Agilent B1500A semiconductor parameter analyzer and home-made probe station placed inside a $N_2$-filled glovebox. The transfer characteristics for the FETs were measured with the gate voltage ($V_G$) sweep rate 40 mV/s. The linear regime mobility ($\mu_{lin}$) and the saturation regime mobility ($\mu_{sat}$) were calculated from FET transfer characteristics as described below.

Characterization.

Continuous wave EPR experiments were carried out using a Bruker ELEXSYS E580 spectrometer operating in the X-band (9.4 GHz) mode and equipped with an Oxford CF935 helium flow cryostat with an ITC-5025 temperature controller. Magnetic properties were studied using SQUID Magnetometry (MPMS XL, Quantum Design). Zero-field-cooled (ZFC) and field-cooled (FC) studies were recorded in the 5-300K range at H=100 Oe after cooling the NC samples in zero field or in a 100 Oe field, respectively. Mn K-edge EXAFS measurements were carried out at the MRCAT 10-ID beamline at the Advanced Photon Source, Argonne National Laboratory (ANL) in the fluorescence mode with ionization chamber in Stern-Heald geometry for the NC samples. Samples were loaded in a teflon sample holder inside an $N_2$ glovebox and sealed inside an air-tight chamber. Mn standard samples were measured in the transmission mode. The sulfur K-edge XANES spectra were measured at the 9-BM beamline at the Advanced Photon Source in the fluorescence mode. The EXAFS data were processed using Athena software by extracting the EXAFS oscillations $\chi(k)$ as a function of photoelectron wave number k following standard procedures. The theoretical paths were generated using FEFF6 and the models were fitted in the conventional way using Artemis software. Artemis was used to refine the fitting parameters used for modeling each sample in the R-space until a satisfactory model describing the system was obtained. For EPR, magnetic and EXAFS/XANES measurements, samples were prepared in form of thoroughly washed and dried powders of $CdSe/S^{2-}$ nanocrystals cross-linked with $Mn^{2+}$ ions. Electrochemical experiments were carried out using a Gamry Reference 600 potentiostat using a three-electrode electrochemical cell. For electrochemical measurements in anhydrous acetonitrile, 0.1 M tetrabutylammonium perchlorate (TBAP) was used as an electrolyte. Glassy carbon (GC), platinum wire and $Ag^+$/Ag (0.01 M $AgNO_3$ in $CH_3CN$) electrodes were used as the working, counter and reference electrodes, respectively. The NC films were formed at the surface of a glassy carbon electrode by drop casting. For optical studies, ITO-covered glass was used as the working electrode with a NC film prepared by spin-coating. The electrochemical measurements in acetonitrile were carried out in presence of dimethylformamide (DMF) protonated by trifluoromethanesulfonic (triflic) acid. Protonated DMF was synthesized. Equimolar amounts of triflic acid and DMF were mixed and stirred for 2-3 minutes resulting in formation of white solid soluble in acetonitrile and dichloromethane. Typical $[H(DMF)]^+OTf^-$ concentration used in this work was 0.01 M.

For electrochemical measurements in aqueous solutions, pH was buffered at 6.50 by a phosphate buffer (a mixture of $K_2HPO_4$ and $KH_2PO_4$ with total concentration of phosphate 0.15 mol/L). Glassy carbon (GC), platinum wire and Ag/AgCl (saturated KCl solution) electrodes were used as the working, counter and reference electrodes, respectively. The area of GC electrode was $7.07 \cdot 10^{-2}$ cm$^2$. The NC films were prepared at the surface of glassy carbon electrode by drop casting. All solutions were carefully degassed and kept under nitrogen atmosphere.

Charge Inversion of Inorganically-Capped Nanocrystals.

4.2 nm CdSe NCs were transferred from toluene into a polar solvent (formamide, FA) by treatment with $K_2S$ that exchanged original n-tetradecylphosphonate surface ligands with $S^{2-}$. The completeness of ligands exchange was confirmed by FTIR measurements showing complete removal of the absorption bands around 3000 cm$^{-1}$ corresponding to C—H stretching in the hydrocarbon tails of the organic ligands (FIG. 46). $S^{2-}$ covalently bonded to the NC surface (FIG. 37A) resulting in negatively charged CdSe NCs with measured electrophoretic mobility $-0.7 \times 10^{-8}$ m$^2$V$^{-1}$s$^{-1}$ and $\zeta$-potential $-35$ mV calculated using Henry's equation. By knowing the ionic strength, one could also calculate surface charge density (o). For a spherical particle immersed in an electrolyte, $\sigma = \varepsilon_0 \varepsilon \zeta (1+\kappa r)/r$, where $\varepsilon_0$ is the vacuum permittivity, ε (109 for FA) is the dielectric constant of solvent, r is a hydrodynamic radius of NC and $k^{-1}$ is Debye screening length of the electrolyte. The corresponding average surface charge of a spherical NC, Z, in units of elementary charges (e) can be obtained as $Z=4\pi r^2\sigma/e$. For $K_2S$ capped CdSe NCs (CdSe/$S^{2-}$ NCs, ζ=−35 mV), σ=−0.016 C/m² was obtained or ~9 negative elemental charges accumulated at the surface of CdSe NCs.

Negatively charged chalcogenide ions bound to the surface of CdSe NCs should electrostatically interact with nearby cations. In addition, they may exhibit specific chemical affinity toward metal ions forming strong chemical bonds to chalcogens (FIG. 37A). In a polar solvent, these interactions can be monitored by measuring changes of electrophoretic mobility in the presence of specific cations. It was found that addition of 5 mM of various metal salts to a dilute (0.3 mg/mL) solution of CdSe/$S^{2-}$ NCs results in significant changes of ζ-potential. FIG. 37B, for example shows that ζ-potential of 4.2 nm CdSe NCs in FA can be tuned almost continuously from −35 mV for CdSe/$S^{2-}$ to +28 mV for CdSe/$S^{2-}$/$Cd^{2+}$ depending upon the chemical nature of added cation. FIG. 38B shows data for ζ-potentials in presence of 5 mM metal ion solution for different metal ions. In FIG. 47, the concentrations of each $M(NO_3)_n$ salt were adjusted to the total ionic strength of 15 mM (corresponding to 5 mM concentration of divalent metal nitrate, n=2), revealing the same trend of ζ-potentials. When $K^+$ or $Na^+$ were added to the NC solutions in form of nitrates, the absolute value of ζ-potential decreased from −35 mV to about −20 mV which could be explained as an increase of the ionic strength without specific binding of metal ions to the NC surface. This scenario agrees with the Derjaguin-Landau-Verwey-Overbeek (DLVO) theory that takes into account Coulombic interactions of colloidal particles with point-like charges. However, the DLVO theory cannot explain the interaction of CdSe NCs with other cations, such as $Al^{3+}$, $In^{3+}$, $Zn^{2+}$, $Ca^{2+}$ and $Cd^{2+}$ that result in the charge inversion as shown in FIG. 37B. For example, the addition of 5 mM $Cd^{2+}$ in the form of $Cd(NO_3)_2$ or $Cd(ClO_4)_2$ to 0.3 mg/mL solution of 4.2 nm CdSe/$S^{2-}$ NCs in FA resulted in +28 mV ζ-potential. This corresponds to ~11 elemental charges ((=+0.018 C/m²) associated with CdSe/$S^{2-}$ NCs exposed to 5 mM $Cd^{2+}$ solution. After addition of $Mg^{2+}$, $Ba^{2+}$, $Al^{3+}$ or $In^{3+}$ to CdSe/$S^{2-}$ NCs, the magnitude of ζ-potential is less than 15 mV, resulting in a limited colloidal stability. Charge inversion was observed in case of CdSe NCs capped with MCC ligands such as $Sn_2S_6^{4-}$ (FIG. 48).

In general, charge inversion does not require a specific binding of opposite charges. It can result from the effect of correlation between multiple charged ions near the interface, not accounted by the mean-field theories such as DLVO. For example, it has been shown that screening of a strongly charged particle by multivalent counterions can result in the inverted charge Q* with magnitude $Q^* \approx 0.83\sqrt{QZe}$, where Q is the original particle charge, Ze is the charge of the counter ions. This would predict 4.2 nm CdSe NCs with Q=−9e maximum inverted charge of Q*=3.5e after treating with divalent cations. The predicted Q* is significantly smaller than the inverted charge (Q*=11e) calculated from the measured electrophoretic mobility of CdSe/$S^{2-}$/$Cd^{2+}$ NCs in presence of 5 mM $Cd^{2+}$ ions. In addition, FIG. 37B shows that highly charged cations ($Al^{3+}$, $In^{3+}$) generate smaller charge inversion than $Ca^{2+}$, $Zn^{2+}$ and $Cd^{2+}$. Moreover, the chosen cationic metal ion may vary the amounts of charge inversion experienced. For example, the addition of $Ca^{2+}$ ions to cross-link colloidal NCs results in a strong charge inversion, while $Mg^{2+}$ and $Ba^{2+}$ with similar charge and chemical properties do not show this effect at all (see, e.g., FIG. 37B, inset). Without wishing to be bound by theory, these observations suggest that charge inversion of CdSe/$S^{2-}$ NCs cannot be explained by electrostatic mechanism, but rather requires analysis of chemical interactions between NCs and metal ions. Indeed, the addition of $Cd^{2+}$ ions to CdSe NCs results in a small but reproducible (~4 nm or ~16 meV) red shift of the excitonic peaks in UV-Vis and photoluminescence (PL) spectra (FIG. 37C), consistent with a small increase in the effective NC diameter due to surface binding of $Cd^{2+}$. Other metal ions resulted in even smaller shifts of the absorption maximum, suggesting cation exchange reactions do not occur inside the NCs (FIG. 49).

The charge inversion should be facilitated by high affinity of the counter ion to NC surface and by lower solvation energy of the counter ion. Herein, there are indications that softer cations have higher affinity ($Cd^{2+}>Zn^{2+}$; $In^{3+}>Al^{3+}$) to CdSe/$S^{2-}$ NC surface exposing soft basic sites like $S^{\delta-}$ and $Se^{\delta-}$. Generally, cation hardness and solvation energy in polar solvents decrease down the group in the periodic table, thus the charge inversion efficiency for CdSe/$S^{2-}$ NC is expected to follow the trend $Mg^{2+}<Ca^{2+}<Ba^{2+}$. However, among these chemically-similar cations, only $Ca^{2+}$ induced charge inversion, whereas addition of $Mg^2$ and $Ba^{2+}$ resulted in aggregation of NCs (FIG. 37B). To examine this disparity, ionic radii of metal ions were compared to the radius of $Cd^{2+}$ ions as shown in the inset to FIG. 37B. As shown, $Mg^{2+}$ ions are too small and $Ba^{2+}$ is too large to efficiently integrate into surface cites of CdSe lattice, while the ionic radius of $Ca^{2+}$ is only about 5% larger than that of $Cd^{2+}$, offering an excellent match to the CdSe lattice. This observation suggests that, in addition to chemical affinity, steric factors play an important role in the interaction of metal ions with surface of all-inorganic NCs. For a colloidal solution of crystalline particles, similar size of the counter ion (ionic radius of $Mg^{2+}<Cd^{2+}\sim Ca^{2+}<Ba^{2+}$) compared to the parent cation ($Cd^{2+}$ in CdSe/$S^{2+}$) can significantly facilitate charge inversion.

The Correlation of Charge Inversion and PL Efficiency.

Through these examples, a correlation between ζ-potential and PL efficiency was revealed, as shown in FIG. 37D. The metal ions providing large charge inversion also resulted in a large increase of PL efficiency. For example, a 25-fold increase of PL efficiency from 0.7% for CdSe/$S^{2-}$ to 17.3% was observed upon addition of 5 mM $Cd^{2+}$ ions. The PL efficiency is a very sensitive probe of the NC surface. Without wishing to be bound by theory, it is believed this correlation between surface charge and PL efficiency results, at least in part, from reduced concentration of surface trap states. The increase of PL efficiency may also be explained by binding metal ions to the surface of CdSe/$S^{2-}$ NCs. At the same time, the correlation and effects on PL efficiency are counterintuitive and do not align with current understanding of surface passivation for traditional CdSe NCs. First, it was found that $Cd^{2+}$ and $Ca^{2+}$ ions provided higher PL efficiency than $Zn^{2+}$, despite the fact that ZnS is known as an excellent material to passivate the surface of CdSe NCs confining both electron and hole in the core. Furthermore, the same trend was observed when metal ions were added to CdSe/ZnS/$S^{2-}$ NCs. The addition of $Cd^{2+}$ and $Ca^{2+}$ ions, for example, reproducibly yielded higher PL efficiency than the addition of $Zn^{2+}$ (FIGS. 38A and 50). This trend was observed for several batches of CdSe/ZnS core-shells synthesized in-house or obtained from different commercial sources. The addition of $Cd^{2+}$ or $Ca^{2+}$ increased PL efficiency to nearly 60%, which was close to the efficiency of original, organically capped NCs. The possible explanation is that $Zn^{2+}$ ions are strongly solvated by FA molecules and therefore show weaker affinity to the surface of CdSe or CdSe/ZnS NCs.

Time-resolved PL decay studies for CdSe/ZnS NCs before and after treatment with $Cd^{2+}$ ions suggest that observed PL increase resulted from the suppression of a non-radiative recombination channel introduced by $S^{2-}$ ligands (FIG. 37B). In presence of 5 mM $Cd^{2+}$ ions, the PL decay of CdSe/ZnS NCs closely matched that of the original organics-capped NCs (FIG. 37B).

These results also point to the potential of calcium salts as shell material for luminescent colloidal NCs. It should be noted that $Ca^{2+}$ typically forms solids with octahedrally coordinated $Ca^{2+}$ sites, instead of tetrahedrally coordinated $Cd^{2+}$ sites in CdSe lattice. Therefore, $Ca^{2+}$ can be used as a shell material for lead chalcogenide NCs. In addition to chemical passivation of surface dangling bonds, positively charged ions adsorbed at the NC surface can generate an electric field pushing holes away from the NC surface.

Cation Cross-Links (i.e., Bridges) Determine Electron Mobility in all-Inorganic Nanocrystal Arrays.

Thus, the foregoing provides further examples that metal ions, such as $Cd^{2+}$, can bind directly to the surface of CdSe/$S^{2-}$ NCs resulting in a charge inversion in dilute (~0.1-0.3 mg/mL) colloidal solutions. However, when the concentrations of CdSe/$S^{2-}$ NCs and $Cd^{2+}$ were increased to 10 mg/mL and 50 mM, respectively, immediate precipitation of CdSe NCs (FIG. 51) was observed. At the same time, the addition of 0.15 M $NaNO_3$ with ionic strength identical to the ionic strength of 0.05 M $Cd(NO_3)_2$ did not cause precipitation of CdSe/$S^{2-}$ NCs (FIG. 51), ruling out the increase of ionic strength as the cause of colloidal instability. Without wishing to be bound by theory, it was concluded that precipitation of NCs was a result of linking CdSe/$S^{2-}$ NCs with $Cd^{2+}$ ions as schematically shown in FIG. 39B. The elemental analysis of precipitated CdSe/$S^{2-}$/$Cd^{2+}$ NCs revealed no original $K^+$ counter ions, suggesting that $Cd^{2+}$ completely displaced $K^+$ ions during aggregation of NCs. This treatment was then applied to the close-packed films of CdSe/$S^{2-}$ NCs, originally charge-balanced with $K^+$ ions. The absorption spectra of CdSe/$S^{2-}$ NC films red-shifted by ~10 nm (38 meV) and broadened after dipping into a 50 mM solution of $Cd(NO_3)_2$ in methanol, suggesting enhanced electronic coupling between the NCs (FIG. 39A). To gain a better insight to the electronic coupling strength, charge carrier mobility was measured in the arrays of CdSe/$S^{2-}$NCs bridged with different cations. For these studies bottom-gated thin-film FETs were fabricated, with top source and drain electrodes (FIG. 39C). The films (~20 nm thick) of $K_2S$ capped CdSe NCs were deposited by spin coating on highly doped Si wafers with 100 nm thick $SiO_2$ thermal gate oxide. The NC films were treated with different cations, by dipping into 50 mM solutions of corresponding metal nitrates in methanol, followed by rinsing the films with neat solvent. The films were then annealed at 200° C. followed by patterning source and drain Al electrodes by a shadow mask (channel length 150 μm, width 1500 μm). This annealing step allowed evaporation of residual solvent molecules coordinated to NC surface and further increased electronic coupling between CdSe NCs, evidenced by additional broadening of the excitonic peaks (FIG. 39A). At the same time, this annealing temperature was insufficient to sinter CdSe NCs, as seen by the blue shift of the absorption onset with respect to the bulk CdSe band gap (1.74 eV or 713 nm) and by powder X-ray diffraction pattern typical for 4.2 nm CdSe NCs (FIG. 52).

The FET devices assembled from CdSe/$S^{2-}$ NCs showed n-type transport. FIGS. 40A and 40B show the output characteristics (i.e., drain current $I_{DS}$ as a function of source-drain voltage $V_{DS}$ at different gate voltages $V_G$) for FETs made of pristine films of CdSe/$S^{2-}$NCs with $K^+$ counter ions and the same films cross-linked with $Cd^{2+}$ ions. The cross-linking of NCs with $Cd^{2+}$ resulted in ~100-fold increase in $I_{DS}$ values for comparable $V_G$ values. Large difference in the channel currents can be seen in the transfer curves ($I_{DS}$ vs. $V_G$ at fixed $V_{DS}$) for both devices (FIG. 40C). When positive bias is applied to the gate terminal ($V_G$>0), electrons are injected into the FET channel and provide additional doping to the NC film resulting in a dramatic increase of the channel current. The ratio of drain currents at $V_G$=30V and $V_G$=-10V was $I_{ON}/I_{OFF}$~$10^4$ and ~$10^7$, for the pristine and $Cd^{2+}$ treated CdSe/$S^{2-}$ NC films, respectively (FIG. 53). The slope of the $I_{DS}$ vs. $V_G$ curves at $V_{DS}$=3V was used to calculate the electron mobility corresponding to the linear regime of FET operation ($I_{lin}$). It revealed a large increase in the electron mobility, from $\mu_{lin}$=0.01 for NC films with $K^+$ counter ions to 1.3 $cm^2V^{-1}s^{-1}$ for those bridged with $Cd^{2+}$. Reproducible changes in electron mobility were observed for the films treated with other cations like $Mn^{2+}$, $Zn^{2+}$ and $In^{3+}$, establishing a generic trend for NCs linked with different cations (FIGS. 40G and 54). The large increase of carrier mobility after $Cd^{2+}$ or $Zn^{2+}$ treatment was caused by the linking adjacent NCs, which also explain the broadening and red-shift in UV-visible absorption spectra (FIG. 39A). The extent of enhancement of electron mobility with different metal ions may depend on both the chemical affinity of the metal to NC surface, and the electronic structure of the NC/$S^{2-}$-$M^{n+}$-$S^{2-}$/NC interface. Experiments above showed that CdSe/ZnS and CdSe/CdS core/shell NCs showed lower electron mobility compared to CdSe NCs; particularly, CdSe/ZnS NCs exhibited rather poor electron mobility (~$10^{-5}$ $cm^2V^{-1}s^{-1}$) because of additional electron tunneling barriers imposed by the shell material. In a similar manner, it is expected that $\mu_{lin}$ in metal-bridged all-inorganic NC solids should correlate with the alignment of the NC $1S_e$ state and the LUMO of the S-$M^{n+}$-S bridge. Indeed, the comparison of the conduction band energies ($E_{CB}$) for corresponding metal sulfides $E_{CB}(K_2S)$>$E_{CB}(MnS)$>$E_{CB}(ZnS)$>$E_{CB}(In_2S_3)$>$E_{CB}(CdS)$ correlates well with the observed mobility trend in FIG. 40G.

The effect of cationic metal ion cross-linking was also observed for III-V InAs NCs (FIGS. 40D-40F, 40H and 55), again showing a clear enhancement of the electron mobility after bridging InAs/$S^{2-}$ NCs with metal ions. The cation linking phenomenon was also found effective for CdSe NCs capped with $Li_2S$ and $K_2Se$ (FIG. 56). The use of metal cross-links in combination with rapid thermal annealing allowed for the achievement of rather high electron mobilities in NC solids, up to $\mu_{lin}$=7 $cm^2V^{-1}s^{-1}$ (FIG. 57). Such high FET mobility was achieved using NCs processed from an environmentally benign FA solvent.

Carrier mobility reflects the connectivity between neighboring NCs whereas the FET turn-on gate voltage ($V_{th}$) reflects the initial concentration of charge carriers in the channel (i.e., the doping level). Generally, lower $V_{th}$ implies higher doping of the NC solid. The effect of different cations on $V_{th}$ was compared and it was observed that CdSe/$S^{2-}$ NCs bridged with $In^{3+}$ ions showed a lower $V_{th}$ than those bridged with $Cd^{2+}$ ions (inset to FIG. 40C). In turn, the NCs with $K^+$ counter ions showed even higher $V_{th}$ values. Without wishing to be bound by theory, this trend can be explained by drawing a comparison between inter-NC bridges (FIG. 39B) and substitutional dopands in conventional semiconductors. Indeed, when a monovalent cation (e.g., $K^+$) occupies divalent ($Cd^{2+}$) lattice site, it typically creates an acceptor level and behaves as a p-type dopant. On the other hand, $In^{3+}$ integrated in CdSe lattice behaves as the n-type dopant. A similar trend in $V_{th}$ was observed for InAs NCs bridged with $K^+$, $Cd^{2+}$ and $In^{3+}$ ions. Without wishing to be bound by theory, it can be concluded that metal ions bridging all-inorganic NCs strongly interact with NCs and can control not only the carrier mobility but the concentration of charge carriers in the NC solids.

Surface Metal Ions Determining the Type of Majority Carriers in all-Inorganic Nanocrystal Solids.

The ability of colloidal NC cationic metal ion cross-links to control doping in NC solids was examined by studying charge transport in CdTe NC arrays. CdTe is a rather unusual II-VI semiconductor that can support both p-type and n-type transport, depending on the native defects and impurity doping. $K_2Te$ capped colloidal CdTe NCs were prepared following standard organic-to-inorganic ligand exchange. The films of as-synthesized $CdTe/Te^{2-}/K^+$ NCs formed a p-type transistor channel (FIGS. 41A and 41E, and 58). Depending on the FET geometry and electrode material, measured hole mobility was in the range $10^{-6}$-$10^{-4}$ cm$^2$/Vs. P-type mobility was also dominant when the films of $K_2Te$ capped CdTe NCs were treated with $Cd^{2+}$ ions (FIG. 59). When $CdTe/Te^{2-}$ NCs was treated with $In^{3+}$ ions, obtained NC solids exhibited ambipolar transport (FIGS. 41B, 41C, 41F, and 41G), with significantly enhanced n-type transport compared to the NC films treated with $Cd^{2+}$. To further enhance n-type transport in the CdTe NC solids, the concentration of $In^{3+}$ ions at the NC surface was increased by using $In_2Se_4^{2-}$ metal chalcogenide complexes instead of electron-accepting $Te^{2-}$ ligands. $CdTe/In_2Se_4^{2-}$ NC solids showed strong n-type conductivity with electron mobility approaching 0.1 cm$^2$/Vs (FIGS. 41C and 60).

Magnetic Properties of CdSe and InAs NCs Linked with $Mn^2$ Ions.

In addition to tuning the electronic properties of colloidal NC solids, cationic cross-links can be used to introduce new functionalities to all-inorganic NC solids. As an example, $Mn^{2+}$ ions can be used to introduce magnetic functionality to non-magnetic $CdSe/S^{2-}$ NCs.

For example, a colloidal solution of $K_2S$ capped CdSe NCs in FA was precipitated by adding $Mn^{2+}$ ions. The elemental analysis showed a complete displacement of $K^+$ with $Mn^{2+}$, leading to Mn-to-Cd ratio of 1:6.7 corresponding to about 13 molar % $Mn^{2+}$ with respect to $Cd^{2+}$. This value sets an upper limit, corresponding to about 0.3 monolayers coverage of 4.2 nm CdSe NC surface with $Mn^{2+}$ ions. Lower doping level (e.g., 0.5% Mn) can be easily achieved by using mixtures of $Mn^{2+}$ and $Cd^{2+}$ ions (1:5.7 molar ratio) for NC linkage. In all cases, the XRD patterns of CdSe NCs remained identical before and after the $Mn^{2+}$ treatment suggesting binding $Mn^{2+}$ to the NC surface without forming any impurity phases (FIG. 61).

Bulk CdSe is diamagnetic with temperature-independent magnetic susceptibility $X_m \sim -3.3 \cdot 10^{-7}$ cm$^3$/g. A diamagnetic response of 4.2 nm CdSe NCs capped with $K_2S$ ($X_m \sim -7 \cdot 10^{-7}$ cm$^3$/g) was observed. FIG. 42 shows magnetization (M) vs. magnetic field strength (H) plots for $CdSe/S^{2-}$ NCs before and after exchange of $K^+$ ions for $Mn^{2+}$. $Mn^{2+}$ ions imparted positive magnetic susceptibility combined with a hysteretic magnetization with a small coercivity ~40 Oe at 5 K, which vanished at 300 K (FIG. 42, top left inset). At room temperature, CdSe NC solids bridged with $Mn^{2+}$ ions showed field-independent paramagnetic response with $X_m \sim 5.9 \cdot 10^{-6}$ cm$^3$/g. Similar behavior was observed for 4.5 nm $InAs/S^{2-}$ NCs linked with $Mn^{2+}$ ions. In the case of $InAs/S^{2-}/Mn^{2+}$ NCs, high-temperature paramagnetic behavior can be described by the Curie-Weiss law $1/\chi=(T-\theta)/C$ where C is the Curie constant, T is temperature, and e is the Curie temperature (FIG. 62A). The negative θ value −22 K is indicative of the antiferromagnetic (AFM) exchange interaction between $Mn^{2+}$ ions. Similar AFM coupling was observed for $Mn^{2+}$ doped into the lattice of various semiconductors both in bulk and NCs. The magnetic susceptibility of $CdSe/S^{2-}/Mn^{2+}$ NCs showed more complex behavior, with a significant contribution from temperature-independent paramagnetism (FIGS. 62B, 62C).

The bottom right inset in FIG. 42 shows zero-field-cooled (ZFC) and field-cooled (FC, 100 Oe) magnetization data for $CdSe/S^{2-}/Mn^{2+}$ NCs, revealing a magnetic transition with the blocking temperature about 34 K, that can be similar to the formation of a ferrimagnetic phase in CdSe NCs doped with $Mn^{2+}$ ions. These magnetic studies show that bridging all-inorganic semiconductor NCs with paramagnetic $Mn^{2+}$ ions can lead to behaviors typical for dilute magnetic semiconductor NCs. When combined with the electronic properties provided by inorganic ligands, further applications are possible for capped NCs, such as spintronic applications. For example, charging of NCs by applying gate voltage, could induce ferromagnetic ordering of the magnetic moments of $Mn^{2+}$ d-electrons. One may also expect fundamental differences between CdSe NCs substitutionally doped with $Mn^{2+}$ and those bridged with $Mn^{2+}$ ions. This comes from different local environment for $Mn^{2+}$ ions, possible differences in the oxidation state and the interaction of metal bridges with the NC core. The local environment is of great importance for colloidal NC cationic metal ion cross-linkages. Applied electron paramagnetic resonance (EPR), X-ray Absorption Near Edge Structure (XANES), and Extended X-Ray Absorption Fine Structure (EXAFS) techniques were used to better understand the bonding and local structure $Mn^{2+}$ ions between all-inorganic NCs.

Probing the Local Environment of $Mn^2$ Ions Linking CdSe NCs by EPR, XANES and EXAFS Spectroscopy.

$Mn^{2+}$ has five unpaired electrons and its local environment can be probed by EPR spectroscopy. FIG. 43 shows EPR spectrum measured at 4.6 K for $CdSe/S^{2-}$ NCs cross-linked with $Mn^{2+}$ ions. This spectrum can be deconvoluted into two overlapping components: (i) a broad signal arising from the exchange coupled $Mn^{2+}$ ions, and (ii) a characteristic sextet arising from the hyperfine interaction of the electron spin with Mn nucleus (I=5/2) in isolated $Mn^{2+}$ ions. Measured Landé g-factor 2.002 is closer to that for $Mn^{2+}$:CdS than to the g-factor for $Mn^{2+}$:CdSe (2.004), which suggests that the local coordination of $Mn^{2+}$ ions can be sulfur-rich, in accord with the bonding shown in FIG. 37A. At the same time, the hyperfine coupling constant $A_{iso}$=86 $10^{-4}$ cm$^{-1}$ (9.2 mT), is significantly larger than that for tetrahedrally coordinated $Mn^{2+}$ in bulk CdS and CdSe lattices ($65 \cdot 10^{-4}$ cm$^{-1}$ and $62 \cdot 10^4$ cm$^{-1}$, respectively), The large value of hyperfine splitting is characteristic of $Mn^{2+}$ ions residing at the NC surface. For example, $A_{iso}$=85×10$^{-4}$ cm$^{-1}$ was reported for $Mn^{2+}$ ions localized at the surface of CdSe NCs, but for $Mn^{2+}$ doped into a II-VI semiconductor NC lattice, $A_{iso}$<70·10$^{-4}$ cm$^{-1}$.

4.5 nm InAs NCs capped with $S^{2-}$ ligands and bridged with $Mn^{2+}$ ions revealed similar g-factor and $A_{iso}$ (FIG. 63), suggesting that both in $CdSe/S^{2-}/Mn^{2+}$ and $InAs/S^{2-}/Mn^{2+}$ NCs, the manganese ions are bound to the surface through the same ligand, and are not part of the crystal structure of the substrate. At the same time, upon illuminating the samples of $CdSe/S^{2-}/Mn^{2+}$ and $InAs/S^{2-}/Mn^{2+}$ NCs with a 300 W Xe-lamp through an IR-blocking filter and a long-pass filter with cutoff at 400 nm, the EPR intensity decreased by 7%. The variation of the EPR intensity was fully reversible with the light on/off cycles shown in the inset to FIG. 43. The use of illumination above 400 nm (hv<3.1 eV) ruled out the direct excitation of MnS clusters at the NC surface because $E_g(MnS)$~3.7 eV. The intensity of the EPR signal remained independent of illumination when a long-pass filter with a cutoff at 700 nm was used, which was smaller than the bang gap of CdSe NCs (FIG. 64). The control experiments also ruled out the variation in sample temperature caused by illumination. The effective concentration of $Mn^{2+}$ decreases under light, and recovered completely upon shutting light off suggesting an efficient coupling between $Mn^{2+}$ ions in $CdSe/S^{2-}/Mn^{2+}$ NCs and light-absorbing CdSe NCs. Such coupling could occur either via energy transfer exciting $Mn^{2+}$ from $^6A_1$ to $^4T_1$ state or via the charge transfer to $Mn^{2+}$ ions reducing its total spin. The decrease in EPR intensity may also arise from the antiferromagnetic p-d coupling of the valence-band-hole with $Mn^{2+}$, which dominates over the ferromagnetic s-s interaction of conduction-band-electron with $Mn^{2+}$, particularly for $Mn^{2+}$ ion residing near the NC surface. Further studies will be necessary to clarify the spin dynamics in all-inorganic NCs.

The XANES spectroscopy provided additional information about the oxidation of surface Mn and S atoms at the surface of all-inorganic NCs while the EXAFS spectroscopy was employed to probe the local environment around Mn ions on the surface of $CdSe/S^{2-}$ NCs. The degree of edge shift, obtained via comparison of Mn K-edge XANES for the $Mn^{2+}$ treated NC sample ($CdSe/S^{2-}/Mn^{2+}$) with different Mn standards (FIG. 44A) is indicative of a +2 oxidation state, similar to that in bulk MnS. At the same time, differences in the shape of the XANES spectra for $CdSe/S^{2-}/Mn^{2+}$ NCs and MnS indicate the local structure around $Mn^{2+}$ in the NC sample is unique. Particularly, in the NC sample, the Mn K-edge XANES revealed a strong pre-edge absorption peak (highlighted with the arrow in FIGS. 44A and 65) that corresponds to the dipole-forbidden 1s→3d transition. The intensity of this transition allows probing the local environment for $Mn^{2+}$. Thus, the pre-edge peak is absent or very weak for centrosymmetric metal sites with $O_h$ symmetry typical for MnS and MnO phases with rock salt structure. The observation of a strong 1s→3d transition suggests non-centrosymmetric, e.g., tetrahedral ($T_d$) coordination of $Mn^{2+}$ ions. The relative intensities of the pre-edge (1s→3d) and edge (1s→4p) transition in $CdSe/S^{2-}/Mn^{2+}$ NCs were similar to those reported for isoelectronic $Fe^{3+}$ sites with $T_d$ symmetry in Fe-doped $Na_2SiO_3$ glass and for tetrahedral $Mn^{2+}$ doped into ZnO wurtzite lattice.

Further information on the coordination environment for $Mn^{2+}$ sites in $CdSe/S^{2-}/Mn^{2+}$ NCs can be obtained from the analysis of EXAFS spectra. FIG. 44B shows the magnitude of the Fourier transform (FT) of Mn K-edge EXAFS data for $CdSe/S^{2-}/Mn^{2+}$ NC sample and the corresponding fit using Mn—S path generated from MnS with zinc blende structure using FEFF6. The fitting procedure together with the real part of the FT data are shown in FIG. 66 and Table 2. This analysis suggests that Mn atoms are bonded to S atoms with average Mn—S coordination number (CN)=3.1, and bond length=2.37 Å. The obtained CN is slightly smaller than the typical tetrahedral (CN=4, wurtzite and zinc blend) and octahedral (CN=6, rock salt) coordination. At the same time, obtained bond length is close to the theoretical bond length of Mn—S path in the MnS with wurtzite and zinc blende phases (~2.41 Å) while significantly shorter than the bond length 2.62 Å for Mn—S path in MnS with rock salt structure. This reduced Mn—S CN and bond length for $CdSe/S^{2-}/Mn^{2+}$ NC sample suggest $Mn^{2+}$ binding exclusively to the NCs surface, which was also demonstrated independently by XRD and EPR studies. The combination of intense pre-edge peak observed in XANES spectra with the bond length and CN obtained from EXAFS fits rule out the possibility of the formation of MnS phase and support $T_d$ symmetry of $Mn^{2+}$ sites at the NC surface.

TABLE 2

List of the fit parameters for Mn K-edge fit of $Mn^{2+}$ treated $K_2S$ capped CdSe ($CdSe/S^{2-}/Mn^{2+}$) NCs.
Data range: k is from 2.6-8 Å$^{-1}$ and the fit range: r is from 1.0-3.0 Å. $S_o^2 = 1$

| Path | Coordination number | Bond length (Å) | $\sigma^2$ (Å$^2$) | $\Delta E$ (eV) |
|---|---|---|---|---|
| Mn—S | 3.1 ± 0.5 | 2.37 ± 0.02 | 0.01 ± 0.003 | −6.0 ± 1.6 |

($\sigma^2$ = mean square displacement of the distance between the atoms, $\Delta E$ = energy shift).
R-factor for the fit is 0.02.

The S-edge XANES data of $K_2S$ capped CdSe NCs before ($CdSe/S^{2-}/K^+$) and after ($CdSe/S^{2-}/Mn^{2+}$) $Mn^{2+}$ treatment along with several sulfur standards are shown in FIGS. 44C and 67. The difference of XANES spectra between $K_2S$ and $CdSe/S^{2-}/K^+$ NCs agrees with the preconceived notion that $S^{2-}$ binds covalently to the $Cd^{2+}$ sites at the surface of CdSe NCs. More importantly, the XANES data for $CdSe/S^{2-}/Mn^{2+}$ NC samples can be reasonably well fitted as a superposition of S-edge XANES spectra for $CdSe/S^{2-}/K^+$ NCs and MnS. A linear combination fit shows that the XANES spectrum for $CdSe/S^{2-}/Mn^{2+}$ NCs can be modeled as 55% contribution from $CdSe/S^{2-}/K^+$ NC and 45% from MnS; once again suggesting the formation of Cd—S—Mn bonds on the NC surface (FIG. 68 and Table 3).

TABLE 3

S-edge XANES Linear Combination Fit Result:

| Sample | S-std | Percentage | R-factor |
|---|---|---|---|
| CdSe—Mn—S | CdSe—S | 0.55 | .003 |
|  | MnS | 0.45 |  |
| CdSe—S—K$_2$S | CdS | 0.85 | .006 |
|  | K$_2$S | 0.15 |  |

Combined together, EPR, XANES and EXAFS studies suggest that $Mn^{2+}$ ions bind to the surface of $CdSe/S^{2-}$ NCs without changes of their oxidation state. The $Mn^{2+}$ primarily bind to the electron-rich $S^{2-}$ ligands at the NC surface with tetrahedral-like coordination environment, average coordination number 3.1 and Mn—S bond length 2.37 Å. At the same time, $S^{2-}$ ligands bind simultaneously to $Cd^{2+}$ and $Mn^{2+}$ ions, behaving as bridges for electronic coupling for paramagnetic $Mn^{2+}$ ions to CdSe NCs.

$Pt^{2+}$ Bridges can be Used to Enhance the Electrocatalytic Properties of all-Inorganic Nanocrystal Solids.

Engineered nanomaterials formed of colloid particles represent an important class of prospective photo- and electrocatalysts that combine tunable electronic structure with high surface-to-volume ratio. To optimize the catalytic efficiency, the NC surface can be modified with oxidation or reduction catalysts, including, but not limited to, noble metal nanoparticles, $MoS_3$ or even enzymes. The present techniques show that transition metal ions bound to the surface of all-inorganic NCs can be used to mediate redox processes at the NC surface. To demonstrate this effect, the electrochemical properties of $CdSe/S^{2-}$ nanocrystals was compared with different counter ions, $K^+$ and $Pt^{2+}$, in a model electrochemical reaction of proton reduction and hydrogen evolution in acetonitrile and aqueous media (FIG. 45A). The first set of electrochemical measurements was performed in anhydrous acetonitrile inside air-free glovebox. Protonated DMF treflate [H(DMF)]OTf, behaving as a weak acid with $pK_a$=6.1 in acetonitrile, was used as a proton source and tetrabutylammonium perchlorate (TBAP) was used as an electrolyte. The CdSe/$S^{2-}$/$K^+$ NC films were deposited on either ITO-covered glass or on glassy carbon (GC) electrodes from formamide solutions. As-deposited films showed the first absorption peak near 590 nm. Treatment of CdSe/$S^{2-}$/$K^+$ NC films with 0.1 M formamide solution of $[PtCl_4]^{2-}$ for 30 minutes resulted in a 5 nm red shift of first absorption peak (FIG. 69) indicating binding of $Pt^{2+}$ to NC surface, which probably enhanced the electronic coupling between NCs analogous to the data shown in FIG. 39A. In control experiments, it was confirmed that neither the shape of the absorption spectrum nor the position of the first excitonic peak changed after five cycles of the electrode potential between −1.7 V and 0 V vs. $Ag^+$/Ag reference electrode at 100 mV/s ($E_{Ag+/Ag}$=−0.125V relative to $Cp_2Fe^+$/$Cp_2Fe$ couple), indicating that CdSe NCs stayed intact in the course of electrochemical studies (FIG. 69).

Cyclic voltammetry of CdSe/$S^{2-}$/$K^+$ and CdSe/$S^{2-}$/$Pt^{2+}$ NC films on a GC electrode in presence of 0.01 M [H(DMF)]OTf showed diffusion limited proton reduction. The wave for reduction of protons on GC electrode was observed with a half-wave potential of −0.778 V vs $Ag^+$/Ag reference electrode (FIG. 70). It corresponds to the overpotential of ~403 mV. Depositing CdSe/$S^{2-}$/$K^+$ NC film on a GC surface increased the overpotential to ~410 mV (FIG. 45B, black curve). The exchange of $K^+$ ions with $Pt^{2+}$ resulted in significantly lower overpotential of ~273 mV (FIG. 45B, blue curve), in agreement with increased catalytic activity of the NC surface. To study electrocatalytic performance of all-inorganic NCs is aqueous medium, similar measurements were carried out in aqueous solutions buffered at pH 6.5 with a phosphate buffer. At this pH, the Nernst equation gives $E(H_2/2H^+)$=−0.38 V relative to the SHE or −0.58 V relative to the saturated Ag/AgCl/$Cl^-$ reference electrode used in this work. However, no hydrogen reduction was observed up to −1.4 V on glassy carbon (GC) because of low exchange currents for this reaction leading to high overpotentials. The deposition of 4.2 nm CdSe/$S^{2-}$/$K^+$ NC film on a GC electrode resulted in a minor improvement of catalytic activity (FIG. 45C, black curve). After replacing the $K^+$ ions with $Pt^{2+}$ by exposing the NC film to 0.1 M FA solution of $K_2[PtCl_4]$ for 30 minutes followed by careful rinse with acetonitrile, a strong enhancement of the faradaic current was observed, with the current onset shifted to −0.736 V vs Ag/AgCl/Cl (or −0.539 V vs SHE) as shown in FIG. 45C. The Tafel analysis revealed ~50-fold enhancement of the exchange current, from ~6 nA/$cm^2$ to 0.3 μA/$cm^2$ when $K^+$ ions were replaced with $Pt^{2+}$. In the control experiments, polished GC electrode or a film of TOPO-capped CdSe NCs was exposed to 0.1M FA solution of $K_2[PtCl_4]$ and measured the effect of such treatment on electrochemical properties. In both cases, only minor changes in cathodic current were observed before and after treatment with $K_2[PtCl_4]$ (FIG. 71). These results can be explained by inefficient adsorption of $Pt^{2+}$ on GC and TOPO-capped surface of CdSe NCs. In contrast, the exchange of $K^+$ ions with $Pt^{2+}$ in CdSe/$S^{2-}$/$K^+$ NC solids occurred very efficiently at room temperature because of accessibility of NC surface and the presence of negatively charged $S^{2-}$ groups exhibiting high chemical affinity to Pt(II) species. This also demonstrates that charge carriers in all-inorganic semiconductor NCs can efficiently interact with redox catalysts at the NC surface.

Thus as shown, cationic metal ions can interact with the surface of colloidal particles, such as all-inorganic semiconductor NCs, and allow engineering the NC properties both in solution and in the NC solids. For example, $Cd^{2+}$, $Ca^{2+}$, $Zn^{2+}$ can efficiently bind to $S^{2-}$capped CdSe or CdSe/ZnS core shell NCs in dilute solution inversing the surface charge from negative to positive, and significantly increasing the luminescence efficiency. The cationic metal ions can bridge neighboring NCs and control the magnetic and electrochemical properties of all-inorganic NCs. In an array of $K_2S$ capped CdSe NCs the treatment with suitable metal ions allows replacing weakly bound $K^+$ ions and linking adjacent NCs. The formation of cross-linked NC structures enhances charge carrier mobility by two orders of magnitude, leading to the electron mobility 1.3 $cm^2V^{-1}s^{-1}$ achieved via a benign hydrazine-free device processing. The cationic metal ion cross-links also allow tailoring the doping in the NC solids, for example, switching CdTe NC FETs from p-type to ambipolar to n-type. EPR and EXAFS spectroscopy carried out for CdSe NCs with $S^{2-}$ ligands bridged by $Mn^{2+}$ ions confirmed that $Mn^{2+}$ bonded to the $S^{2-}$ capped CdSe NC via S—Mn—S bonds with bond length 2.37 Å and average coordination number 3.1. NCs with $Mn^{2+}$ on surface exhibit superparamagnetic behavior. Magnetization studies showed that bridging with $Mn^{2+}$ ions can switch the magnetic properties of NC solids from diamagnetic to paramagnetic at room temperature and to a magnetically ordered phase at low temperature. Finally, it was demonstrated that the bridging CdSe NCs with $Pt^{2+}$ ions allows improving the electrocatalytic properties of all-inorganic NCs in the hydrogen evolution reaction, both in aqueous and acetonitrile media. These examples show the generality and versatility of the approach described herein for tailoring physical and chemical properties for a broad class of NC-based materials.

While the present invention has been described with reference to specific examples, which are intended to be illustrative only and not to be limiting of the invention, it will be apparent to those of ordinary skill in the art that changes, additions and/or deletions may be made to the disclosed embodiments without departing from the spirit and scope of the invention.

What is claimed:

1. A colloidal material comprising nanoparticles and inorganic capping agents, wherein each inorganic capping agent is bound to an outer surface of a nanoparticle, and the inorganic capping agents comprise $H_nMO_y$, where n=0, 1, or 2, y=2, 3, or 4, M is a metal, metalloid or phosphorus and $H_nMO_y$ is negatively charged.

2. The colloidal material of claim 1, wherein M is P, As, W, V, or Mo.

3. The colloidal material of claim 1, wherein the inorganic capping agents comprise $VO_4^{3-}$, $MoO_4^{2-}$, $WO_4^{2-}$, $PO_4^{3-}$, $AsO_4^{3-}$, $HPO_3^{2-}$, $H_2PO_2^-$, or a mixture thereof.

4. A colloidal material comprising nanoparticles and inorganic capping agents, wherein the inorganic capping agents are bound to at least a portion of the surface of the nanoparticles and the inorganic capping agents comprise $H_3[PMo_{12}O_{40}]$; $H_3[PW_{12}O_{40}]$; $Na_3PMo_{12}O_{40}$; $Na_6H_2W_{12}O_{40}$; $H_4[SiW_{12}O_{40}]$; $(NH_4)_6[H_2W_{12}O_{40}]$; $K_6[P_2W_{18}O_{62}]$; $K_6[P_2Mo_{18}O_{62}]$; $Mo_{154}$; $Rb_8K_2\{\{Ru_4O_4(OH)_2; (H_2O)_4\}(\gamma-SiW_{10}O_{36})_2]$, or a mixture or derivative thereof.

5. The colloidal material of claim 1, wherein the colloidal material is a super-lattice.

6. The colloidal material of claim 1 made by a method comprising admixing inorganic capping agents in a first solvent and nanoparticles-in a second solvent together to form the colloidal material, wherein the second solvent is appreciably immiscible in the first solvent.

7. A method of making the colloidal material of claim 1, comprising
   (a) admixing the nanoparticles in a first solvent and the inorganic capping agents in a second solvent in the presence of a quaternary ammonium salt to form the colloidal material; and
   (b) isolating the colloidal material from the admixture, wherein the first solvent is nonpolar and the second solvent is polar.

8. A matrix comprising a plurality of colloidal particles, each comprising a nanoparticle and an inorganic capping agent, wherein the inorganic capping agent is bound to at least a portion of the nanoparticle surface, wherein the inorganic capping agent comprises $H_nMO_y$, where n=0, 1, or 2, y=2, 3, or 4, M is a metal, metalloid or phosphorus and $H_nMO_y$ is negatively charged, and wherein pairs of colloidal particles are bridged by a cationic ion cross-linkages bound to the respective colloidal particles of the pair.

9. A field effect transistor comprising:
   a source region and a drain region and the matrix of claim 8 extending between, and electrically coupled to, the source region and the drain region to provide current flow between the source region and the drain region, in response to activation of the field effect transistor by a gate coupled to the matrix and having a threshold gate voltage.

10. The colloidal material of claim 4, wherein the colloidal material is a super-lattice.

11. The colloidal material of claim 4 made by a method comprising admixing inorganic capping agents in a first solvent and nanoparticles in a second solvent together to form the colloidal material, wherein the second solvent is appreciably immiscible in the first solvent.

12. A method of making the colloidal material of claim 4, comprising
   (a) admixing the nanoparticles in a first solvent and the inorganic capping agents in a second solvent in the presence of a quaternary ammonium salt to form the colloidal material; and
   (b) isolating the colloidal material from the admixture, wherein the first solvent is nonpolar and the second solvent is polar.

13. A matrix comprising a plurality of colloidal particles, each comprising a nanoparticle and an inorganic capping agent, wherein the inorganic capping agent is bound to at least a portion of the nanoparticle surface, wherein the inorganic capping agent comprises $H_3[PMo_{12}O_{40}]$; $H_3[PW_{12}O_{40}]$; $Na_3PMo_{12}O_{40}$; $Na_6H_2W_{12}O_{40}$; $H_4[SiW_{12}O_{40}]$; $(NH_4)_6[H_2W_{12}O_{40}]$; $K_6[P_2W_{15}O_{62}]$; $K_6[P_2Mo_{18}O_{62}]$; $Mo_{154}$; $Rb_5K_2[\{Ru_4O_4(OH)_2;(H_2O)_4\}(\gamma-SiW_{10}O_{36})_2]$, or a mixture or derivative thereof, and wherein pairs of colloidal particles are bridged by a cationic ion cross-linkages bound to the respective colloidal particles of the pair.

14. A field effect transistor comprising:
   a source region and a drain region and the matrix of claim 13 extending between, and electrically coupled to, the source region and the drain region to provide current flow between the source region and the drain region, in response to activation of the field effect transistor by a gate coupled to the matrix and having a threshold gate voltage.

* * * * *

UNITED STATES PATENT AND TRADEMARK OFFICE
CERTIFICATE OF CORRECTION

Page 1 of 1

PATENT NO. : 10,600,865 B2
APPLICATION NO. : 15/882823
DATED : March 24, 2020
INVENTOR(S) : Angshuman Nag et al.

It is certified that error appears in the above-identified patent and that said Letters Patent is hereby corrected as shown below:

In the Specification

Column 1, Line 2, please insert:
--This invention was made with government support under grant number DMR0847535, awarded by the National Science Foundation and grant number DE-AC02-06CH11357, awarded by the Department of Energy. The government has certain rights in the invention.--

Signed and Sealed this
Twenty-first Day of September, 2021

Drew Hirshfeld
*Performing the Functions and Duties of the*
*Under Secretary of Commerce for Intellectual Property and*
*Director of the United States Patent and Trademark Office*